(12) United States Patent
Kim et al.

(10) Patent No.: US 7,847,289 B2
(45) Date of Patent: Dec. 7, 2010

(54) ARRAY SUBSTRATE FOR LIQUID CRYSTAL DISPLAY DEVICE AND METHOD OF MANUFACTURING THE SAME

(75) Inventors: Hyo-Uk Kim, Gumi-si (KR); Byung-Chul Ahn, Seoul (KR); Byoung-Ho Lim, Gumi-si (KR)

(73) Assignee: LG Display Co., Ltd, Seoul (KR)

( * ) Notice: Subject to any disclaimer, the term of this patent is extended or adjusted under 35 U.S.C. 154(b) by 205 days.

(21) Appl. No.: 11/646,253

(22) Filed: Dec. 28, 2006

(65) Prior Publication Data

US 2008/0001175 A1  Jan. 3, 2008

(30) Foreign Application Priority Data

Jun. 30, 2006  (KR) .................... 10-2006-0060862

(51) Int. Cl.
*G02F 1/133* (2006.01)

(52) U.S. Cl. .................... 257/59; 257/72; 257/202; 257/E27.131; 257/E27.132; 257/E29.117; 257/E29.151; 349/42; 349/43; 349/46; 349/2; 349/78; 349/83; 349/108

(58) Field of Classification Search ............... None
See application file for complete search history.

(56) References Cited

U.S. PATENT DOCUMENTS

| 2002/0063253 A1* | 5/2002 | Hong et al. | ............ 257/59 |
| 2004/0126917 A1* | 7/2004 | Yoo et al. | ............ 438/30 |
| 2004/0232443 A1* | 11/2004 | Cho et al. | ............ 257/202 |

* cited by examiner

*Primary Examiner*—Sue Purvis
*Assistant Examiner*—Fei Fei Yeung Lopez
(74) *Attorney, Agent, or Firm*—Birch Stewart Kolasch & Birch, LLP

(57) ABSTRACT

An array substrate for a liquid crystal display device includes a substrate, a gate line over the substrate, a data line crossing the gate line to define a pixel region and including a transparent conductive layer and an opaque conductive layer, a data pad at one end of the data line and including a transparent conductive layer, a thin film transistor connected to the gate line and the data line and including a gate electrode, an active layer, an ohmic contact layer, a buffer metallic layer, a source electrode and a drain electrode, and a pixel electrode in the pixel region and connected to the thin film transistor, the pixel electrode including a transparent conductive layer.

13 Claims, 69 Drawing Sheets

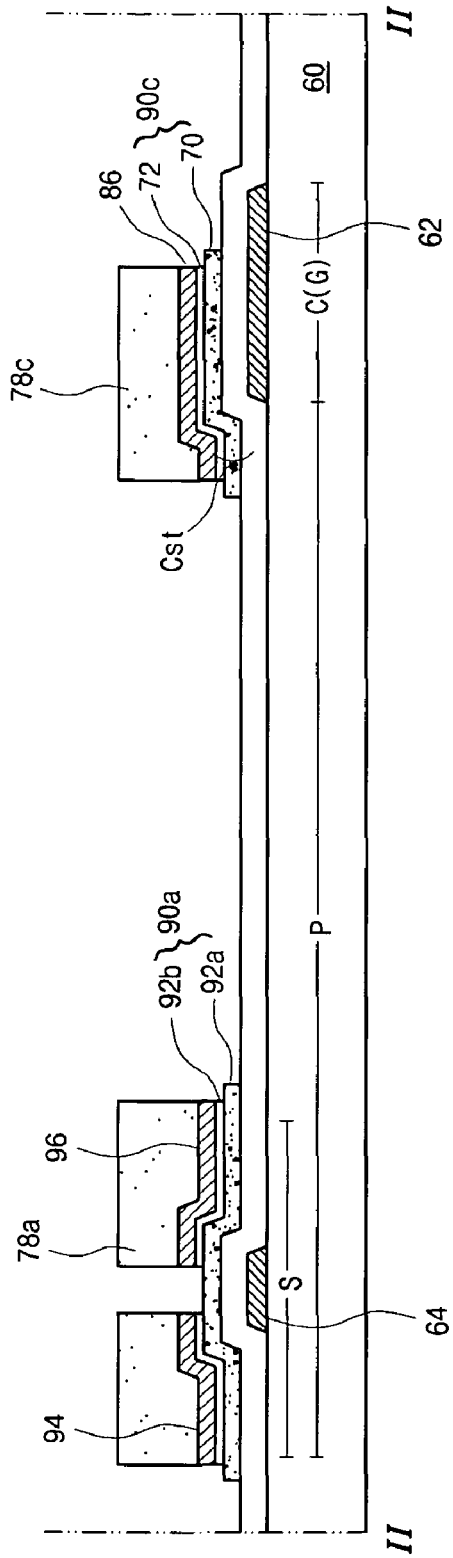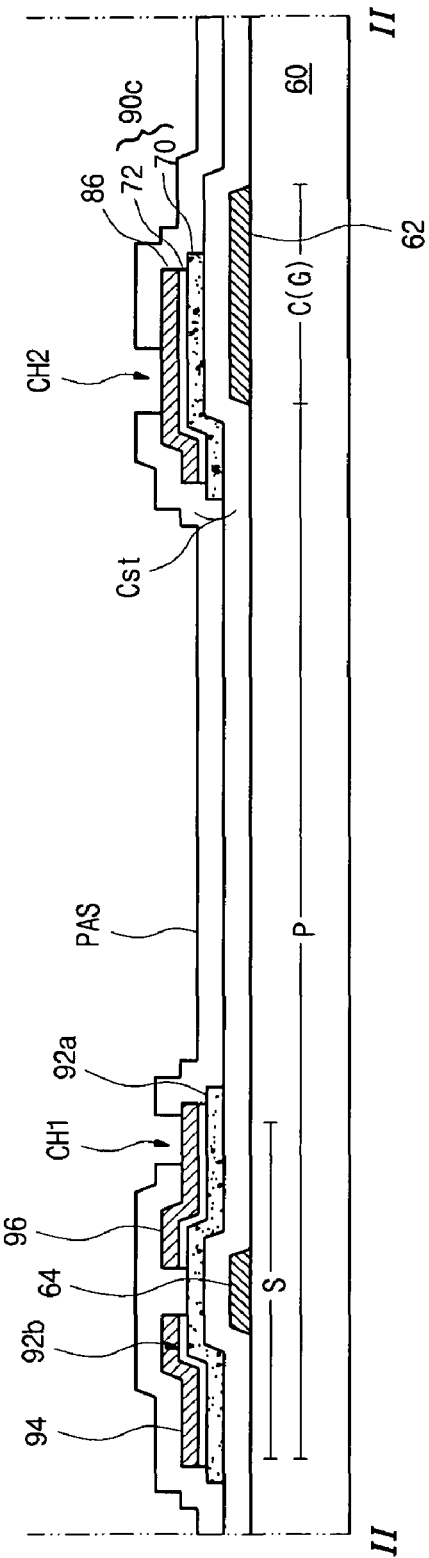
FIG. 4E
RELATED ART
FIG. 4F
RELATED ART

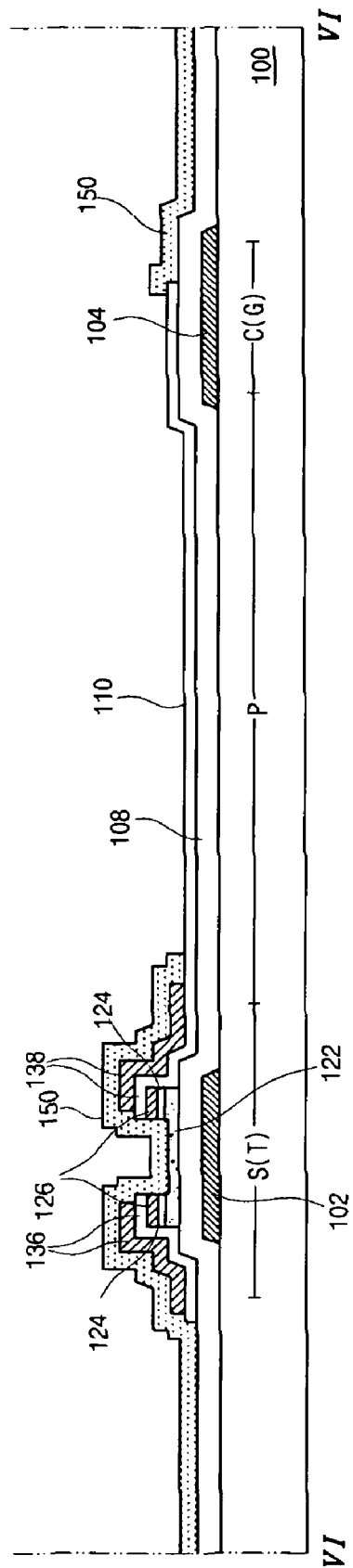
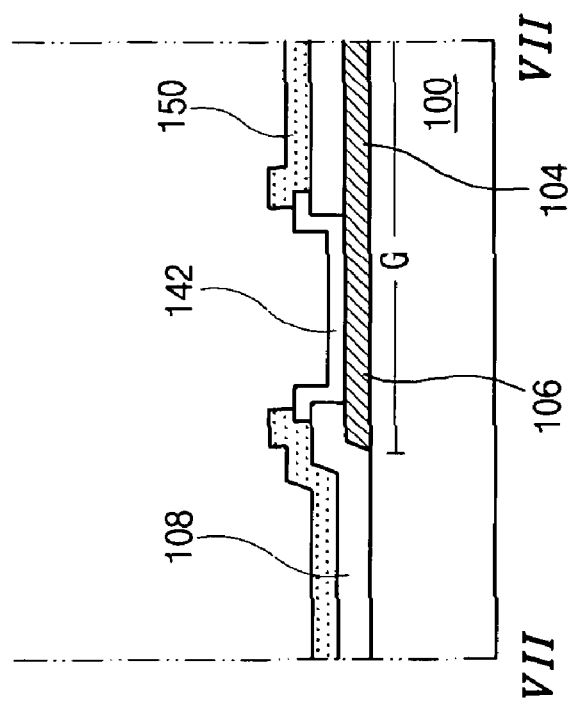
FIG. 8A
FIG. 8B

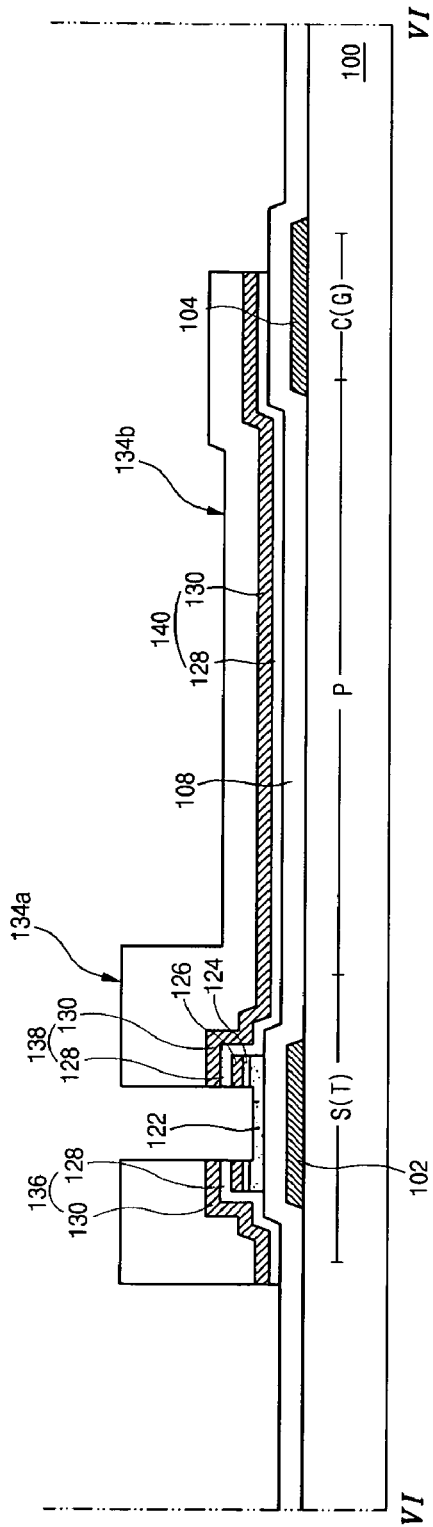
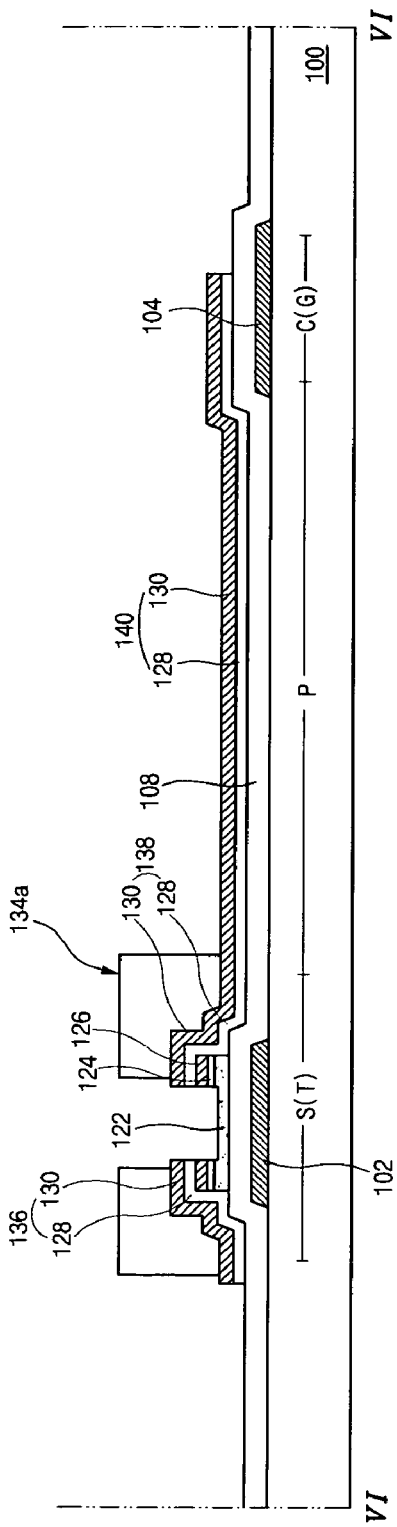
FIG. 9H
FIG. 9I

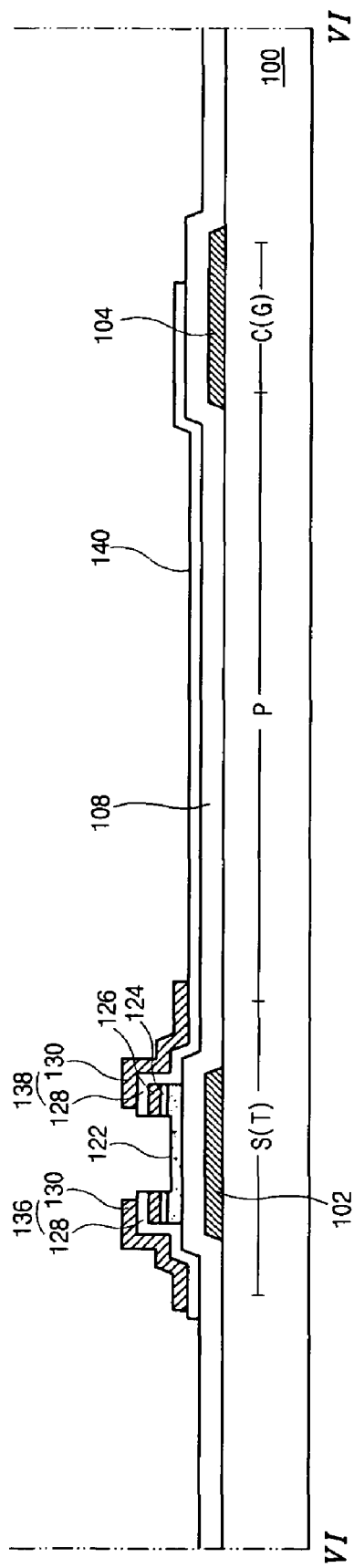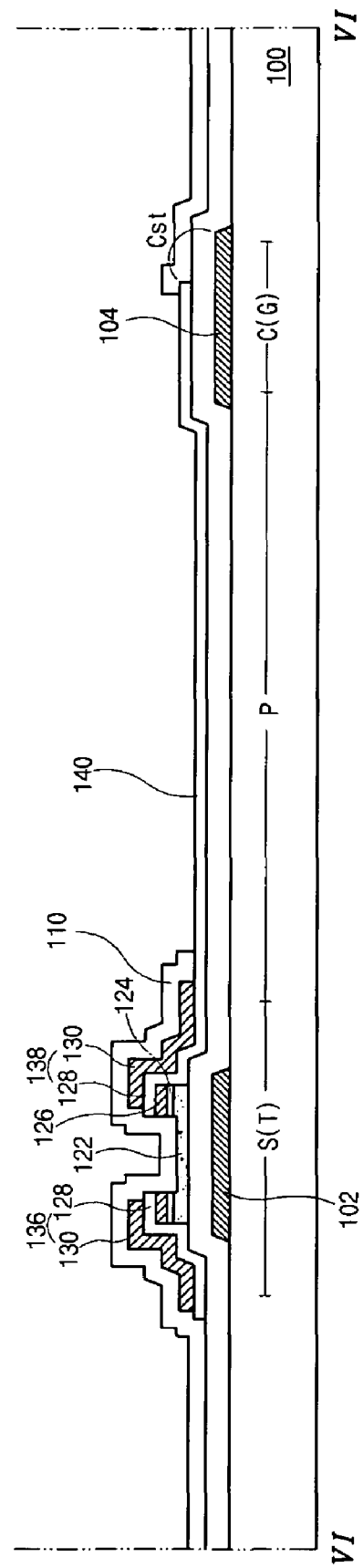

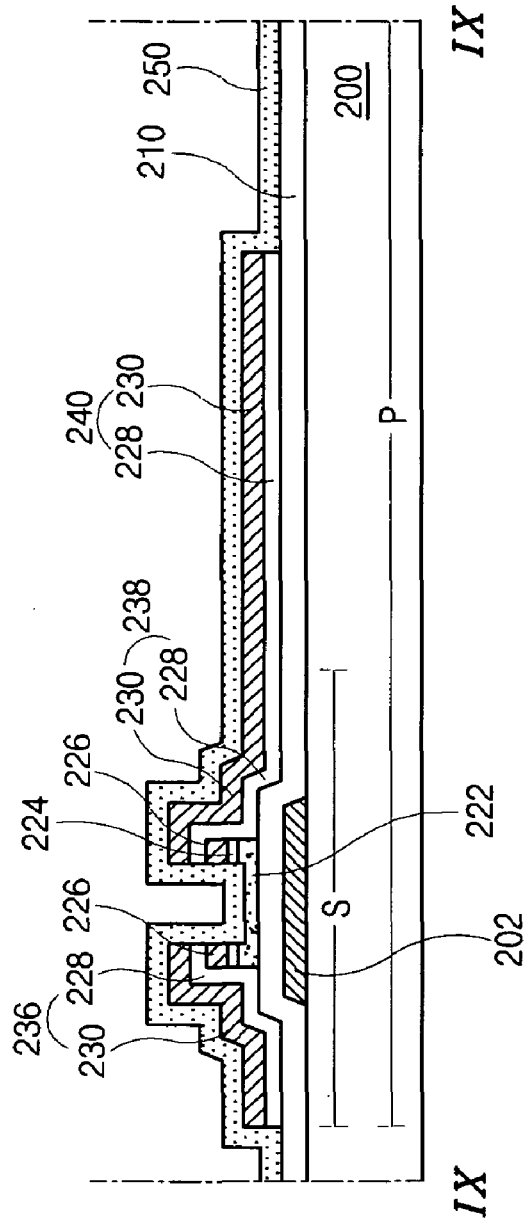
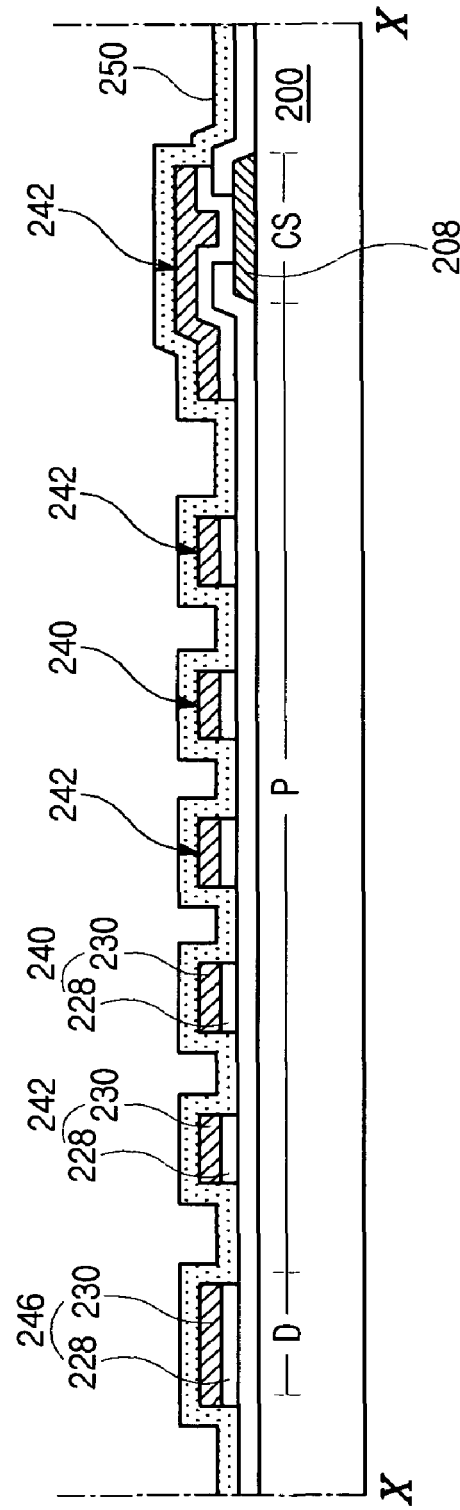
FIG. 13A
FIG. 13B

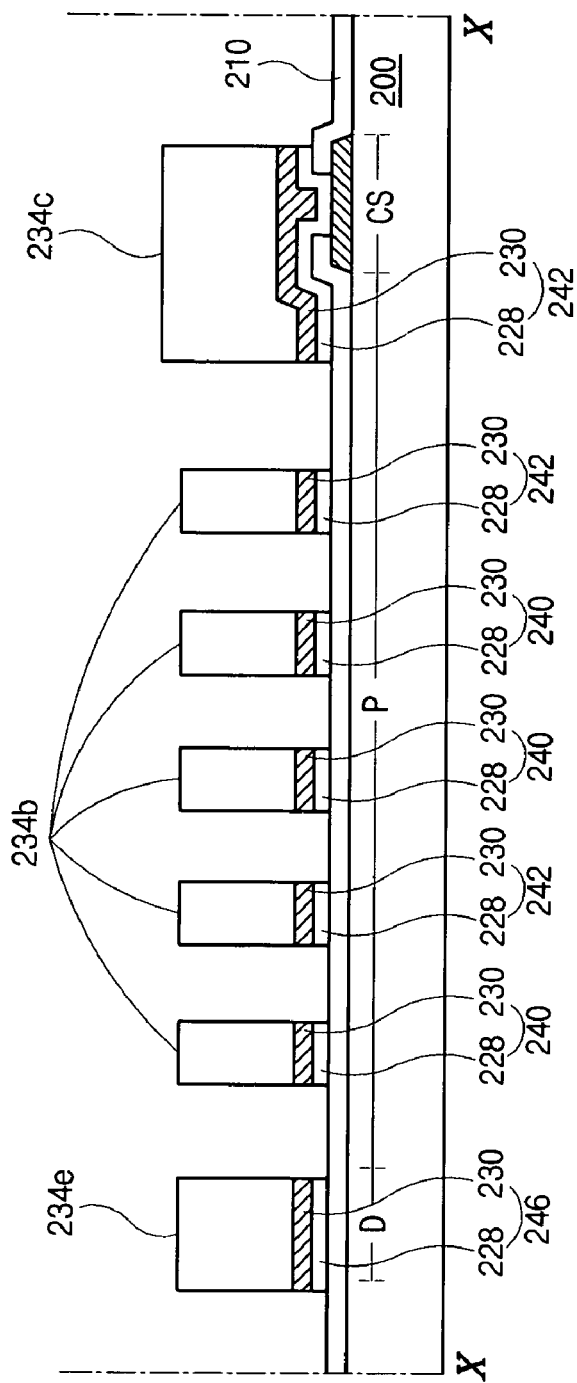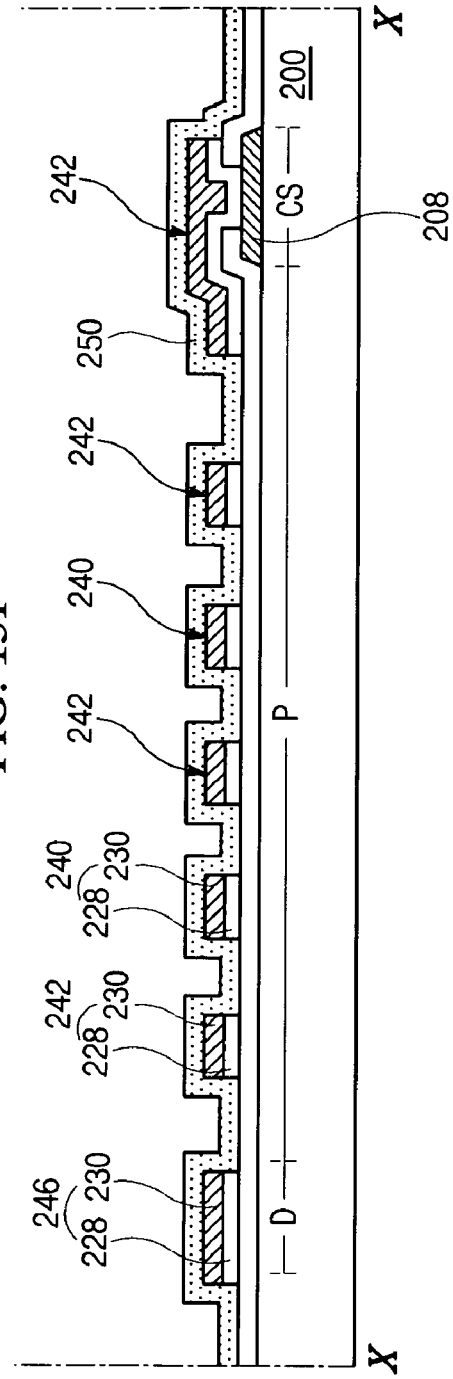

ARRAY SUBSTRATE FOR LIQUID CRYSTAL DISPLAY DEVICE AND METHOD OF MANUFACTURING THE SAME

This application claims the benefit under 35 U.S.C. §119 of Korean Patent Application No. 10-2006-0060862, filed in Korea on Jun. 30, 2006, which is hereby incorporated by reference for all purposes as if fully set forth herein.

BACKGROUND OF THE INVENTION

1. Field of the Invention

The invention relates to a liquid crystal display device, and more particularly, to an array substrate for a liquid crystal display (LCD) device and a method of manufacturing the same.

2. Discussion of the Related Art

Liquid crystal display ("LCD") devices are driven based on the optical anisotropy and polarization characteristics of a liquid crystal material. Liquid crystal molecules have a long and thin shape, and the liquid crystal molecules are regularly arranged along a certain direction. The alignment direction of the liquid crystal molecules depends on the intensity or the direction of an electric field applied to the liquid crystal molecules. Light passes through the LCD device along the alignment direction of the liquid crystal molecules. By controlling the intensity or the direction of the electric field, the alignment direction of the liquid crystal molecules changes so that images are displayed.

Generally, an LCD device includes two substrates, which are spaced apart and facing each other, and a liquid crystal layer is interposed between the two substrates. Each of the substrates includes an electrode. The electrodes of the respective substrates face each other. An electric field is induced between the electrodes by applying a voltage to each electrode. An alignment direction of liquid crystal molecules changes in accordance with a variation in the intensity or the direction of the electric field. The direction of the electric field is perpendicular to the substrates. The LCD device can have relatively high transmittance and a large aperture ratio.

Active matrix liquid crystal display ("AMLCD") devices, which include thin film transistors as switching devices for multiple pixels, have been widely used due to their high resolution and ability to display fast moving images.

A related art LCD device will be described hereinafter with reference to accompanying drawings.

FIG. 1 shows a schematic perspective view of an LCD device according to the related art.

In FIG. 1, an LCD device 51 includes a first substrate 5 and a second substrate 10 spaced apart from each other. A liquid crystal layer (not shown) is interposed between the first and second substrates 5 and 10. A black matrix 6 and a color filter layer is formed over an inner surface of the first substrate 5, which faces the second substrate 10, and a common electrode 9 is formed over the color filter layer. The color filter layer includes color filters of red (R), green (G) and blue (B) 7a, 7b and 7c.

Gate lines 14 and data lines 26 are formed over an inner surface of the second substrate 10, which faces the first substrate 5. The gate lines 14 and the data lines 26 cross each other to define pixel regions P. A thin film transistor T is formed at each crossing point of the gate and data lines 14 and 26. A pixel electrode 32 is formed in each pixel region P and is connected to the thin film transistor T. The pixel electrode 32 is formed of a transparent conductive material that transmits light relatively well, such as indium tin oxide (ITO).

The first substrate 5, which includes the black matrix 6, the color filter layer, and the common electrode 9, may be referred to as a color filter substrate. The second substrate 10, which includes the gate lines 14, the data lines 26, the thin film transistors T, and the pixel electrodes 32, may be referred to as an array substrate.

The array substrate may be manufactured using 5 or 6 mask processes. For example, the array substrate may be manufactured using a 5 mask processes as follows. First, gate lines, gate electrode and gate pads are formed over a substrate using a first mask process. Then, active layers and ohmic contact layers are formed using a second mask process. Data lines, source electrodes, drain electrodes and data pads are formed using a third mask process. A passivation layer is formed substantially on an entire surface of the substrate, and contact holes exposing the drain electrodes are formed in the passivation layer using a fourth mask process. Pixel electrodes, which are connected to the drain electrodes through the contact holes, are formed using a fifth mask process.

The mask process includes many process sequences of coating a thin film with photoresist, exposing the photoresist to light, developing the photoresist, etching the thin film, and removing the photoresist. As the number of mask processes increases, manufacturing costs and time increase. In addition, the probability that problems may occur also increases, and the productivity yield decreases.

To solve these problems, a 4 mask process for manufacturing the array substrate has been proposed.

FIG. 2 is a plan view of an array substrate for an LCD device manufactured using 4 mask processes according to the related art.

In FIG. 2, gate lines 62 are formed over a substrate 60, and data lines 98 cross the gate lines 62 to define pixel regions P. A gate pad 66 is formed at one end of each gate line 62, and a data pad 99 is formed at one end of each data line 98. A gate pad electrode GP is formed over the gate pad 66 and contacts the gate pad 66. A data pad electrode DP is formed over the data pad 99 and contacts the data pad 99.

A thin film transistor T is formed at each crossing point of the gate and data lines 62 and 98. The thin film transistor T includes a gate electrode 64, a first semiconductor layer 90a, a source electrode 94 and a drain electrode 96. The gate electrode 64 is connected to the gate line 62. The first semiconductor layer 90a is disposed over the gate electrode 64. The source and drain electrodes 94 and 96 are formed over the first semiconductor layer 90a and are spaced apart from each other. The source electrode 94 is connected to the data line 98.

A pixel electrode PXL is formed in each pixel region P. The pixel electrode PXL connects to the drain electrode 96 and is transparent.

A metallic layer 86 is formed over a part of each gate line 62 and is connected to the pixel electrode PXL. The metallic layer 86 has an island shape. The gate line 62 and the metallic layer 86 form a storage capacitor Cst that includes an interposed gate insulating layer (not shown). The gate line 62 functions as a first electrode, the metallic layer 86 acts as a second electrode, and the gate insulating layer functions as a dielectric substance.

A second semiconductor layer 90b is formed under the data line 98, and a third semiconductor layer 90c is formed under the metallic layer 86. The second semiconductor layer 90b extends from the first semiconductor layer 90a.

In the array substrate manufactured using 4 mask processes, intrinsic amorphous silicon layers are exposed at edges of the source electrode 94, the drain electrode 96 and the data line 98. Therefore, the intrinsic amorphous silicon layers are exposed to light to cause photo-leakage currents.

The photo-leakage currents cause coupling with the pixel electrode PXL. The coupling induces wavy noise in the displayed image.

FIGS. 3A and 3B show cross sectional views of the related art technology.

FIGS. 3A and 3B show cross-sectional views of an array substrate according to the related art and correspond to the line II-II and the line V-V of FIG. 2, respectively.

In FIGS. 3A and 3B, when the array substrate is manufactured using a 4 mask process, a first semiconductor layer 90a is formed under source electrode 94 and drain electrode 96, and a second semiconductor layer 90b is formed under the data line 98. Each of the first and second semiconductor layers 90a and 90b includes an intrinsic amorphous silicon layer (a-Si:H) and an impurity-doped amorphous silicon layer (for example, n+ a-Si:H). The intrinsic amorphous silicon layer of the first semiconductor layer 90a is referred to as an active layer 92a, and the impurity-doped amorphous silicon layer of the first semiconductor layer 90a is referred to as an ohmic contact layer 92b. The intrinsic amorphous silicon layer 70 of the second semiconductor layer 90b is exposed at both sides of the data line 82. That is, the intrinsic amorphous silicon layer 70 of the second semiconductor layer 90b is exposed to a light source (not shown), and photo-leakage currents result in the intrinsic amorphous silicon layer 70 of the second semiconductor layer 90b. The intrinsic amorphous silicon layer 70 is repeatedly activated and inactivated according to subtle flickering of the light source, and the photo-leakage currents change due to this. The photo-leakage currents are coupled with signals of the pixel electrode PXL, and liquid crystal molecules over the pixel electrode PXL are distorted. A wavy noise produces wavy lines on the displayed image. Moreover, the photo-leakage currents in the active layer 92a cause problems in operating the thin film transistor T.

Also, the intrinsic amorphous silicon layer 70 of the second semiconductor layer 90b has a protruded part with a width of about 1.7 μm beyond each side of the data line 98. Generally, the data line 98 and the pixel electrode PXL have a distance of about 4.75 μm between them, considering the alignment margin. However, the distance "d" between the data line 98 and the pixel electrode PXL should be about 6.45 μm because of the protruded part. The pixel electrode PXL becomes more distant from the data line 98 by the width of the protruded part of the intrinsic amorphous silicon layer 70, and a black matrix BM covering an area between the data line 98 and the pixel electrode PXL should have a wider width W1. Accordingly, the numerical aperture, i.e., the aperture area, decreases.

As stated above, the formation and structure of the second semiconductor layer 90 under the data line 98 uses 4 mask processes. Hereinafter, 4 mask processes will be described with reference to the accompanying drawings.

FIGS. 4A to 4G, FIGS. 5A to 5G and FIGS. 6A to 6G are cross-sectional views of an array substrate manufactured according to the related art. FIGS. 4A to 4G correspond to the line II-II of FIG. 2, FIGS. 5A to 5G correspond to the line III-III of FIG. 2, and FIGS. 6A to 6G correspond to the line IV-IV of FIG. 2.

FIG. 4A, FIG. 5A and FIG. 6A show the array substrate in a first mask process. In FIG. 4A, FIG. 5A and FIG. 6A, a switching region S, a pixel region P, a gate region G, a data region D, and a storage region C are defined on a substrate 60. The pixel region P includes the switching region S. The gate region G includes the storage region C.

A gate line 62, a gate pad 66, and a gate electrode 64 are formed over the substrate 60 including the regions S, P, G, D and C. The gate pad 66 is formed at one end of the gate line 62.

The gate electrode 64 connects to the gate line 62 and is disposed in the switching region S. The gate line 62, the gate pad 66 and the gate electrode 64 are formed by depositing one or more conductive metallic materials that can include aluminum (Al), aluminum-neodymium alloy (AlNd), tungsten (W), chromium (Cr) and molybdenum (Mo). The gate line 62, the gate pad 66 and the gate electrode 64 may be a single layer of the metallic material or may be a double layer of aluminum (Al)/chromium (Cr) or aluminum (Al)/molybdenum (Mo).

FIGS. 4B to 4E, FIGS. 5B to 5E and FIGS. 6B to 6E show a second mask process.

In FIG. 4B, FIG. 5B and FIG. 6B, a gate insulating layer 68, an intrinsic amorphous silicon layer (a-Si:H) 70, an impurity-doped amorphous silicon layer (n+ or p+ a-Si:H) 72 and a conductive metallic layer 74 are formed substantially on an entire surface of the substrate 70 including the gate line 62, the gate pad 66 and the gate electrode 64.

The gate insulating layer 68 is formed of an inorganic insulating material including silicon nitride ($SiN_x$) or silicon oxide ($SiO_2$) or an organic insulating material including benzocyclobutene (BCB) or acrylic resin. The conductive metallic layer 74 is formed of one conductive metallic material discussed above.

A photoresist layer 76 is formed by coating an entire surface of the substrate 60 including the conductive metallic layer 74 with photoresist. A mask M is disposed over the photoresist layer 76. The mask M includes a light-transmitting portion B1, a light-blocking portion B2, and a light semi-transmitting portion B3. The light-transmitting portion B1 substantially transmits all light, and the photoresist layer 76 is entirely exposed to the light to thereby chemically change. The light-blocking portion B2 completely blocks the light. The light semi-transmitting portion B3 includes slits or a semi-transparent layer to decrease the intensity of light or transmittance of the light. Thus, the photoresist layer is partially exposed to light.

The light semi-transmitting portion B3 is disposed over the gate electrode 64 in the switching region S. The light-blocking portion B2 is disposed in the storage region C, in the switching region S and in the data region D. In the switching region S, the light-blocking portion B2 is disposed at both sides of the light semi-transmitting portion B3. The light-transmitting portion B1 is disposed in other regions.

The photoresist layer 76 is exposed to light through the mask M and then is developed.

In FIG. 4C, FIG. 5C and FIG. 6C, first, second and third photoresist patterns 78a, 78b and 78c are formed in the switching region S, the data region D and the storage region C, and the conductive metallic layer 74 is partially exposed. Next, the exposed conductive metallic layer 74, the impurity-doped amorphous silicon layer 72 under the conductive metallic layer 74, and the intrinsic amorphous silicon layer 70 are removed. The conductive metallic layer 74 may be removed simultaneously with the under layers 72 and 70. Alternately, the conductive metallic layer 74 may be wet-etched, and then the impurity-doped amorphous silicon layer 72 and the intrinsic amorphous silicon layer 70 may be dry-etched.

In FIG. 4D, FIG. 5D and FIG. 6D, a first metallic pattern 80, a second metallic pattern 82, and a third metallic pattern 86 are formed under the first, second and third photoresist patterns 78a, 78b and 78c, respectively. The second metallic pattern 82 extends from the first metallic pattern 80 along a side of the pixel region P. The third metallic pattern 86 corresponds to the storage region C and has an island shape. A first semiconductor pattern 90a, a second semiconductor pattern 90b, and a third semiconductor pattern 90c are formed under the first metallic pattern 80, the second metallic pattern 82 and the third metallic pattern 86, respectively. Each of the first, second and third semiconductor patterns 90a, 90b and 90c includes the intrinsic amorphous silicon layer 70 and the impurity-doped amorphous silicon layer 72.

Next, ashing is performed to remove a part of the first photoresist pattern 78a corresponding to the gate electrode 64, and the first metallic pattern 80 is exposed. At this time, other parts of the first photoresist pattern 78a, the second photoresist pattern 78b, and the third photoresist pattern 78c are partially removed. The thicknesses of the first, second and third photoresist patterns 78a, 78b and 78c are reduced, and the first, second and third metallic patterns 80, 82 and 86 are partially exposed at peripheries of the first, second and third photoresist patterns 78a, 78b and 78c.

In FIG. 4E, FIG. 5E and FIG. 6E, the exposed first metallic pattern 80 and the impurity-doped amorphous silicon layer 72 of the first semiconductor layer 90a of FIG. 4D are removed, and a source electrode 94, a drain electrode 96 and an ohmic contact layer 92b are formed. The intrinsic amorphous silicon layer of the first semiconductor layer 90a functions as an active layer 92a.

Here, when the impurity-doped amorphous silicon layer 72 of the first semiconductor layer 90a of FIG. 4D is removed, the intrinsic amorphous silicon layer, i.e., the active layer 92a, is over-etched so that particles may not remain on the surface of the active layer 92a.

The second metallic pattern 82 of FIG. 6D, which contacts the source electrode 94, becomes a data line 98, and one end of the data line 98 becomes a data pad 99. The third island-shaped metallic pattern 86 and the gate line 62 in the storage region C function as electrodes for a capacitor. The gate line 62 acts as a first electrode, and the third metallic pattern 86 functions as a second electrode. The gate line 62, the gate insulating layer 68, the third semiconductor pattern 90c and the third metallic pattern 86 constitute a storage capacitor Cst.

Next, the photoresist patterns 78a, 78b and 78c are removed.

FIG. 4F, FIG. 5F and FIG. 6F show a third mask process. In FIG. 4F, FIG. 5F and FIG. 6F, a passivation layer PAS is formed substantially on an entire surface of the substrate 60 including the source and drain electrodes 94 and 96, the data line 98 including the data pad 99, and the storage capacitor Cst. The passivation layer PAS may be formed by depositing an inorganic insulating material such as silicon nitride (SiNx) or silicon oxide ($SiO_2$) or by coating the substrate 60 with an organic insulating material such as benzocyclobutene (BCB) or acrylic resin.

Subsequently, the passivation layer PAS is patterned to form a drain contact hole CH1, a storage contact hole CH2, a gate pad contact hole CH3 and a data pad contact hole CH4. The drain contact hole CH1 partially exposes the drain electrode 96, the storage contact hole CH2 exposes the third metallic pattern 86, the gate pad contact hole CH3 partially exposes the gate pad 66, and the data pad contact hole CH4 partially exposes the data pad 99.

FIG. 4G, FIG. 5G and FIG. 6G show a fourth mask process. In FIG. 4G, FIG. 5G and FIG. 6G, a pixel electrode PXL, a gate pad electrode GP and a data pad electrode DP are formed over the substrate 60 including the passivation layer PAS by depositing a transparent conductive metal such as indium tin oxide (ITO) or indium zinc oxide (IZO) and then patterning it. The pixel electrode PXL contacts the drain electrode 96 and the third metallic pattern 86. The gate pad electrode GP contacts the gate pad 66, and the data pad electrode DP contacts the data pad 99.

The array substrate for a liquid crystal display device may be manufactured using the 4 mask processes discussed above. The manufacturing costs and time can be reduced due to the 4 mask processes, and the probability that problems may occur also decreases.

However, in an array substrate manufactured using 4 mask processes, the semiconductor layer is exposed at both sides of the data line. Light impinging on the exposed semiconductor layer causes wavy noise on the displayed images. In addition, the aperture ratio decreases due to the semiconductor layer.

Meanwhile, photo-leakage currents are induced in the active layer of the thin film transistor, and the thin film transistor may operate improperly.

BRIEF SUMMARY OF THE INVENTION

Accordingly, the invention is directed, in part, to an array substrate for a liquid crystal display device that substantially obviates one or more problems due to limitations and disadvantages of the related art. Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

The invention, in part, pertains to an array substrate for a liquid crystal display device that includes a substrate, a gate line over the substrate, a data line crossing the gate line to define a pixel region and including a transparent conductive layer and an opaque conductive layer, a data pad at one end of the data line and including a transparent conductive layer, a thin film transistor connected to the gate line and the data line and including a gate electrode, an active layer, an ohmic contact layer, a buffer metallic layer, a source electrode and a drain electrode, and a pixel electrode in the pixel region and connected to the thin film transistor, the pixel electrode including a transparent conductive layer.

The invention, in part, pertains to a method of manufacturing an array substrate for a liquid crystal display device that includes forming a gate electrode and a gate line over a substrate using a first mask process, forming a first insulating layer, an active layer, an ohmic contact layer and a buffer metallic layer over the substrate including the gate electrode and the gate line using a second mask process, forming a source electrode, a drain electrode, a pixel electrode, a data line and a data pad using a third mask process, each of the source electrode, the drain electrode and the data line including a transparent conductive layer and an opaque conductive layer, each of the pixel electrode and the data pad including a transparent conductive layer, and forming a second insulating layer exposing the pixel electrode and the data pad using a fourth mask process.

The invention, in part, pertains to an array substrate for a liquid crystal display device that includes a substrate, a gate line over the substrate, a data line crossing the gate line to define a pixel region, a thin film transistor connected to the gate line and the data line and including a gate electrode, an active layer, an ohmic contact layer, a buffer metallic layer, a source electrode and a drain electrode, pixel electrodes in the pixel region and connected to the thin film transistor, and common electrodes in the pixel region and alternating with the pixel electrodes, wherein the data line includes a transparent conductive layer and an opaque conductive layer.

The invention, in part, pertains to a method of manufacturing method of an array substrate for a liquid crystal display device that includes forming a gate electrode, a gate line and a gate pad over a substrate using a first mask process, forming a first insulating layer, an active layer, an ohmic contact layer and a buffer metallic layer over the substrate including the gate electrode, the gate line and a gate pad using a second mask process, wherein the first insulating layer exposes the gate pad, forming a source electrode, a drain electrode, pixel electrodes, common electrodes, a data line, a data pad and a gate pad electrode using a third mask process, and forming a second insulating layer exposing the data pad and the gate pad electrode using a fourth mask process. In the invention, the light-transmitting portion may optionally correspond to other areas except the source and drain electrodes, the data line, the data pad, the gate pad electrode, the common electrodes and the pixel electrodes It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this specification, illustrate embodiments of the disclosure and together with the description serve to explain the principles of the disclosure. In the drawings:

FIGS. 4A to 4G, FIGS. 5A to 5G and FIGS. 6A to 6G show cross-sectional views of an array substrate in processes of manufacturing the same according to the related art;

FIGS. 8A, 8B and 8C show cross-sectional views of an array substrate according to the first embodiment of the invention;

FIGS. 9A to 9K, FIGS. 10A to 10K, and FIGS. 11A to 11K illustrate an array substrate in processes of manufacturing the same according to the first embodiment of the invention;

FIGS. 13A, 13B, 13C and 13D show cross-sectional views of an array substrate according to the second embodiment of the invention;

FIGS. 14A to 14K, FIGS. 15A to 15K, FIGS. 16A to 16K, and FIGS. 17A to 17K illustrate an array substrate in processes of manufacturing the same according to the second embodiment of the invention.

DETAILED DESCRIPTION

Reference will now be made in detail to the preferred embodiments of the invention, examples of which are illustrated in the accompanying drawings.

In the invention, an array substrate is manufactured using 4 mask processes in which an active layer is formed over and within a gate electrode and source and drain electrodes are formed of a transparent conductive material.

Figure 1:
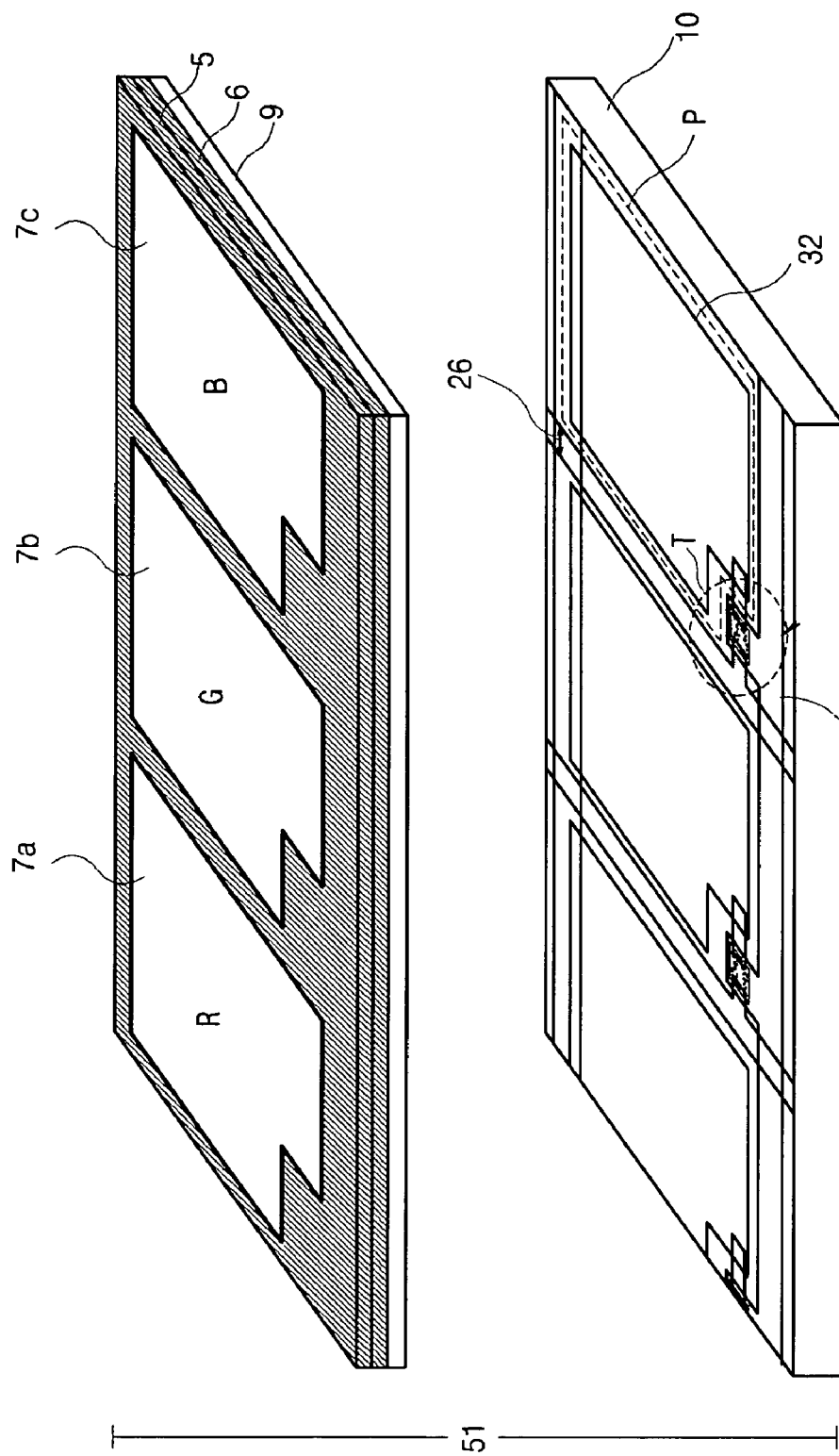
FIG. 1 shows a schematic perspective view of an LCD device according to the related art.
Figure 2:
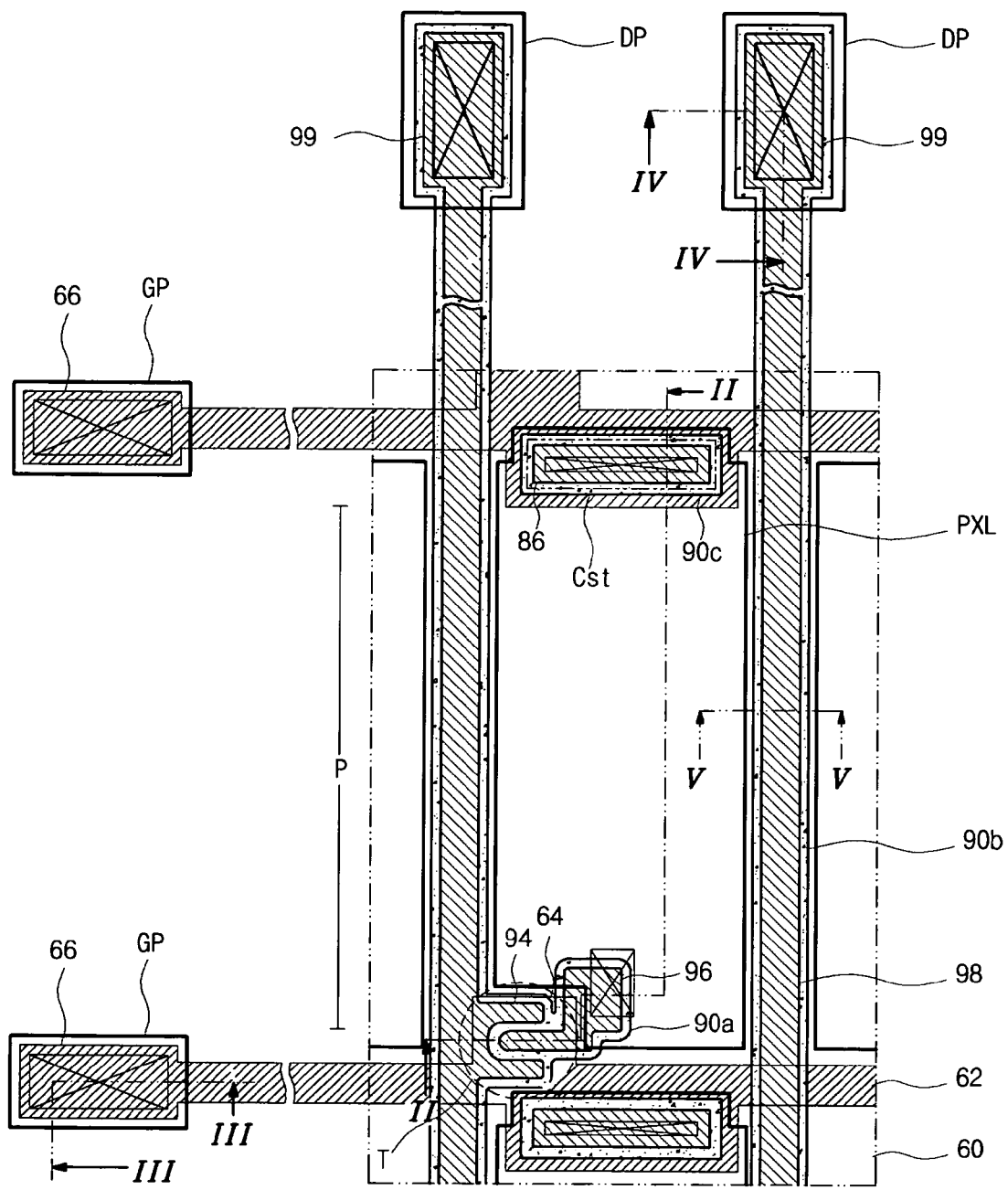
FIG. 2 shows a plan view of an array substrate for an LCD device manufactured using 4 mask processes according to the related art.
Figure 3A:
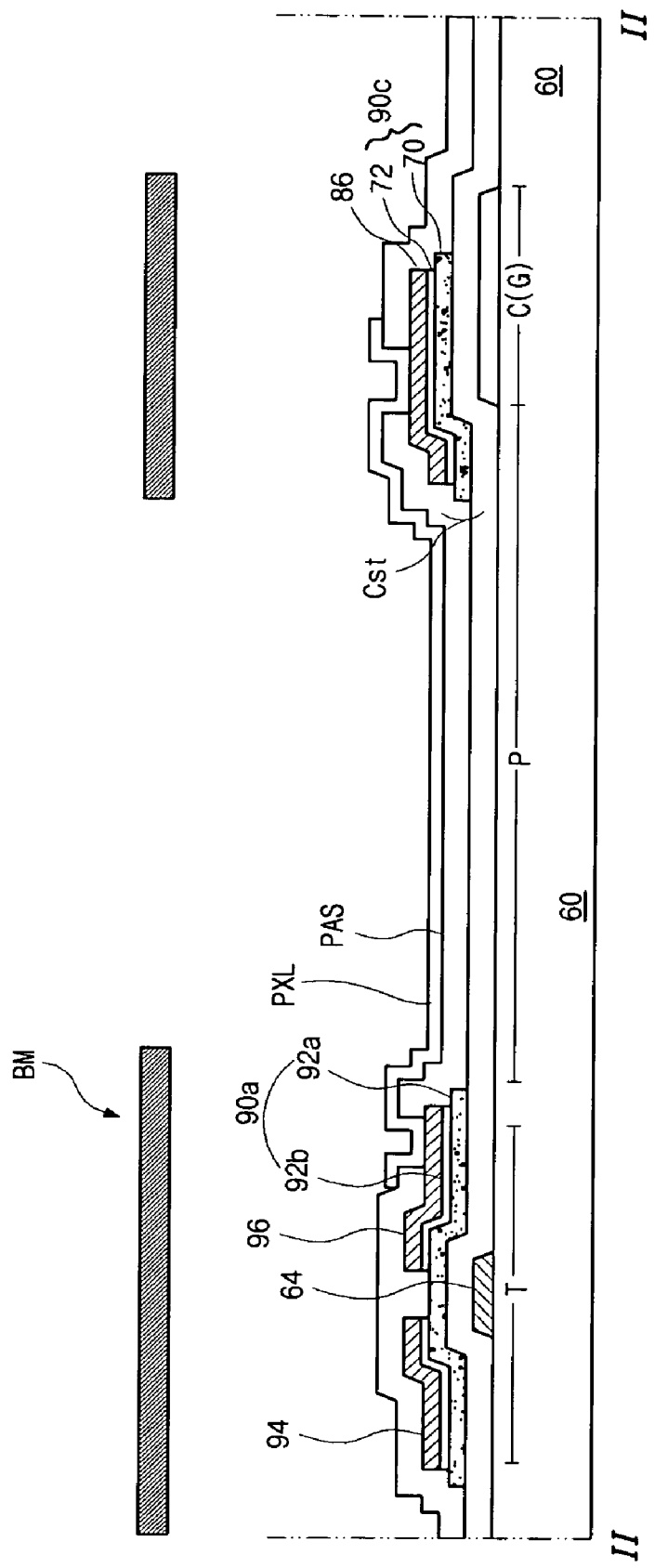
FIGS. 3A and 3B show cross-sectional views of an array substrate according to the related art.
Figure 3B:
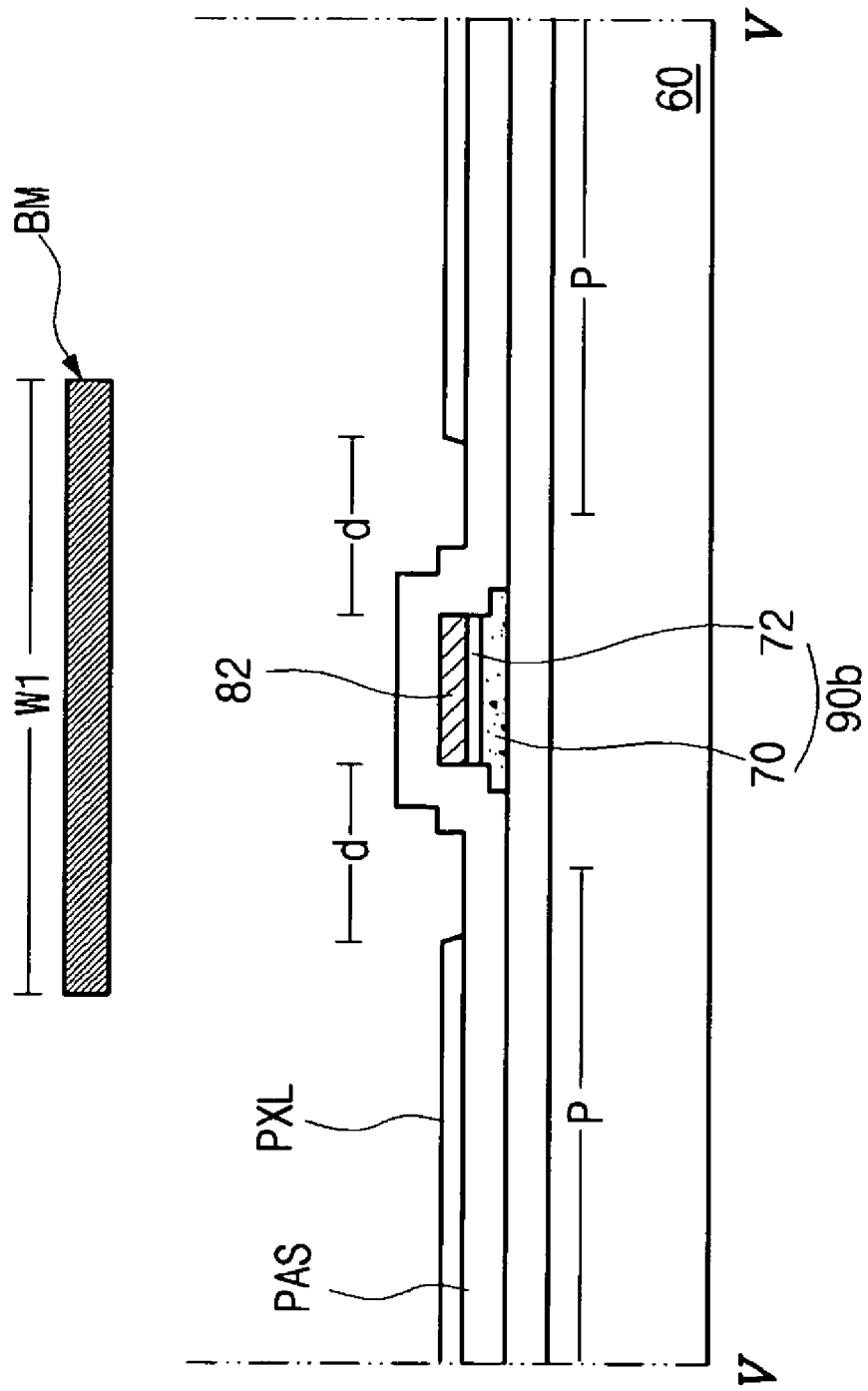
Figure 4A:
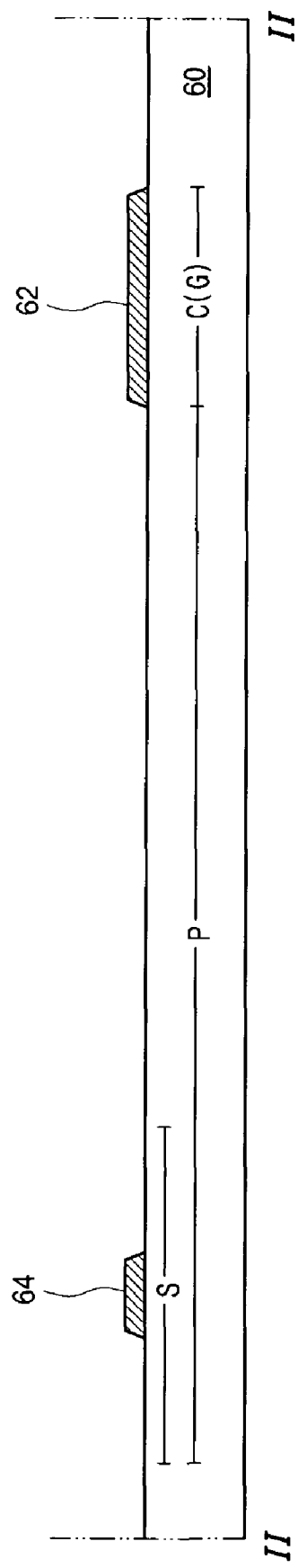
Figure 4B:
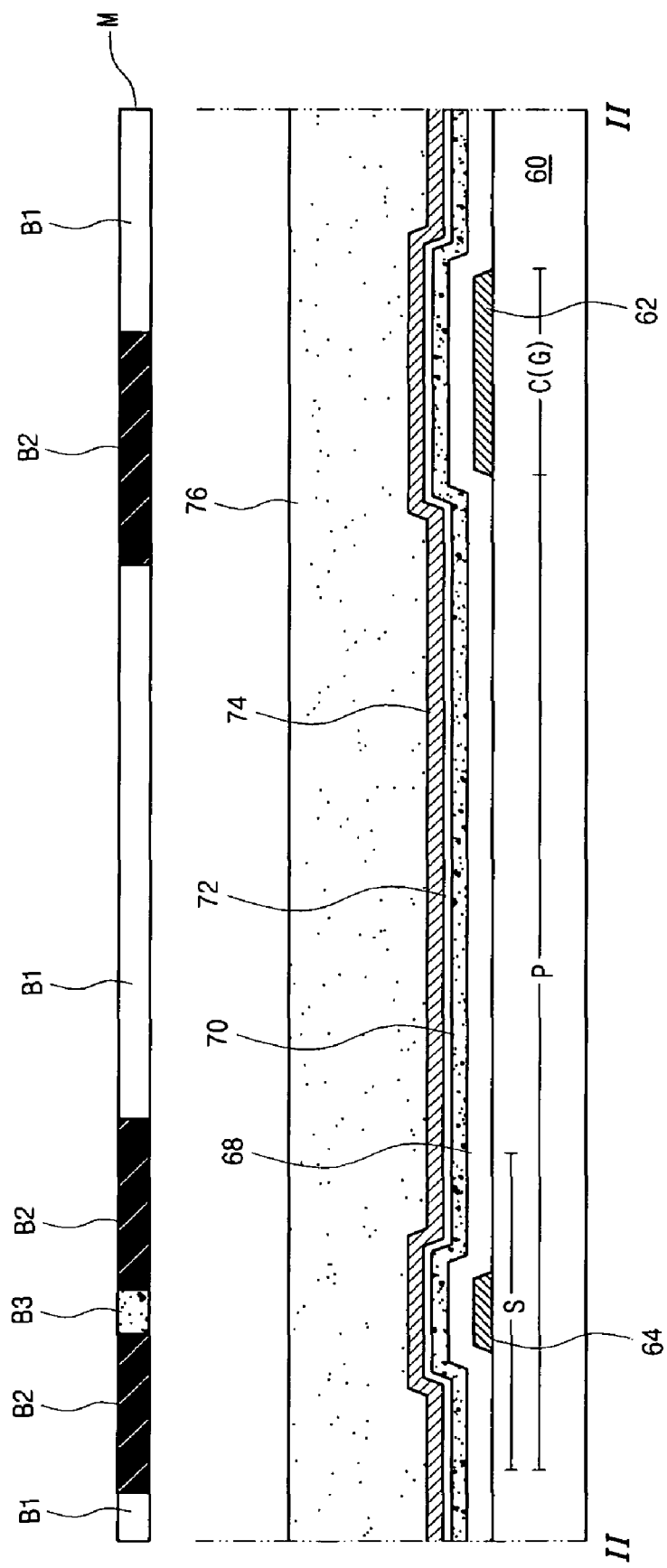
Figure 4C:
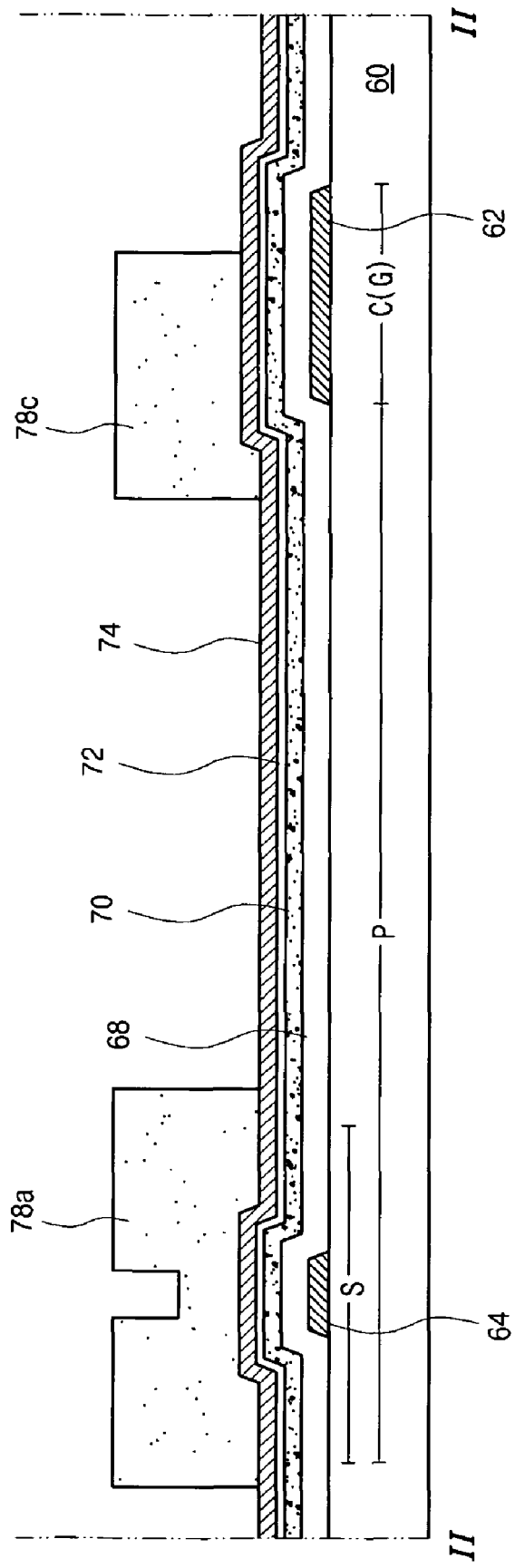
Figure 4D:
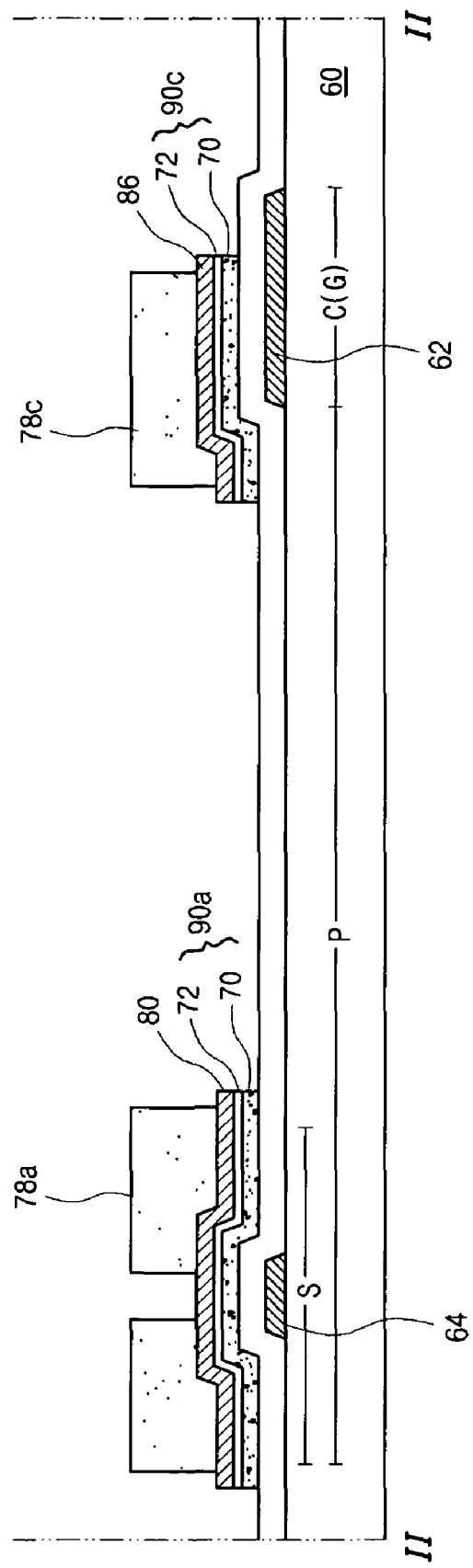
Figure 4G:
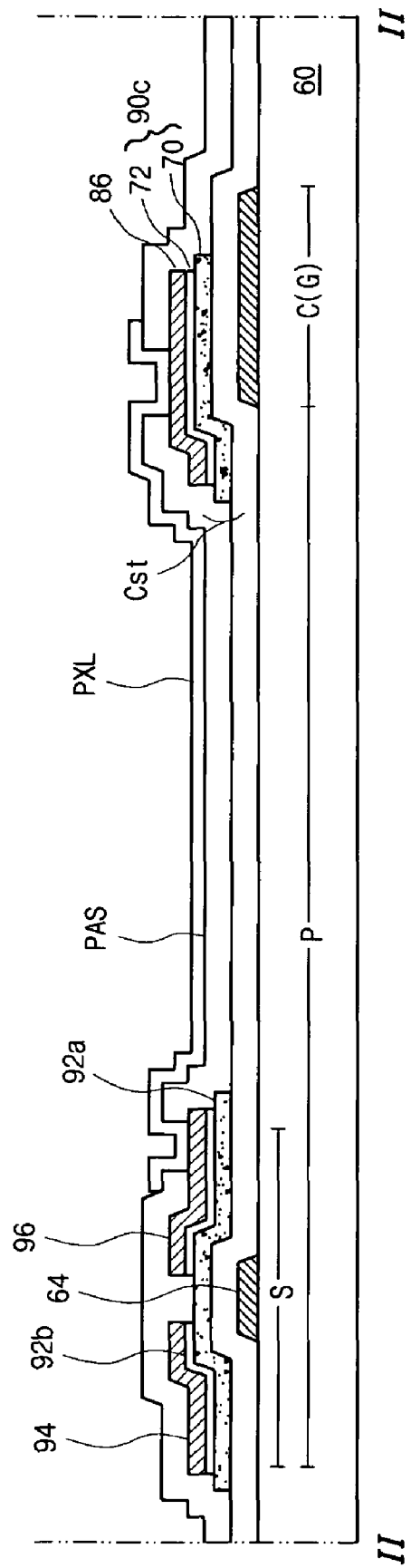
Figure 5A:
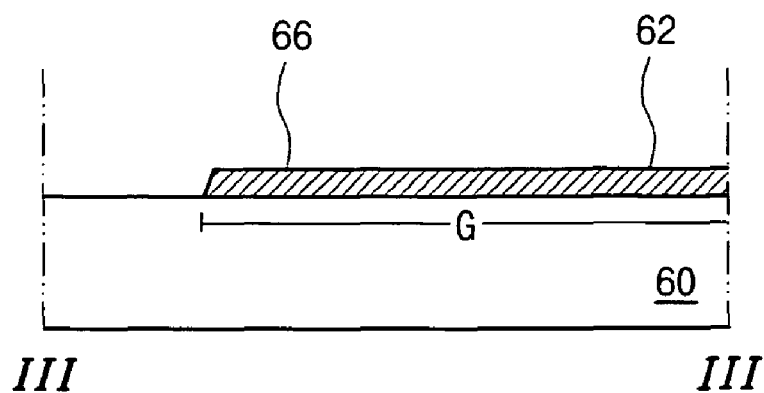
Figure 5B:
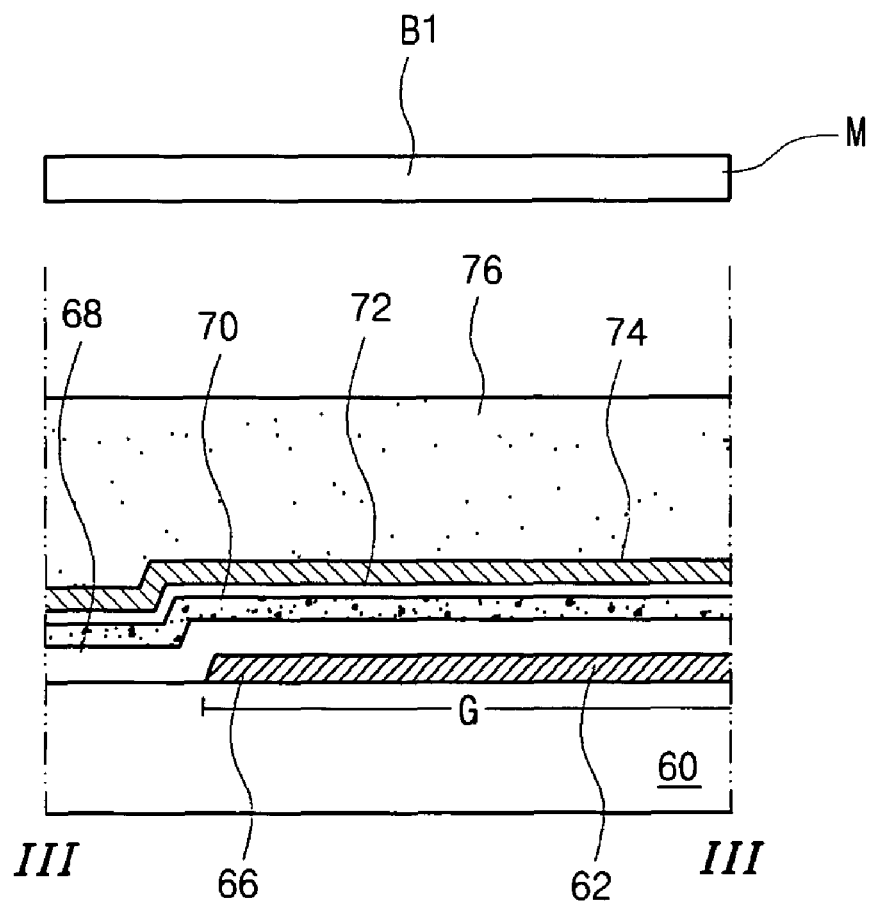
Figure 5C:
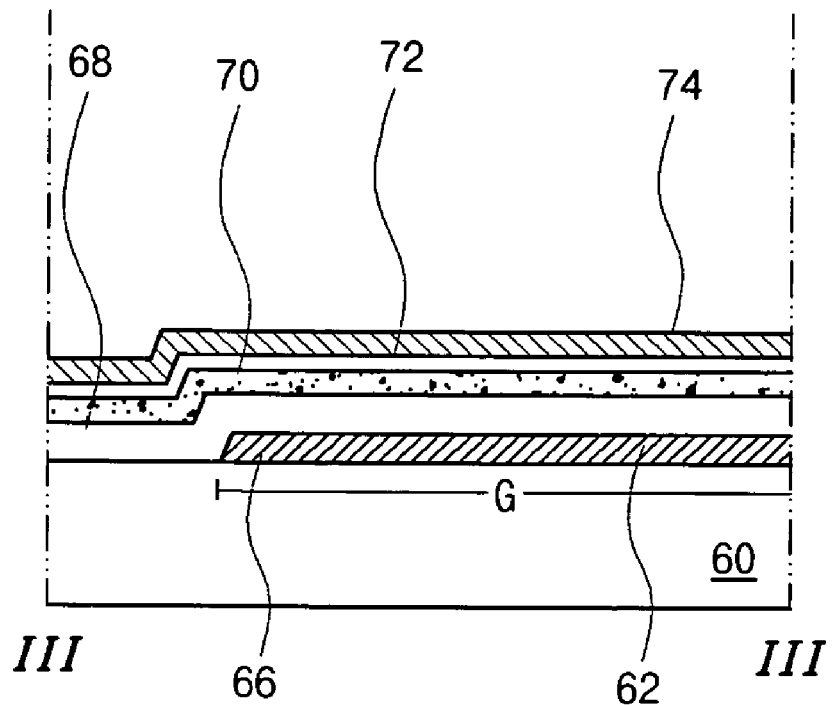
Figure 5D:
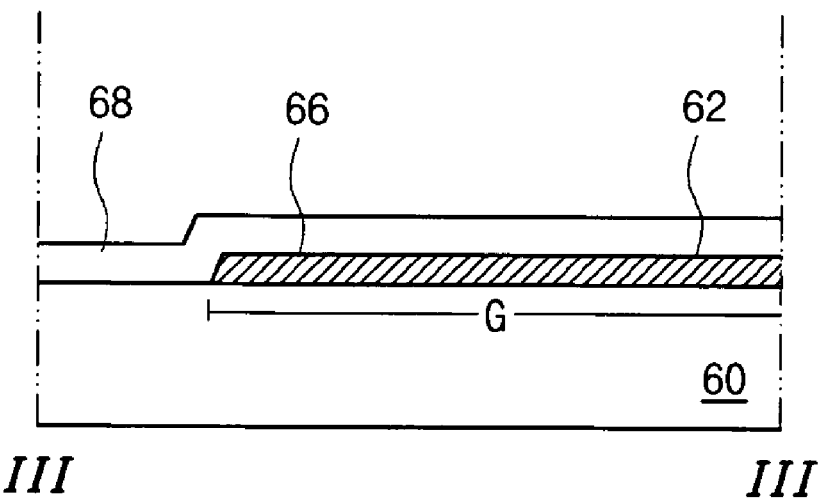
Figure 5E:
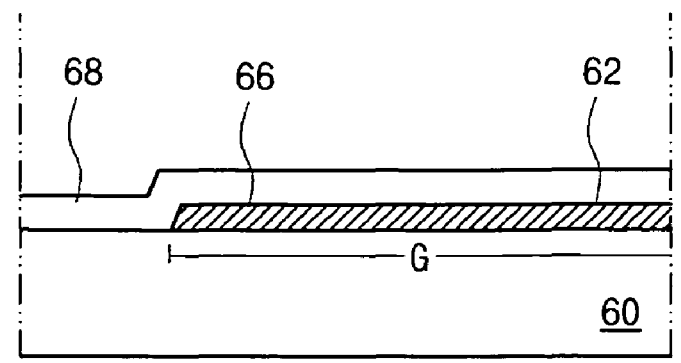
Figure 5F:
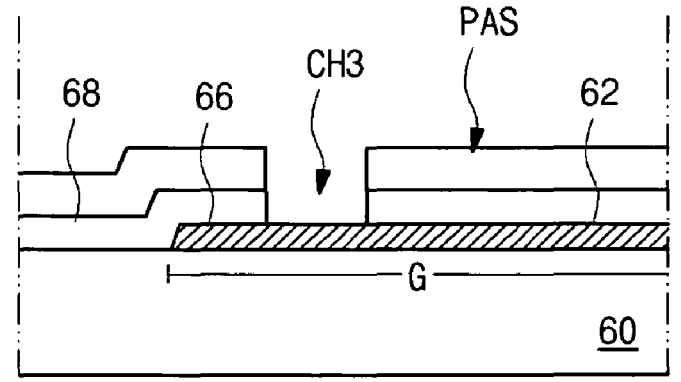
Figure 5G:
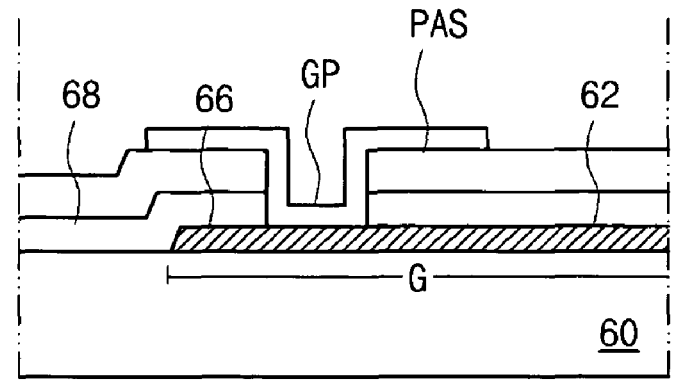
Figure 6A:
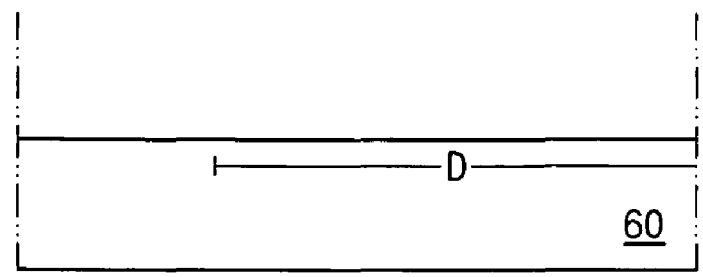
Figure 6B:
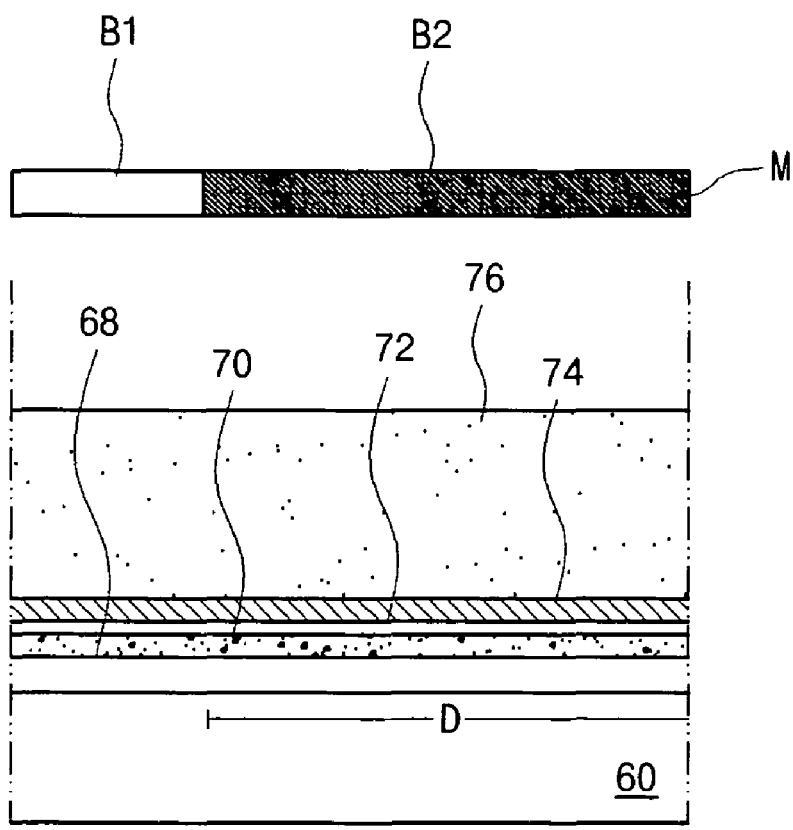
Figure 6C:
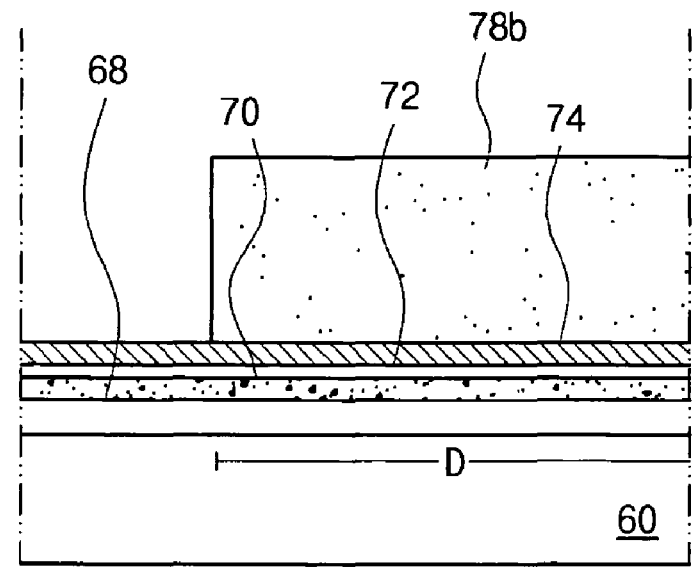
Figure 6D:
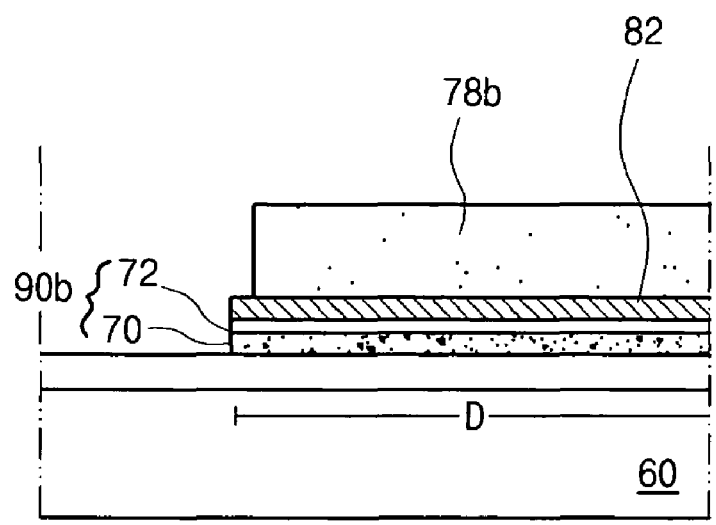
Figure 6E:
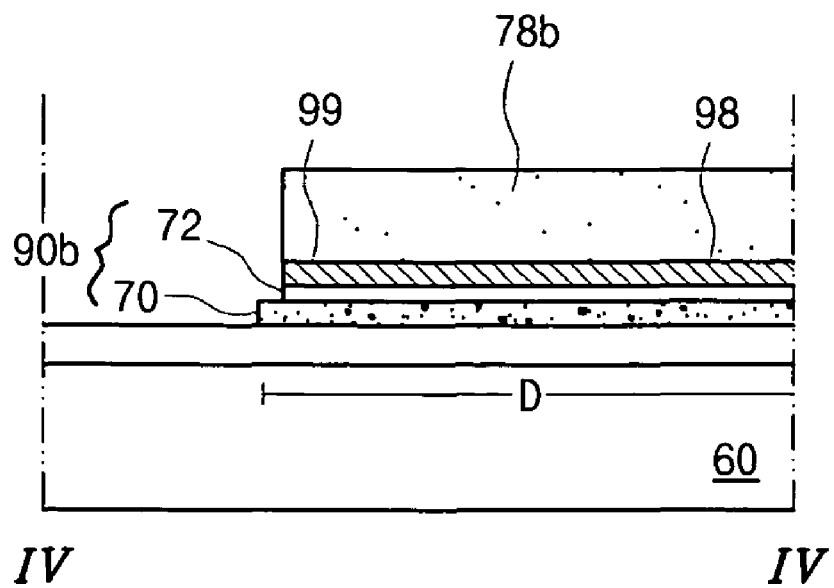
Figure 6F:
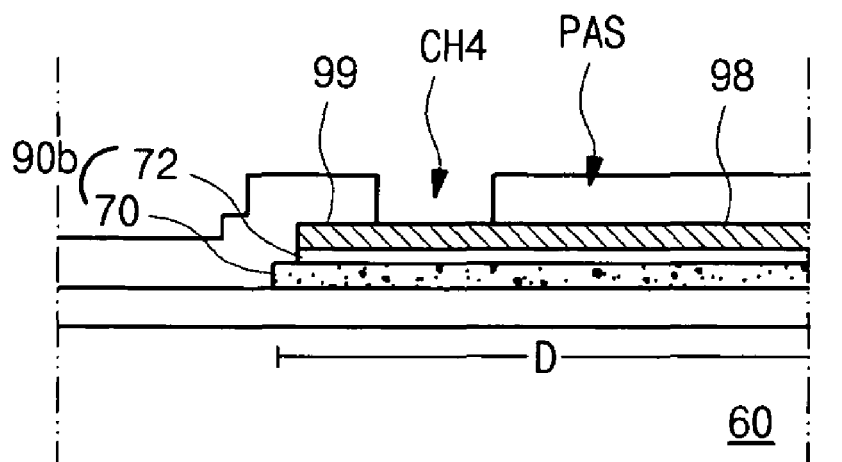
Figure 6G:
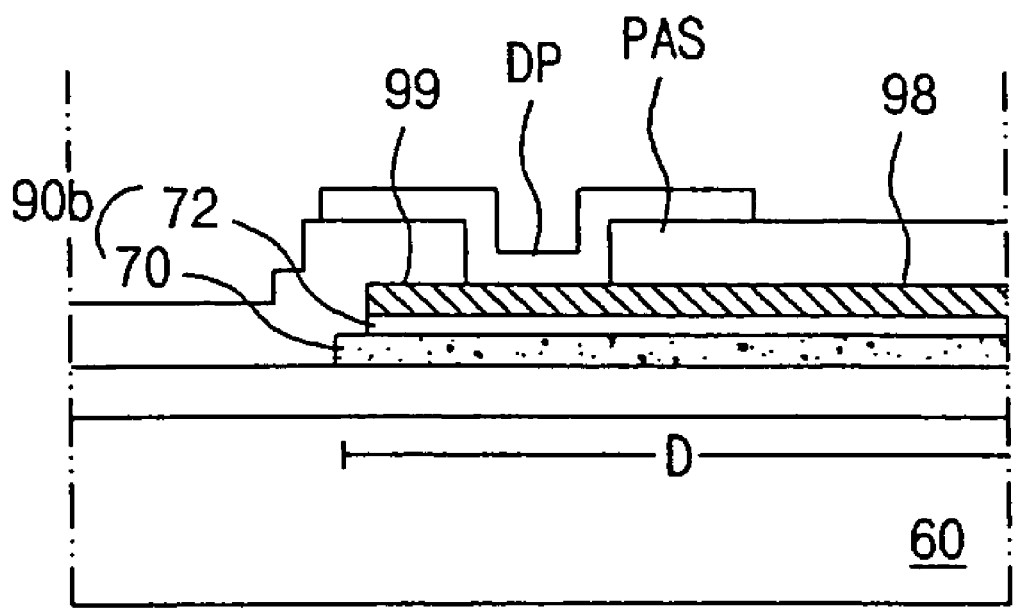
Figure 7:
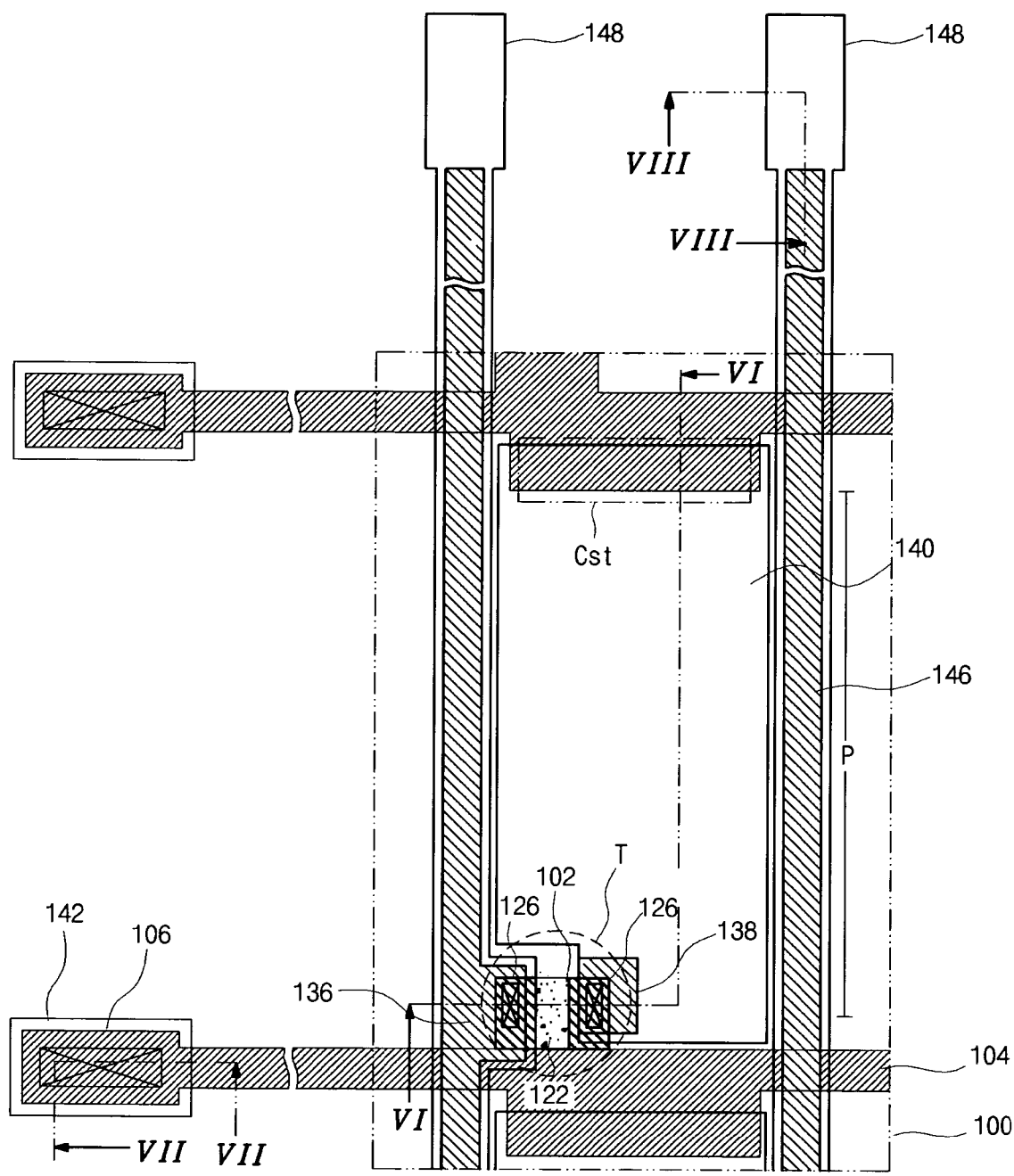
FIG. 7 shows a plan view of an array substrate for an LCD device according to a first embodiment of the invention.

FIG. 7 shows a plan view of an array substrate for a liquid crystal display (LCD) device according to a first preferred embodiment of the invention. In FIG. 7, a gate line 104 is formed over an insulating substrate 100 along a first direction, and a data line 146 is formed along a second direction. The gate line 104 and the data line 146 cross each other to define a pixel region P. A gate pad 106 is formed at one end of the gate line 104, and a data pad 148 is formed at one end of the data line 146. A gate pad electrode 142 is formed over the gate pad 106, and the gate pad electrode 142 is substantially transparent.

A thin film transistor T is formed at or near a crossing point of the gate line 104 and the data line 146. The thin film transistor T includes a gate electrode 102, an active layer 122, an ohmic contact layer (not shown), a buffer metallic layer 126, a source electrode 136 and a drain electrode 138. The buffer metallic layer 126 contacts the ohmic contact layer and the source and drain electrodes 136 and 138.

A pixel electrode 140 is formed in the pixel region P and is connected to the drain electrode 138. The pixel electrode 140 extends over the gate line 104. The pixel electrode 140 overlaps the gate line 104 to form a storage capacitor Cst, wherein the gate line 104 acts as a first electrode and the pixel electrode 140 functions as a second electrode.

The array substrate of FIG. 7 is manufactured using 4 mask processes. Here, the active layer 122 is formed over and within the gate electrode 102, and there is no semiconductor layer under the data line 146.

Figure 8C:
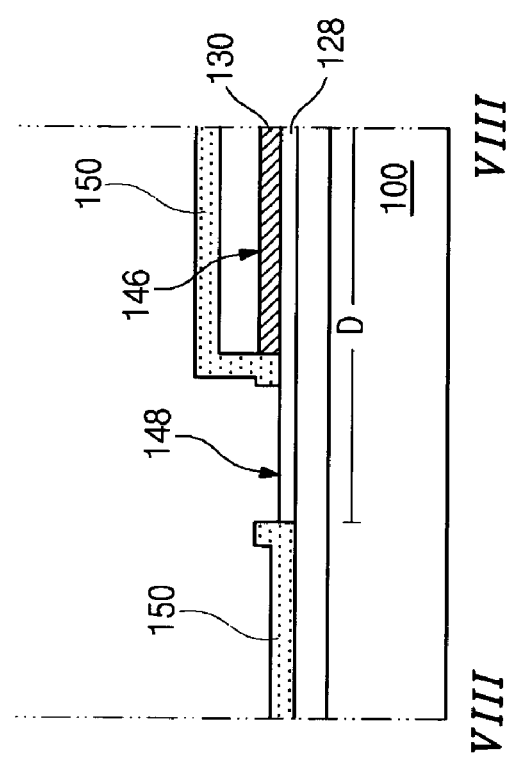

FIGS. 8A, 8B and 8C are cross-sectional views of an array substrate according to the first preferred embodiment of the invention. FIGS. 8A, 8B and 8C correspond to the line VI-VI, the line VII-VII, and the line VIII-VIII of FIG. 7. FIG. 8A shows a switching region and a pixel region, FIG. 8B shows a gate region including a gate line and a gate pad, and FIG. 8C shows a data region including a data line and a data pad.

In FIGS. 8A, 8B and 8C, a pixel region P, a gate region G a data region D, a storage region C, and a switching region S are defined over a substrate 100. The gate region G includes the storage region C. A thin film transistor T is formed in the switching region S over the substrate 100. The thin film transistor T includes a gate electrode 102, a first insulating layer 108, an active layer 122, an ohmic contact layer 124, a buffer metallic layer 126, and source and drain electrodes 136 and 138 that are sequentially formed. The source and drain electrodes 136 and 138 include a transparent conductive layer 128 and an opaque conductive layer 130. The buffer metallic layer 126 decreases contact resistance between the ohmic contact layer 124 and the transparent conductive layer 128.

A data line 146 is formed along a side of the pixel region P. The data line 146 is connected to the source electrode 136. The data line 146 includes a transparent conductive layer 128 and an opaque conductive layer 130. A data pad 148 is formed at one end of the data line 146. The data pad 148 includes a transparent conductive layer 128.

A gate line 104 is formed along another side of the pixel region P. The gate line 104 is connected to the gate electrode 102. Although not shown in the figures, the gate line 104 crosses the data line 146. A gate pad 106 is formed at one end of the gate line 104. A gate pad electrode 142 is formed over the gate pad 106. The gate pad electrode 142 is formed of a transparent conductive material.

Here, the active layer 122 and the ohmic contact layer 124 are formed over and within the gate electrode 102, and there are no intrinsic amorphous silicon layer and impurity-doped amorphous silicon layer under the data line 146. Therefore, the wavy noise fails to occur, and the aperture ratio is thus prevented from decreasing.

A method of manufacturing the array substrate using 4 mask processes will be explained hereinafter with reference to attached drawings.

FIGS. 9A to 9K, FIGS. 10A to 10K, and FIGS. 11A to 11K illustrate an array substrate in processes of manufacturing the same according to the first preferred embodiment of the invention. FIGS. 9A to 9K are cross-sectional views along the line VI-VI of FIG. 7, FIGS. 10A to 10K are cross-sectional views along the line VII-VII of FIG. 7, and FIGS. 11A to 11K are cross-sectional views along the line VIII-VIII of FIG. 7.

Figure 9A:
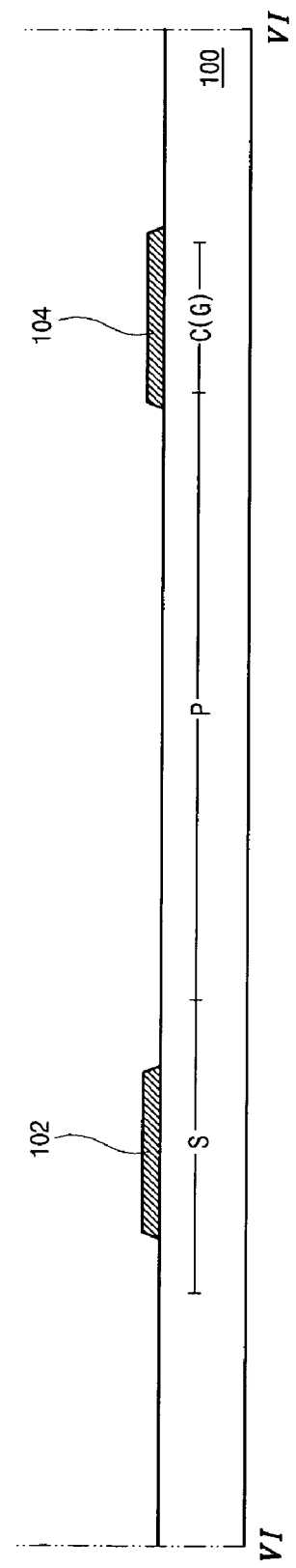
Figure 10A:
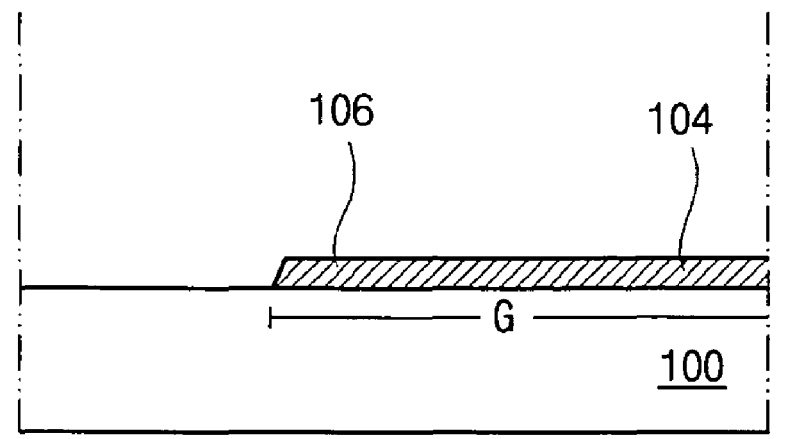
Figure 11A:
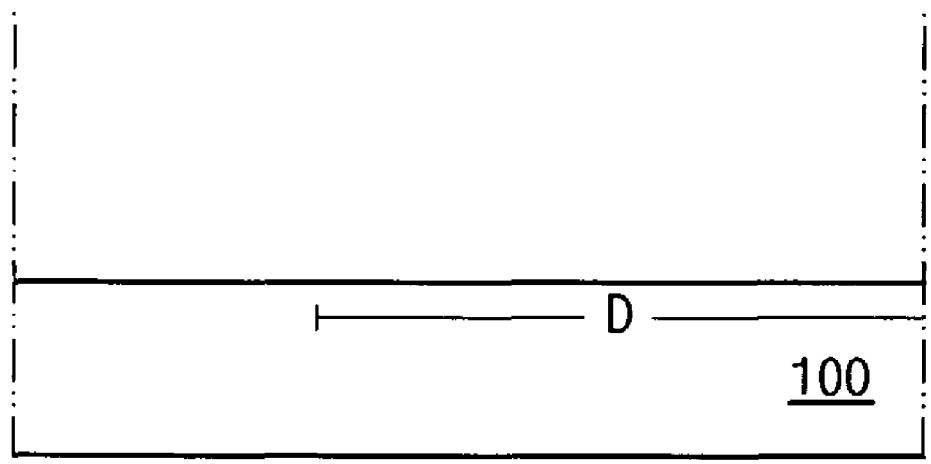

FIG. 9A, FIG. 10A and FIG. 11A show the array substrate in a first mask process. In FIG. 9A, FIG. 10A and FIG. 11A, a switching region S, a pixel region P, a gate region G, a data region D, and a storage region C are defined on a substrate 100. The gate region G includes the storage region C.

A first conductive metallic layer (not shown) is formed over the substrate 100, where the regions S, P, G, D and C are defined, by depositing at least one conductive material such as aluminum (Al), aluminum-neodynium alloy (AlNd), chromium (Cr), molybdenum (Mo), tungsten (W), titanium (Ti), copper (Cu), tantalum (Ia) or an alloy of these materials. The conductive materials that can be used are not restricted to these materials, and any suitable conductive material can be used. The first conductive metallic layer is patterned using a first mask process, and a gate electrode 102, a gate line 104 and a gate pad 106 are formed. The gate electrode 102 is disposed in the switching region S, and the gate line 104 and the gate pad 106 are disposed in the gate region G. The gate pad 106 is formed at one end of the gate line 104.

FIGS. 9B to 9E, FIGS. 10B to 10E, and FIGS. 11B to 11E show the array substrate in a second mask process.

Figure 9B:
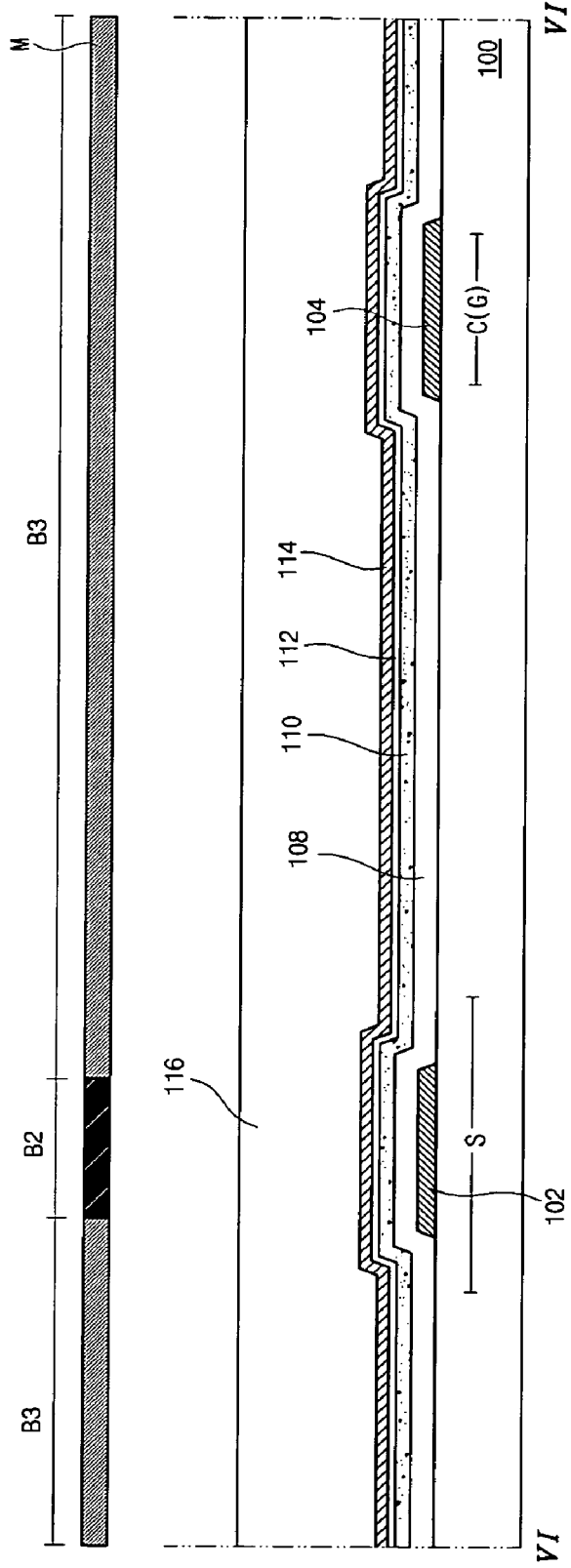
Figure 10B:
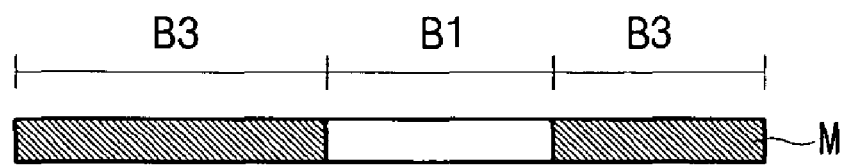
Figure 10B:
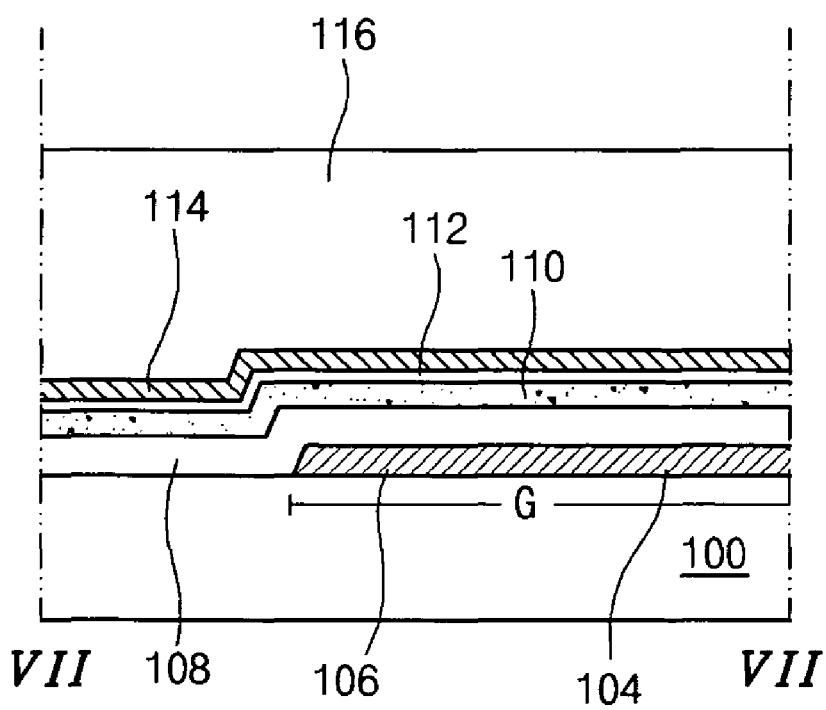
Figure 11B:
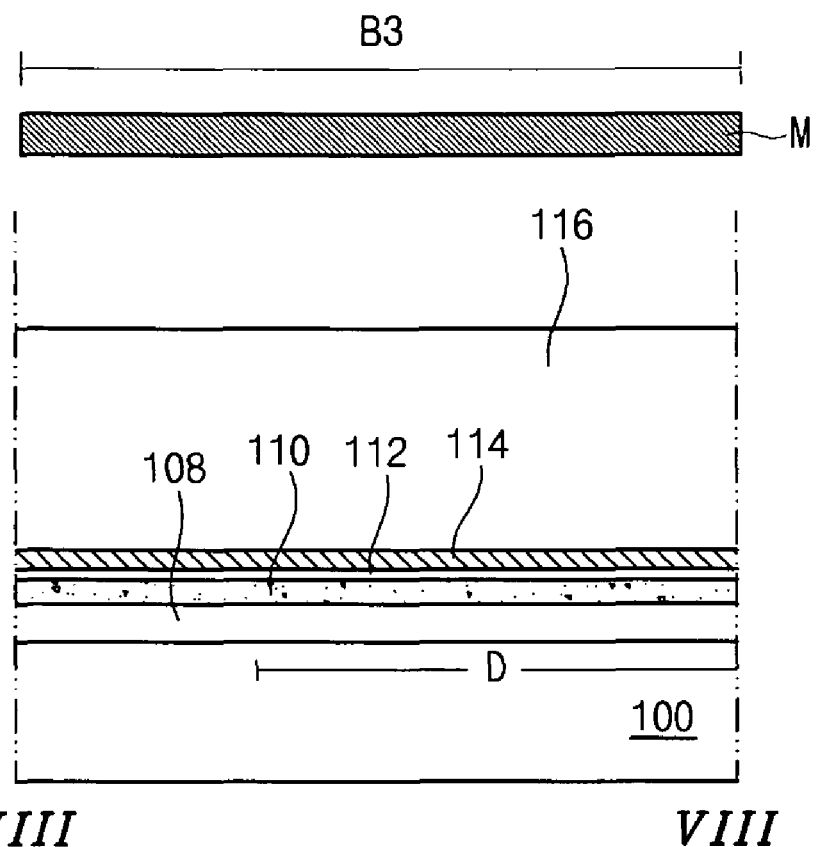

In FIG. 9B, FIG. 10B and FIG. 11B, a first insulating layer 108, an intrinsic amorphous silicon layer (a-Si:H) 110, an impurity-doped amorphous silicon layer (for example, n+ a-Si:H) 112, and a second conductive metallic layer 114 are sequentially formed substantially or entirely over an entire surface of the substrate 100 including the gate electrode 102, the gate line 104 and the gate pad 106. A photoresist layer 116 is formed over the second conductive metallic layer 114 by coating the substrate 100 with a positive or negative photoresist.

The first insulating layer 108 may be formed by depositing one or more inorganic insulating materials such as silicon nitride ($SiN_x$) or silicon oxide ($SiO_2$). The second conductive metallic layer 114 may be formed of one selected from the above-mentioned conductive materials, and the second conductive metallic layer 114, beneficially, may be formed of a metallic material that can be dry-etched, for example, molybdenum (Mo).

A mask M is disposed over the photoresist layer 116. The mask M includes a light-transmitting portion B1, a light-blocking portion B2, and a light semi-transmitting portion B3. The light-blocking, i.e., opaque, portion B2 corresponds to the switching region S, the light-transmitting portion B1 corresponds to the gate region G for the gate pad 106, and the light semi-transmitting, i.e., translucent, portion B3 corresponds to other regions. The size of the light-blocking portion B2 corresponding to the switching region S is not larger (that is, of smaller or equal size) than the gate electrode 102.

Next, the photoresist layer 116 is exposed to light through the mask M and then developed.

Figure 9C:
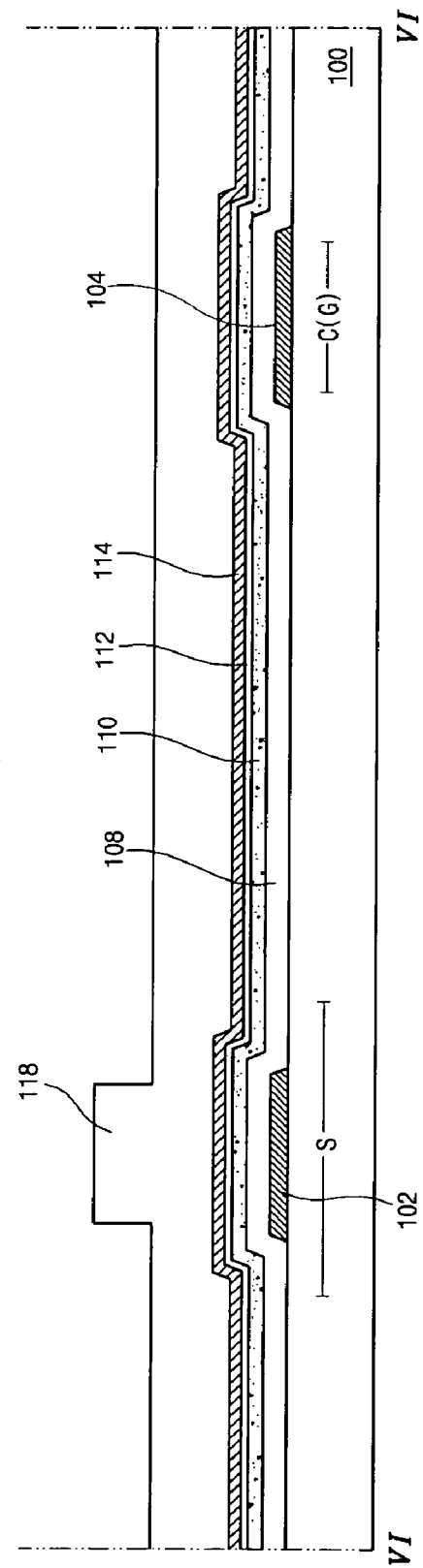
Figure 9D:
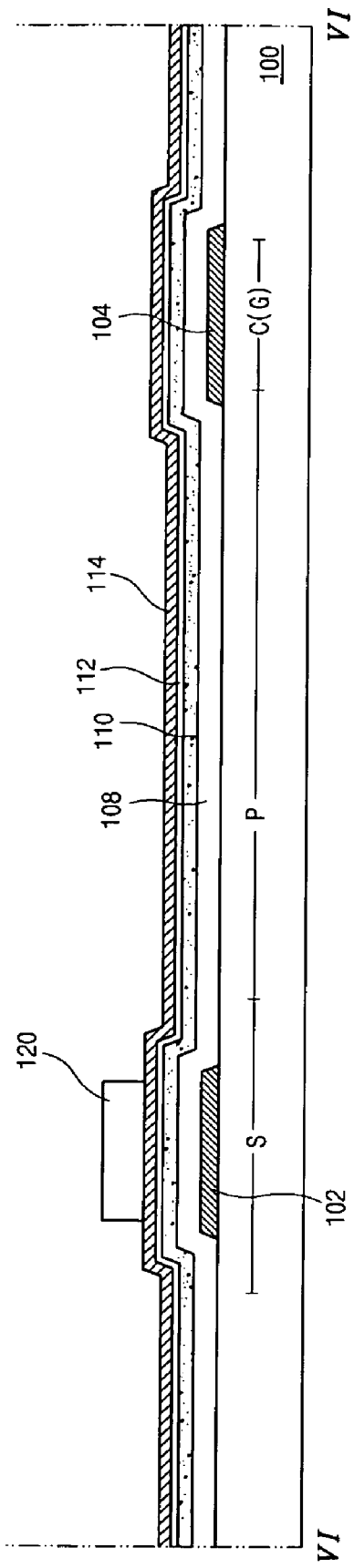
Figure 10C:
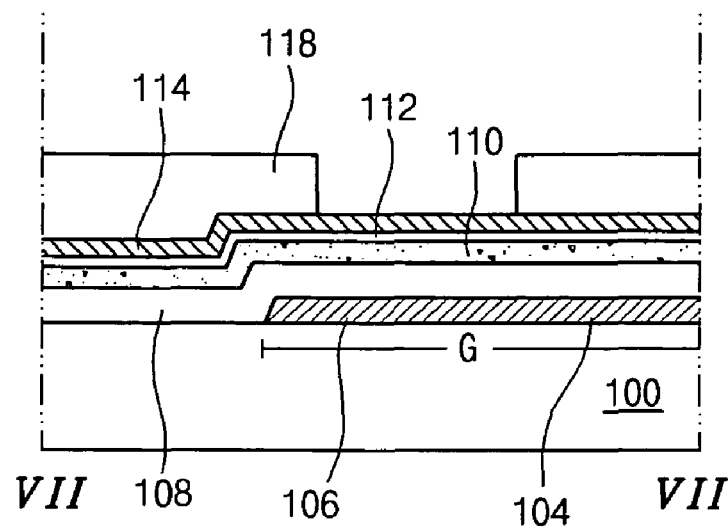
Figure 11C:
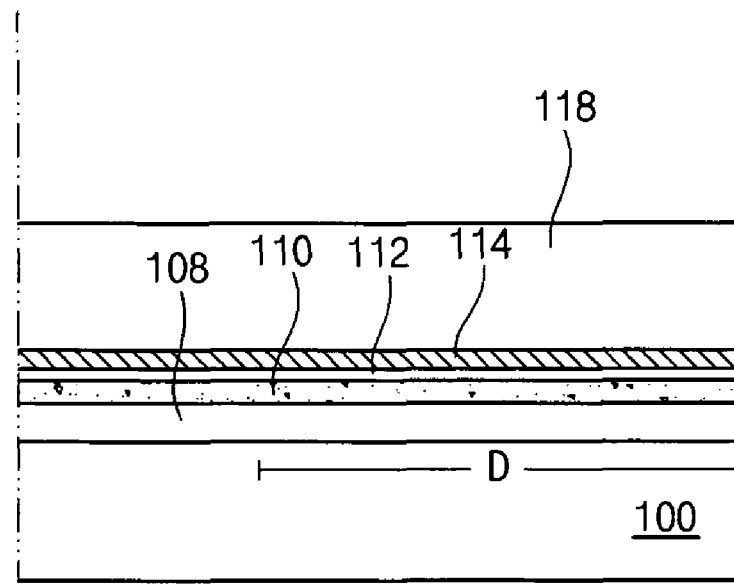
Figure 11D:
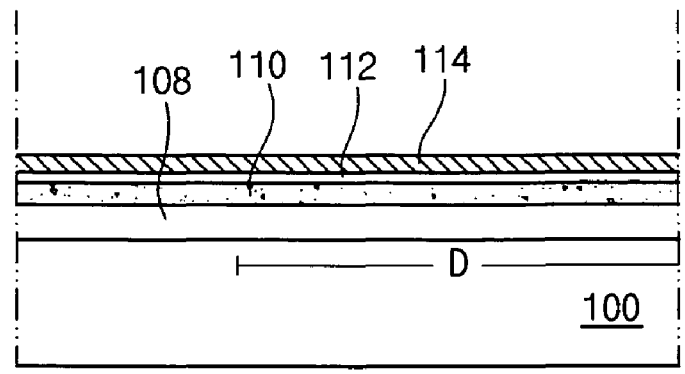

In FIG. 9C, FIG. 10C and FIG. 11C, a photoresist pattern 118 is formed after developing the photoresist layer 116 of FIG. 9B, FIG. 10B and FIG. 11B. The photoresist pattern 118 has a first part of a first thickness in the switching region S and a second part of a second thickness in other regions except the switching region S and the gate region G for the gate pad 106. The photoresist pattern 118 is removed in the gate region G for the gate pad 106 to expose the second conductive metallic layer 114. The first thickness is substantially the same as the original thickness of the photoresist layer 116 of FIG. 9B, FIG. 10B and FIG. 11B. The second thickness is thinner than the first thickness.

The exposed second conductive metallic layer 114, the impurity-doped amorphous silicon layer 112, the intrinsic amorphous silicon layer 110 and the first insulating layer 108 are removed in the gate region G for the gate pad 106.

Figure 10D:
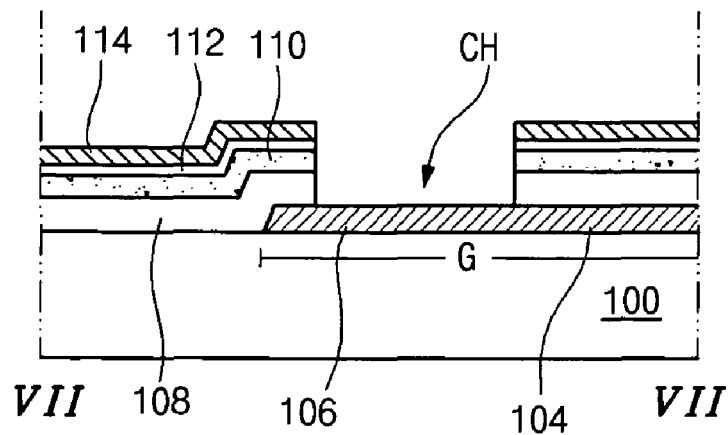

FIG. 10D typically shows a gate pad contact hole CH being formed. The gate pad contact hole CH exposes the gate pad 106. Next, in FIG. 9D, FIG. 10D and FIG. 11D, an ashing process is performed to remove the second part of the photoresist pattern 118. At this time, the first part of the photoresist pattern 118 of FIG. 9C is also partially removed, and a photoresist pattern 120 remains in the switching region S. The photoresist pattern 120 has a thinner thickness than the first part of the photoresist pattern 118 of FIG. 9C. The second conductive metallic layer 114 is exposed in the other regions except the switching region S and the gate region G for the gate pad 106.

The second conductive metallic layer 114, the impurity-doped amorphous silicon layer 112, and the intrinsic amorphous silicon layer 110 are removed by using the photoresist pattern 120 as an etching mask.

Figure 9E:
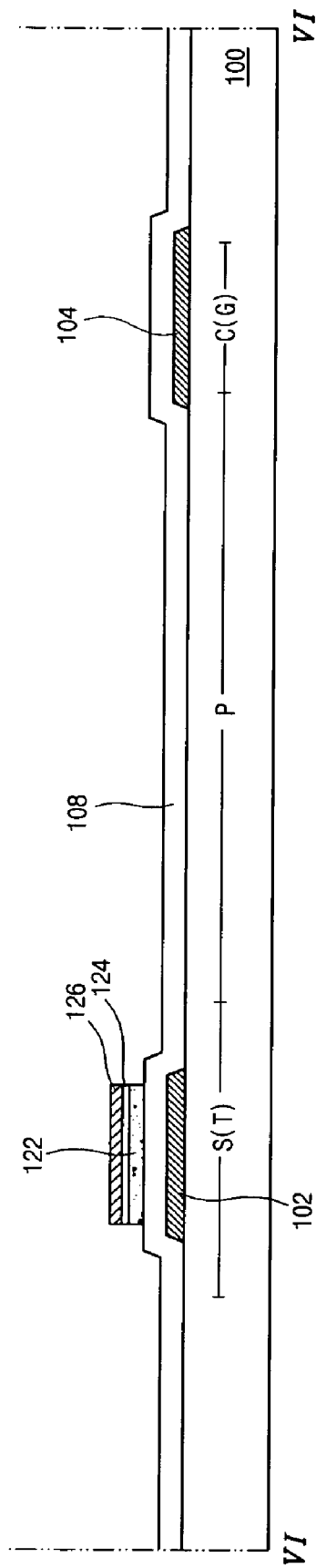
Figure 10E:
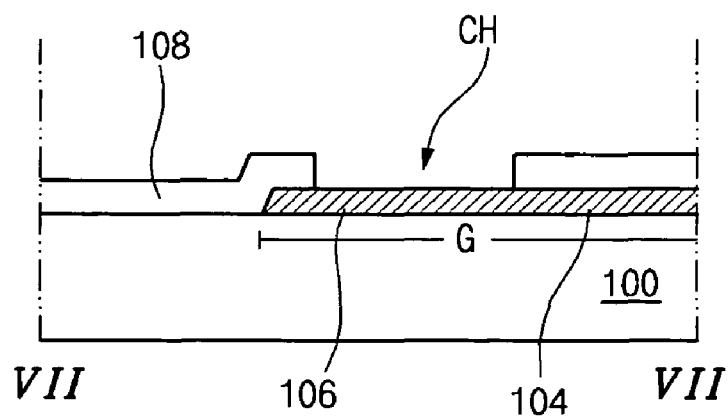
Figure 11E:
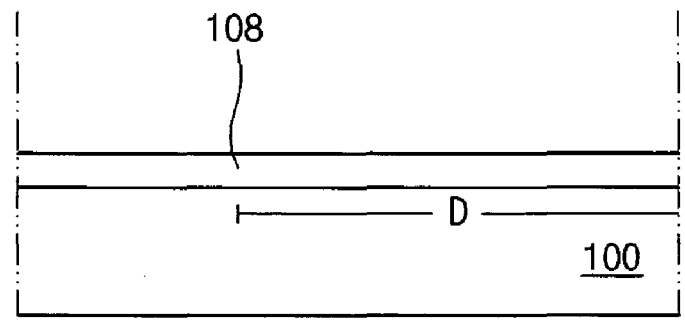

In FIG. 9E, FIG. 10E and FIG. 11E, an active layer 122, an ohmic contact layer 124, and a buffer metallic layer 126 are formed in the switching region S. The first insulating layer 108 is disposed in the other regions except the gate region G for the gate pad 106. The gate pad 106 is exposed through the gate pad contact hole CH.

FIGS. 9F to 9J, FIGS. 10F to 10J, and FIGS. 11F to 11J show the array substrate during a third mask process.

Figure 9F:
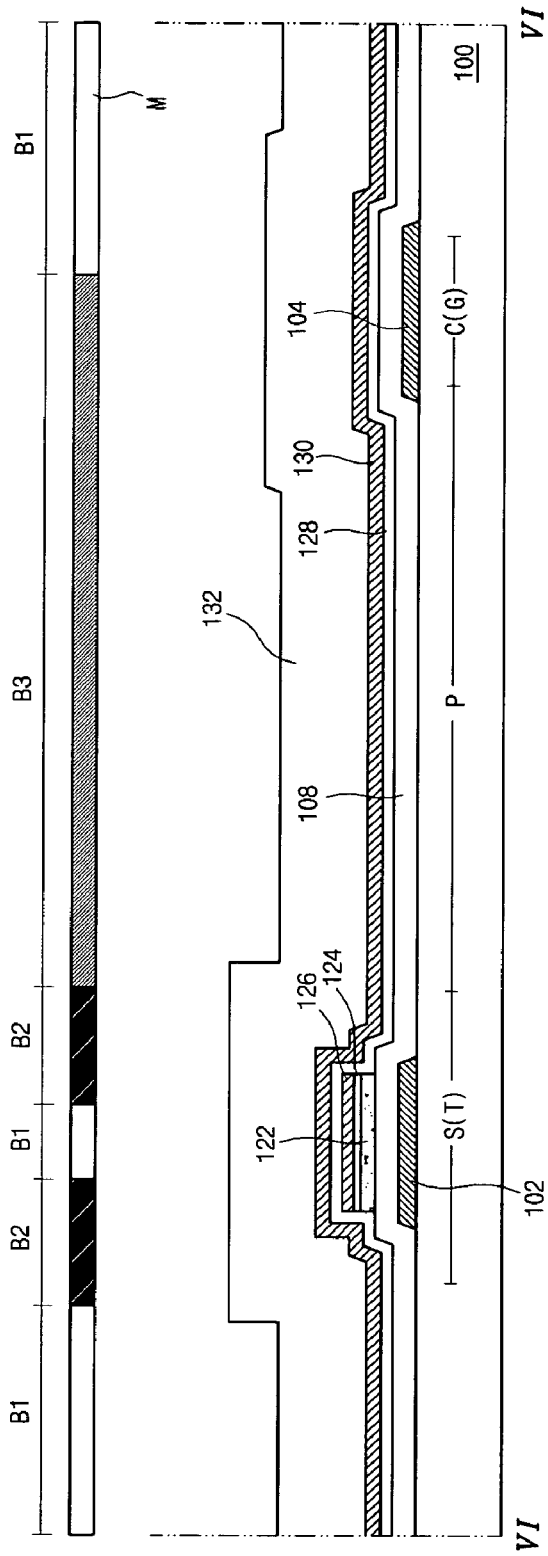
Figure 10F:
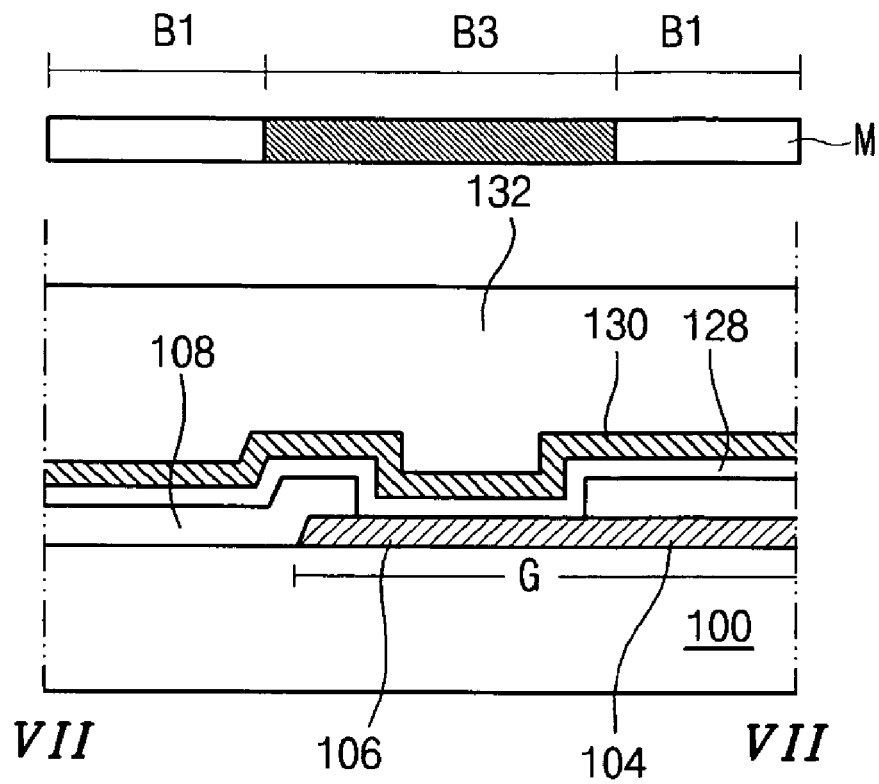
Figure 11F:
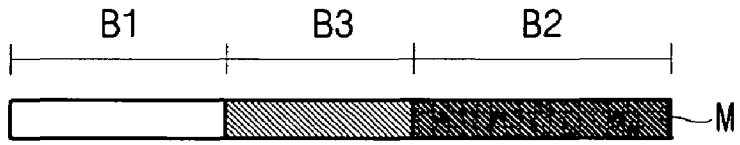
Figure 11F:
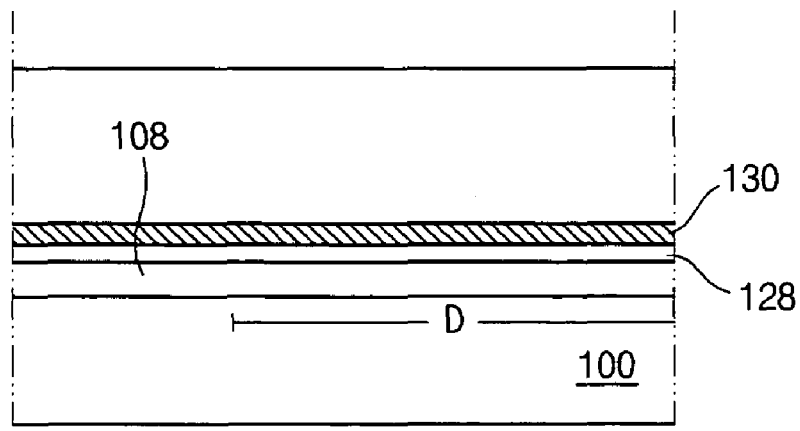

In FIG. 9F, FIG. 10F and FIG. 11F, a transparent conductive layer 128 and an opaque conductive layer 130 are sequentially formed substantially or entirely over an entire surface of the substrate 100. A photoresist layer 132 is formed over the opaque conductive layer 130 by coating the substrate 100 with positive or negative photoresist. A mask M is disposed over the photoresist layer 132. The mask M includes a light-transmitting portion B1, a light-blocking portion B2 and a light semi-transmitting portion B3.

The light-blocking portion B2 corresponds to both sides of the switching region S and the data region D except one end thereof. The light semi-transmitting portion B3 corresponds to the pixel region P, the gate pad 106, and the one end of the data region D. The light-transmitting portion B1 corresponds to the center of the switching region C between the both sides of the switching region S.

The photoresist layer 132 is exposed to light through the mask M and then developed.

Figure 9G:
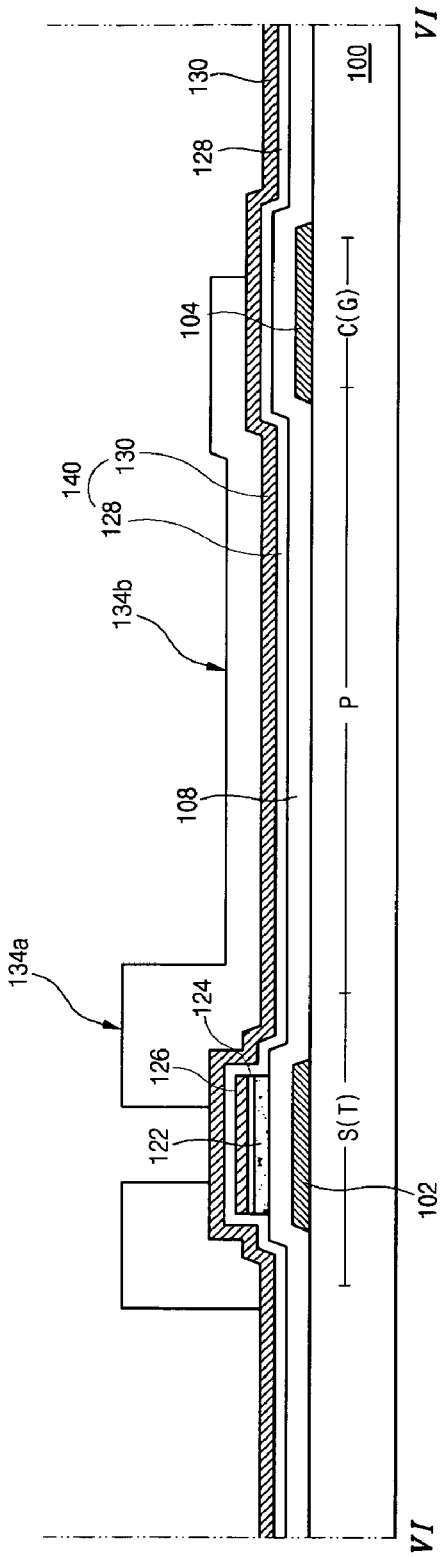
Figure 10G:
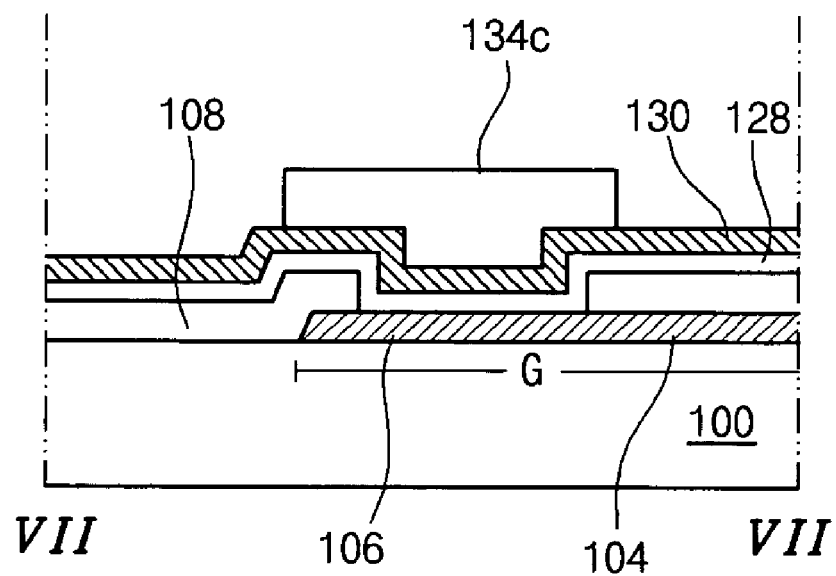
Figure 11G:
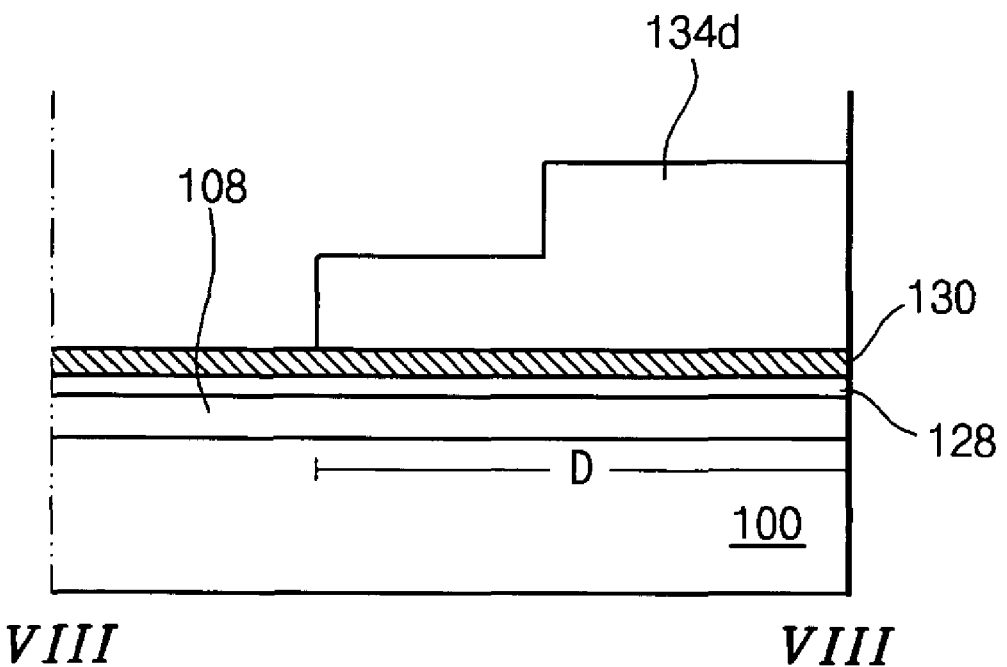

In FIG. 9G, FIG. 10G, and FIG. 11G, first, second, third, and fourth photoresist patterns 134a, 134b, 134c, and 134d are formed. The first photoresist pattern 134a is disposed in the switching region S. The first photoresist pattern 134a has a first thickness corresponding to the original thickness of the photoresist layer 132 of FIG. 9F and includes two parts spaced apart from each other. The second photoresist pattern 134b is disposed in the pixel region P, and the third photoresist pattern 134c is disposed in the gate region G for the gate pad 106. The second and third photoresist patterns 134b and 134c have a second thickness, which is thinner than the first thickness of the first photoresist pattern 134. The fourth photoresist pattern 134d is disposed in the data region D and has the first thickness. The fourth photoresist pattern 134d further includes a part of the second thickness corresponding to the one end of the data region D.

The opaque conductive layer 130 and the transparent conductive layer 128 are removed by using the first, second, third, and fourth photoresist patterns 134a, 134b, 134c, and 134d as an etching mask.

Figure 10H:
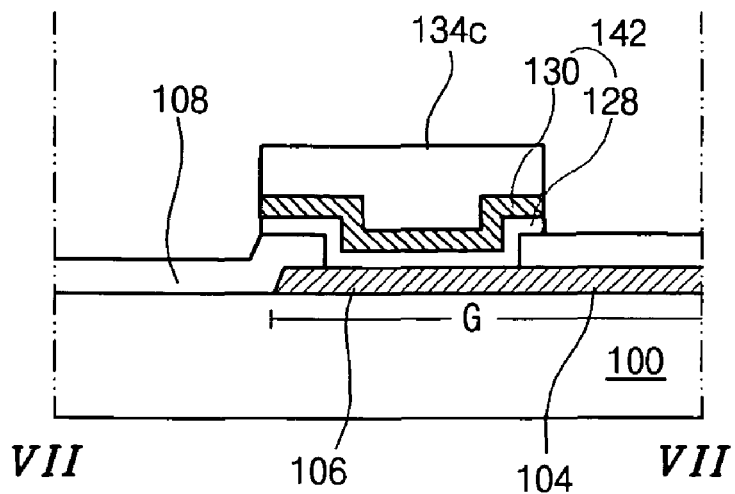
Figure 11H:
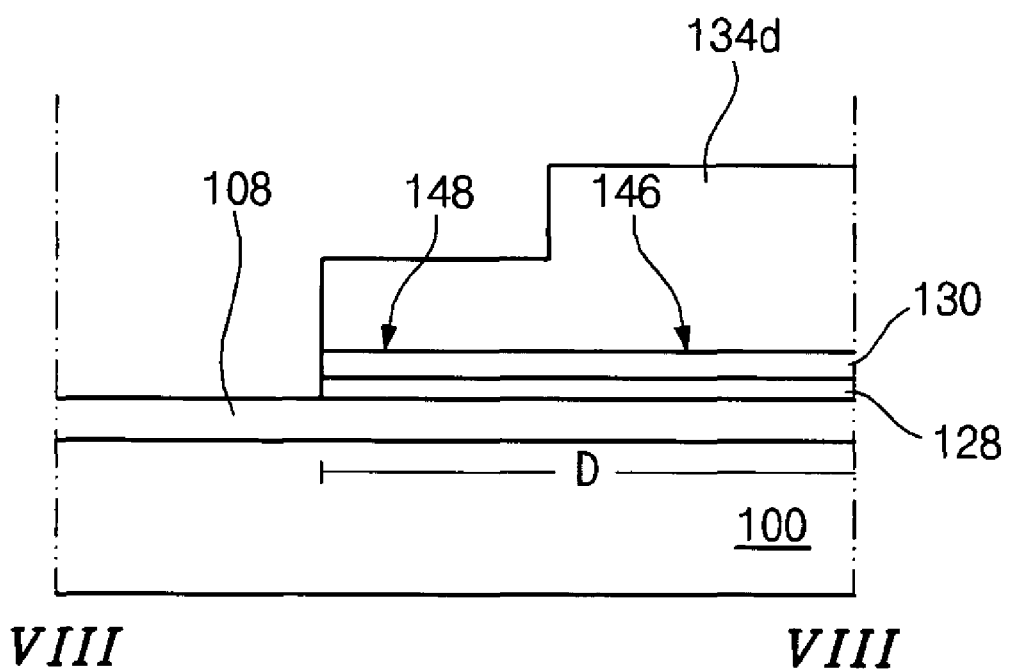

In FIG. 9H, FIG. 10H and FIG. 11H, a source electrode 136, a drain electrode 138, a pixel electrode 140, a gate pad electrode 142, a data pad 148, and a data line 146 are formed. The source electrode 136 and the drain electrode 138 are formed under the first photoresist pattern 134a in the switching region S. The pixel electrode 140 is formed under the second photoresist pattern 134b in the pixel region P. The pixel electrode 140 extends from the drain electrode 138. The gate pad electrode 142 is formed under the third photoresist pattern 134c and contacts the gate pad 106. The data pad 148 and the data line 146 are formed under the fourth photoresist pattern 134d. The data pad 148 is disposed at one end of the data line 146.

Each of the source and drain electrodes 136 and 138, the pixel electrode 140, the gate pad electrode 142, the data pad 148 and the data line 146 includes the sequentially deposited transparent conductive layer 128 and the opaque conductive layer 130.

The buffer metallic layer 126 is exposed between the source and drain electrodes 136 and 138. The exposed buffer metallic layer 126 and the ohmic contact layer 124 are removed between the source and drain electrodes 136 and 138. In the switching region S, the active layer 122 is exposed between the source and drain electrodes 136 and 138.

Next, ashing is performed, thereby removing the second photoresist pattern 134b, the third photoresist pattern 134c, and the part of the second thickness of the fourth photoresist pattern 134d. What remains is the first photoresist pattern 134a and the fourth photoresist pattern 134d.

Figure 10I:
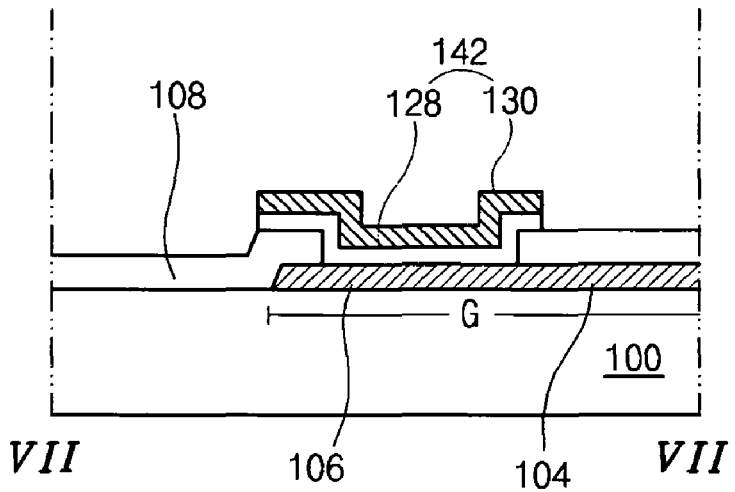
Figure 11I:
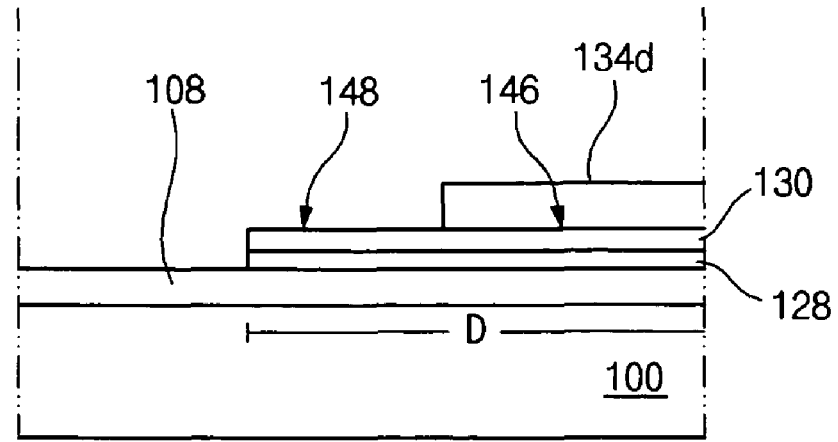

In FIG. 9I, FIG. 10I and FIG. 11I, the pixel electrode 140, the gate pad electrode 142, and the data pad 148 are exposed.

The opaque conductive layers 130 of the pixel electrode 140, the gate pad electrode 142, and the data pad 148 are removed, and thus the transparent conductive layers 128 remain.

Next, the first photoresist pattern 134a and the fourth photoresist pattern 134d are stripped.

Figure 10J:
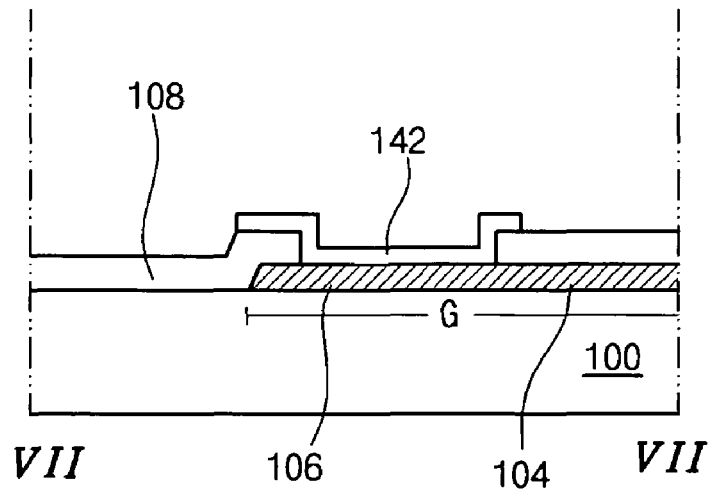
Figure 11J:
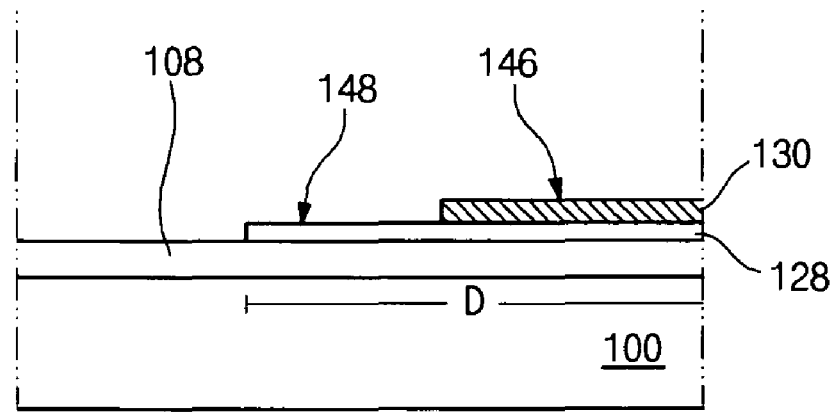

In FIG. 9J, FIG. 10J and FIG. 11J, the source and drain electrodes 136 and 138 of the transparent conductive layer 128 and the opaque conductive layer 130 are disposed in the switching region S, the pixel electrode 140 of the transparent conductive layer is disposed in the pixel region P, the gate pad electrode 142 of the transparent conductive layer is disposed in the gate region G, and the data line 146 of the transparent conductive layer 128 and the opaque conductive layer 130 and the data pad 148 of the transparent conductive layer are disposed in the data region D.

Here, the opaque conductive layers 130 of the data line 146, the source and drain electrodes 136 and 138 are partially removed at edges thereof.

Figure 10K:
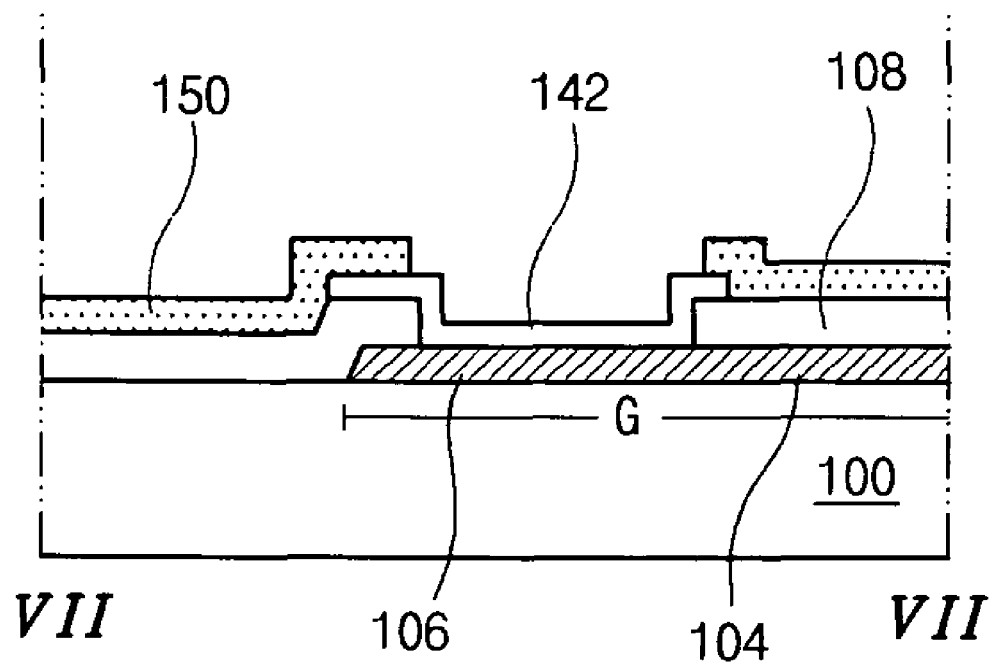
Figure 11K:
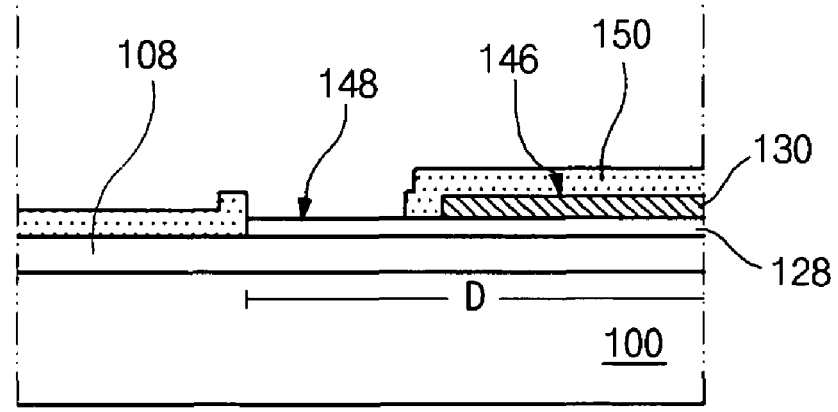

In FIG. 9K, FIG. 10K and FIG. 11K, a second insulating layer 150 is formed substantially or entirely over an entire surface of the substrate 100 by depositing one or more inorganic insulating materials such as silicon nitride ($SiN_x$) or silicon oxide ($SiO_2$). The second insulating layer 150 is patterned using a fourth mask process, and the pixel electrode 140, the gate pad electrode 142, and the data pad 148 are exposed.

In this fashion, the array substrate for an LCD device may be manufactured using 4 mask processes. That is, the gate electrode, the gate line and the gate pad are formed using the first mask process. The first insulating layer, the active layer, the ohmic contact layer, and the buffer metallic layer are formed using the second mask process, and the gate pad is exposed via the first insulating layer at this time. The source and drain electrodes, the pixel electrode, the gate pad electrode, the data line, and the data pad are formed using the third mask process. The second insulating layer is formed, and the pixel electrode, the gate pad electrode and the data pad are exposed via the second insulating layer using the fourth mask process.

Meanwhile, an array substrate for an in-plane switching (IPS) mode LCD device, which includes a pixel electrode and a common electrode on the same substrate, may be manufactured using the 4 mask processes according to the invention.

Figure 12:
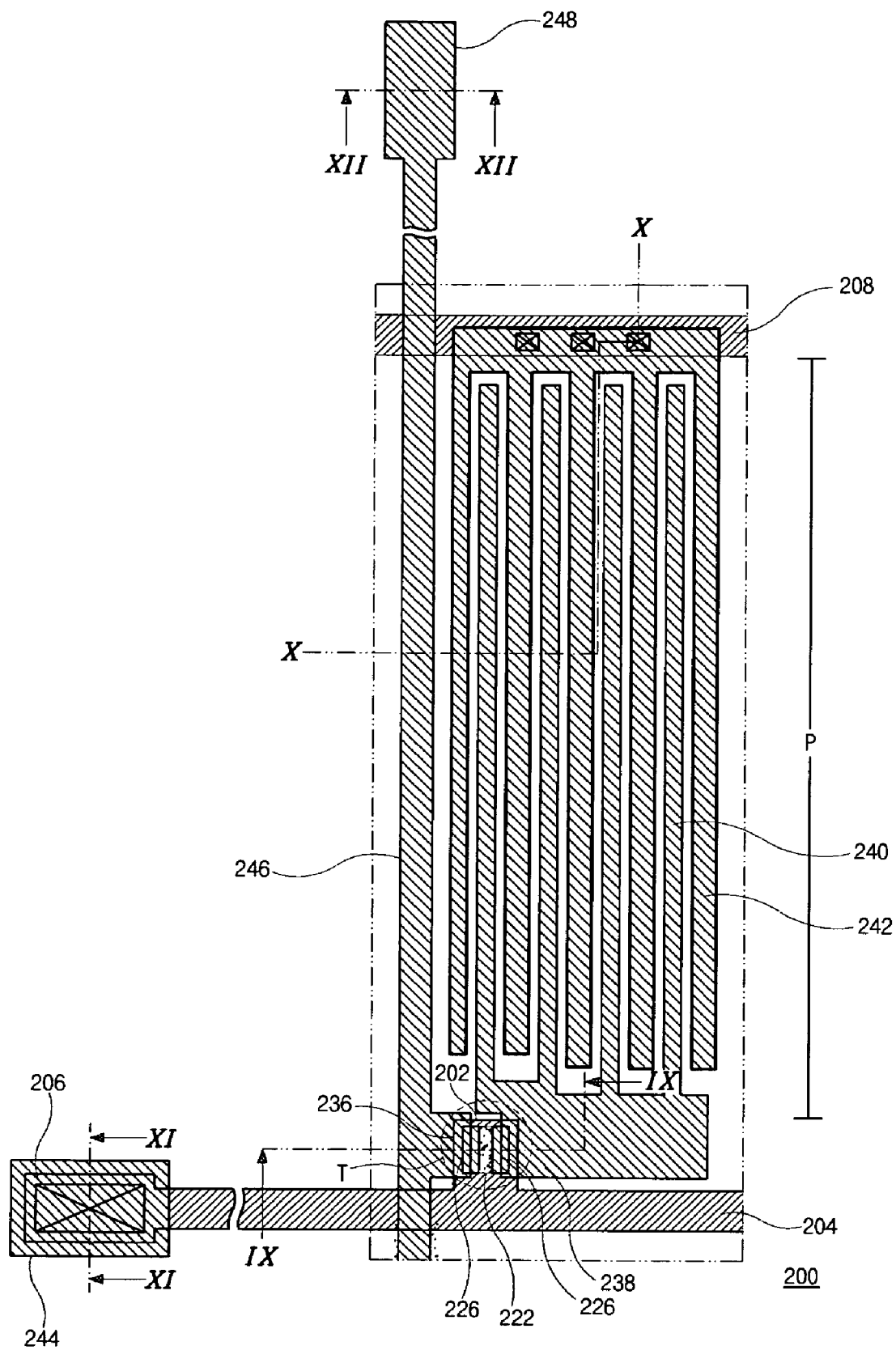
FIG. 12 shows a plan view of an array substrate for an IPS mode LCD device according to a second embodiment of the invention.
Figure 13C:
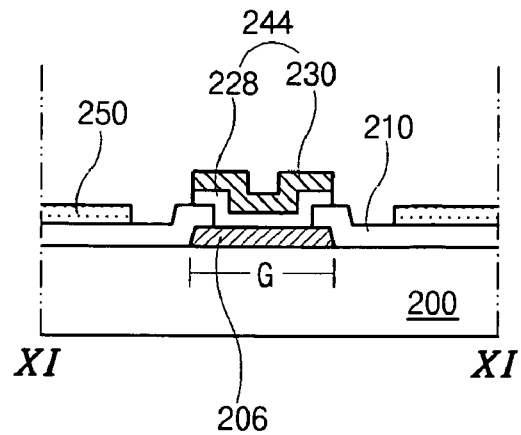
Figure 13D:
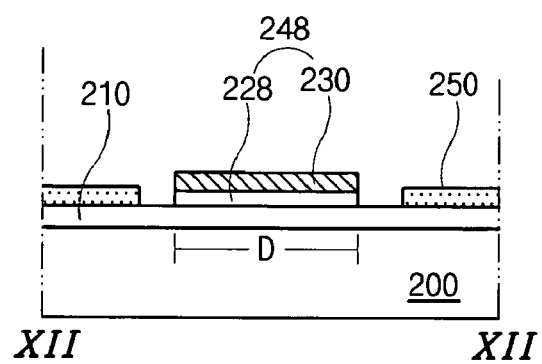

FIG. 12 shows a plan view of an array substrate for an IPS mode LCD device according to a second preferred embodiment of the invention. In FIG. 12, a gate line 204 is formed over an insulating substrate 200 along a first direction, and a data line 246 is formed along a second direction. The gate line 204 and the data line 246 cross each other to define a pixel region P. A common line 208 is formed along the first direction. A gate pad 206 is formed at one end of the gate line 204, and a data pad 248 is formed at one end of the data line 246. A gate pad electrode 244 is formed over the gate pad 206. The gate pad electrode 244 includes a transparent conductive layer and an opaque conductive layer.

A thin film transistor T is formed at a crossing point of the gate line 204 and the data line 246. The thin film transistor T includes a gate electrode 202, an active layer 222, an ohmic contact layer (not shown), a buffer metallic layer 226, a source electrode 236 and a drain electrode 238. The buffer metallic layer 226 contacts the ohmic contact layer and the source and drain electrodes 236 and 238.

Pixel electrodes 240 and common electrodes 242 are formed in the pixel region P along the second direction and are parallel to the data line 246. The pixel electrodes 240 and the common electrodes 242 alternate with each other. The pixel electrodes 240 are connected to the drain electrode 238. The common electrodes 242 are connected to the common line 208.

The array substrate of FIG. 12 is manufactured using 4 mask processes. Here, the active layer 222 is formed over and within the gate electrode 202, and there is no semiconductor layer under the data line 246. Thus, there is no light incident on the active layer 222 from a backlight under the array substrate.

FIGS. 13A, 13B, 13C and 13D are cross-sectional views of an array substrate according to the second preferred embodiment of the invention. FIGS. 13A, 13B, 13C and 13D correspond to the line IX-IX, the line X-X, the line XI-XI and the line XII-XII of FIG. 12.

In FIGS. 13A, 13B, 13C and 13D, a pixel region P, a gate region G, a data region D, a switching region S, and a common signal region CS are defined over a substrate 200. A thin film transistor is formed in the switching region S on the substrate 200. The thin film transistor includes a gate electrode 202, a first insulating layer 210, an active layer 222, an ohmic contact layer 224, a buffer metallic layer 226, and source and drain electrodes 236 and 238 that are sequentially formed. Each of the source and drain electrodes 236 and 238 includes a transparent conductive layer 228 and an opaque conductive layer 230. The buffer metallic layer 226 decreases contact resistance between the ohmic contact layer 224 and the transparent conductive layer 228.

A data line 246 is formed along a side of the pixel region P. The data line 246 is disposed in the data region D and is connected to the source electrode 236. The data line 246 includes a transparent conductive layer 228 and an opaque conductive layer 230. A data pad 248 is formed at one end of the data line 246 in the data region D. The data pad 248 includes a transparent conductive layer 228 and an opaque conductive layer 230.

A gate line (not shown) is formed along another side of the pixel region P and crosses the data line 246. The gate line 204 is formed in the same layer as and connected to the gate electrode 202. A gate pad 206 is formed at one end of the gate line in the gate region G. A gate pad electrode 244 is formed over the gate pad 206. The gate pad electrode 244 includes a transparent conductive layer 228 and an opaque conductive layer 230.

A common line 208 is formed in the common signal region CS. Although not shown in the figure, the common line 208 is parallel to the gate line. The first insulating layer 210 covers the gate electrode 202, the gate line (not shown), the gate pad 206, and the common line 208.

Pixel electrodes 240 and common electrodes 242 are formed in the pixel region P over the first insulating layer 210. The pixel electrodes 240 contact the drain electrode 238, and the common electrodes 242 contact the common line 208. The pixel electrodes 240 and the common electrodes 242 alternate with each other. Each of the pixel electrodes 240 and the common electrodes 242 includes a transparent conductive layer 228 and an opaque conductive layer 230. A second insulating layer 250 covers the thin film transistor, the data line 246, the pixel electrodes 240, and the common electrodes 242 and exposes the gate pad electrode 244 and the data pad 248.

Here, the active layer 222 and the ohmic contact layer 224 are formed over and within the gate electrode 202, and there are no intrinsic amorphous silicon layer and impurity-doped amorphous silicon layer under the data line 246. Therefore, the wavy noise fails to occur, and the aperture ratio does not decrease.

A method of manufacturing the array substrate for an IFS mode LCD device using 4 mask processes will be explained hereinafter with reference to attached drawings.

FIGS. 14A to 14K, FIGS. 15A to 15K, FIGS. 16A to 16K, and FIGS. 17A to 17K illustrate an array substrate in processes of manufacturing the same according to the second embodiment of the invention. FIGS. 14A to 14K are cross-sectional views along the line IX-IX of FIG. 12, FIGS. 15A to 15K are cross-sectional views along the line X-X of FIG. 12, FIGS. 16A to 16K are cross-sectional views along the line XI-XI of FIG. 12, and FIGS. 17A to 17K are cross-sectional views along the line XII-XII of FIG. 12.

FIG. 14A, FIG. 15A, FIG. 16A, and FIG. 17A show the array substrate during a first mask process. In FIG. 14A, FIG. 15A, FIG. 16A, and FIG. 17A, a switching region S, a pixel region P, a gate region G a data region D, and a common signal region CS are defined over a substrate 200.

A first conductive metallic layer (not shown) is formed over the substrate 200, where the regions S, P, G, D and CS are defined, by depositing one or more conductive materials such as aluminum (Al), aluminum-neodymium alloy (AlNd), chromium (Cr), molybdenum (Mo), tungsten (W), titanium (Ti), copper (Cu), tantalum (Ta) or alloys of these materials. However, the conductive materials are not restricted, and any suitable conductive material may be used. The first conductive metallic layer is patterned using a first mask process, and a gate electrode 202, a gate line (not shown), a gate pad 206 and a common line 208 are formed over the substrate 200. The gate electrode 202 is disposed in the switching region S, and the gate line and the gate pad 206 are disposed in the gate region G The gate pad 206 is formed at one end of the gate line. The common line 208 is disposed in the common signal region CS and is parallel to the gate line.

FIGS. 14B to 14F, FIGS. 15B to 15F, FIGS. 16B to 16F and FIGS. 17B to 17F show the array substrate in a second mask process.

In FIG. 14B, FIG. 15B, and FIG. 16B and FIG. 17B, a first insulating layer 210, an intrinsic amorphous silicon layer (a-Si:H) 212, an impurity-doped amorphous silicon layer (for example, n+ a-Si:H) 214, and a second conductive metallic layer 216 are sequentially formed substantially or entirely over an entire surface of the substrate 200 including the gate electrode 202, the gate line, the gate pad 206 and the common line 208. A photoresist layer 218 is formed over the second conductive metallic layer 216 by coating the substrate 200 with positive or negative photoresist.

The first insulating layer 210 may be formed by depositing one or more inorganic insulating materials such as silicon nitride ($SiN_x$) or silicon oxide ($SiO_2$). The second conductive metallic layer 216 may be formed of one of the above-mentioned conductive materials. The second conductive metallic layer 216, may be preferably formed of a metallic material that can be dry-etched, for example, molybdenum (Mo).

A mask M is disposed over the photoresist layer 218. The mask M includes a light-transmitting portion B1, a light-blocking portion B2, and a light semi-transmitting portion B3. The light-blocking portion B2 corresponds to the switching region S, the light-transmitting portion B1 corresponds to the common signal region CS and the gate pad 206, and the light semi-transmitting portion B3 corresponds to other regions. The light semi-transmitting portion B3 may not correspond to the gate pad 206 or the gate electrode 202. The size of the light-blocking portion B2 corresponding to the switching region S is not larger than the gate electrode 202.

Next, the photoresist layer 218 is exposed to light through the mask M and then is developed.

In FIG. 14C, FIG. 15C, FIG. 16C and FIG. 17C, a photoresist pattern 220 is formed after developing the photoresist layer 218 of FIG. 14B, FIG. 15B, FIG. 16B and FIG. 17B. The photoresist pattern 220 has a first part of a first thickness in the switching region S and a second part of a second thickness in other regions except the switching region S, the gate region G for the gate pad 206, and the common signal region CS. The photoresist pattern 220 is removed in the gate region G for the gate pad 206 and the common signal region CS to expose the second conductive metallic layer 216. That is, the photoresist pattern is developed to expose the conductive metallic layer 216 corresponding to the gate pad 206 and including a first part corresponding to the gate electrode 202 and a second part corresponding to other areas except the gate pad 206 and the gate electrode 202, the first part being thicker than the second part. The first thickness is substantially the same as the original thickness of the photoresist layer FIG. 14B, FIG. 15B, FIG. 16B and FIG. 17B. The second thickness is thinner than the first thickness.

The exposed second metallic layer 216, the impurity-doped amorphous silicon layer 214, the intrinsic amorphous silicon layer 212 and the first insulating layer 210 are removed in the gate region G for the gate pad 206 and in the common signal region CS.

In FIG. 14D, FIG. 15D, FIG. 16D and FIG. 17D, a common line contact hole CH1 and a gate pad contact hole CH2 are formed. The common line contact hole CH1 exposes the common line 208, and the gate pad contact hole CH2 exposes the gate pad 206.

Figure 14A:
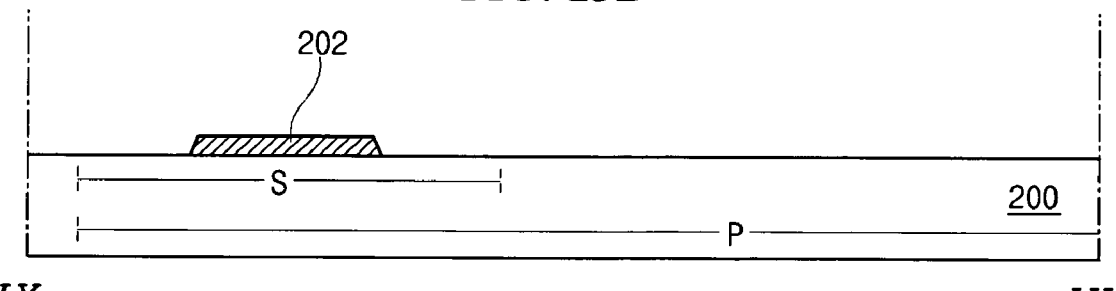
Figure 14B:
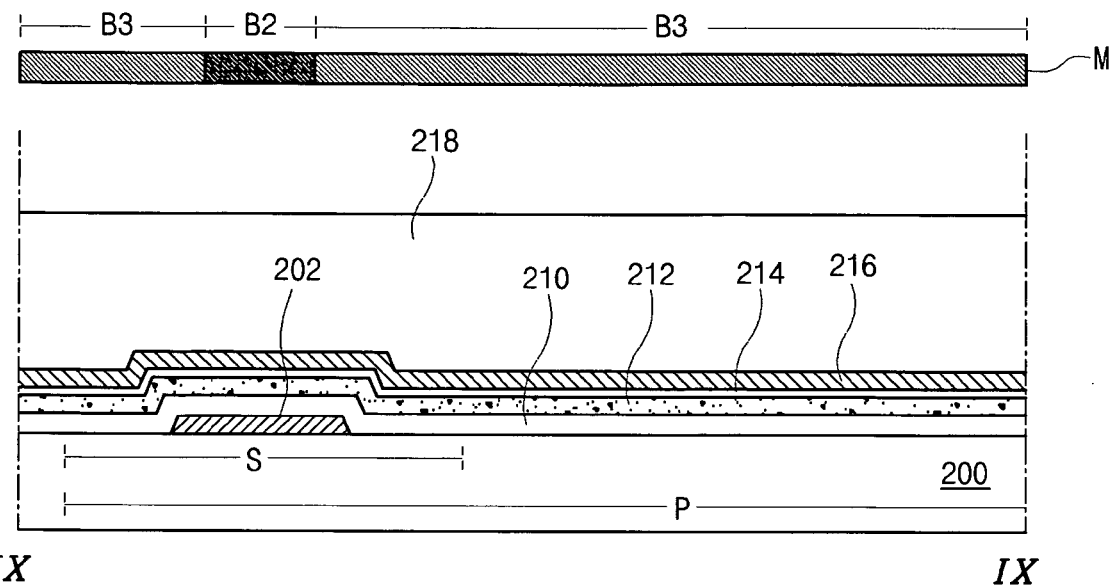
Figure 14C:
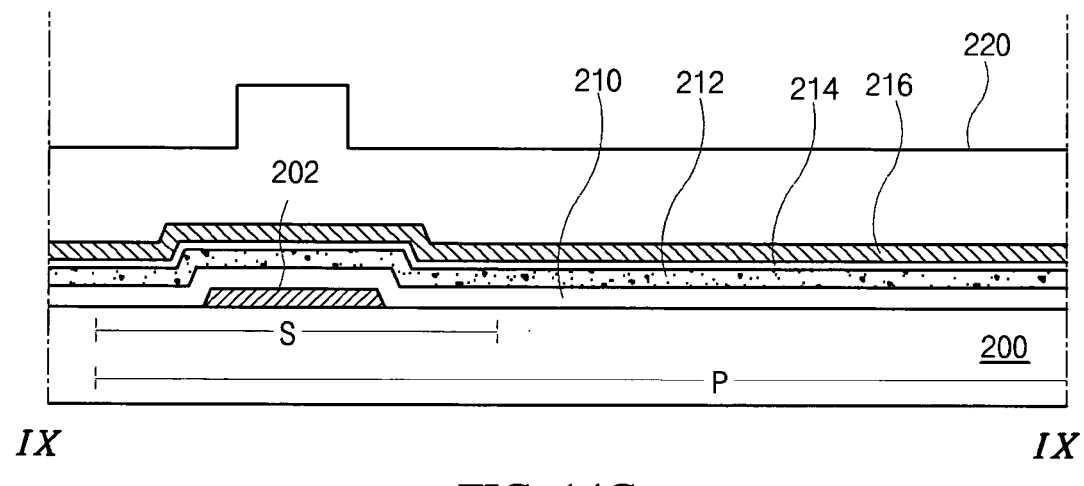
Figure 14D:
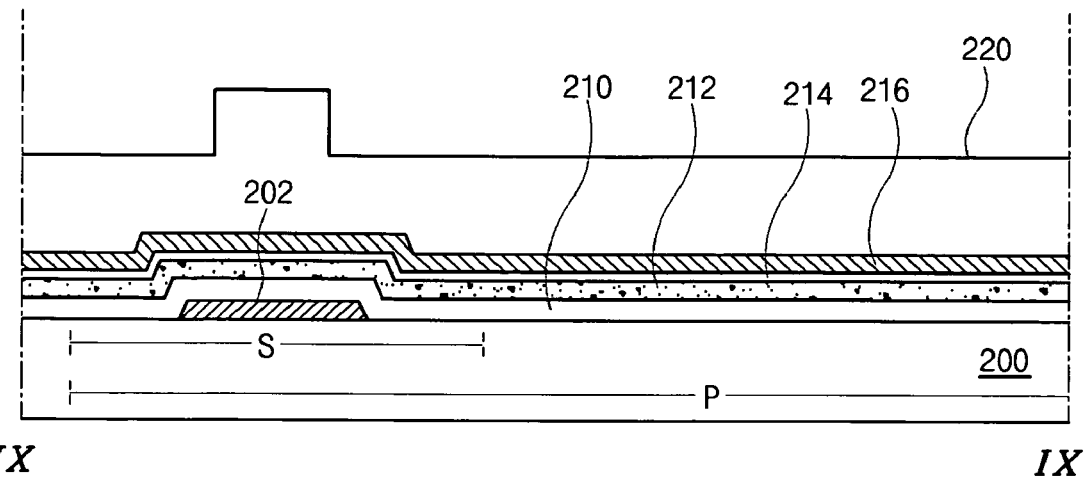
Figure 14E:
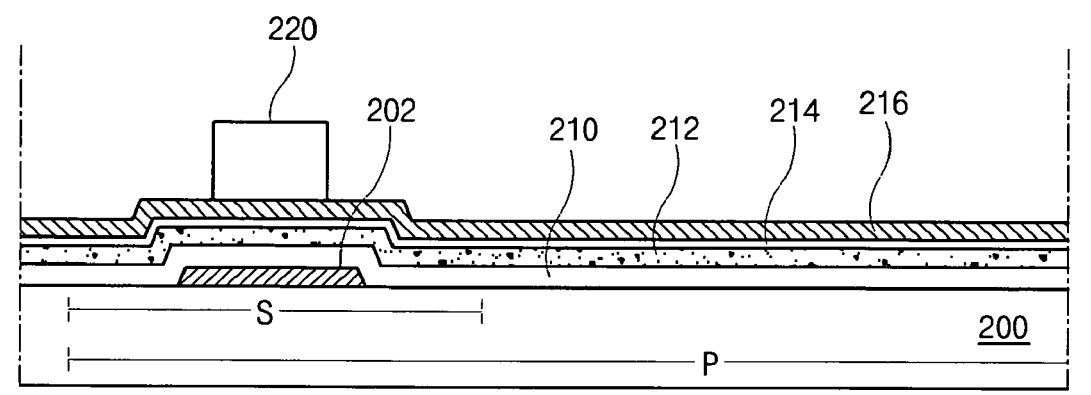
Figure 14F:
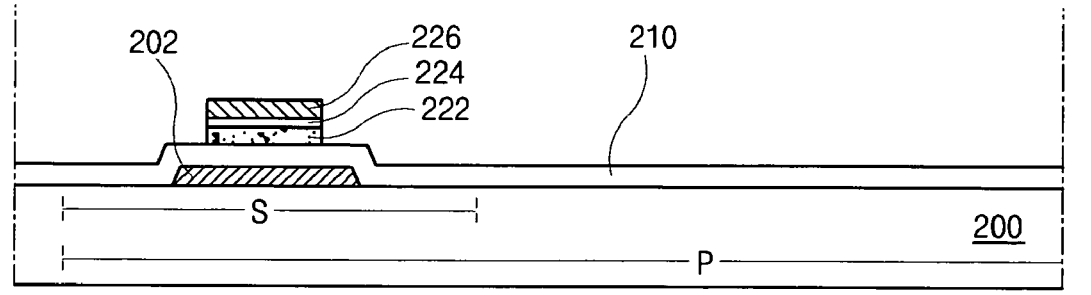
Figure 14G:
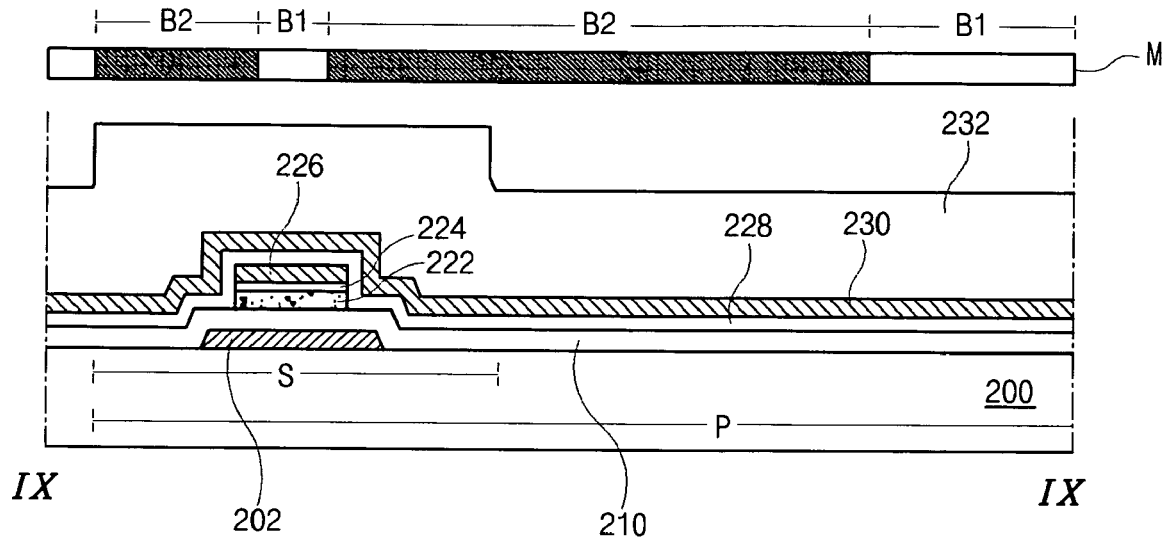
Figure 14H:
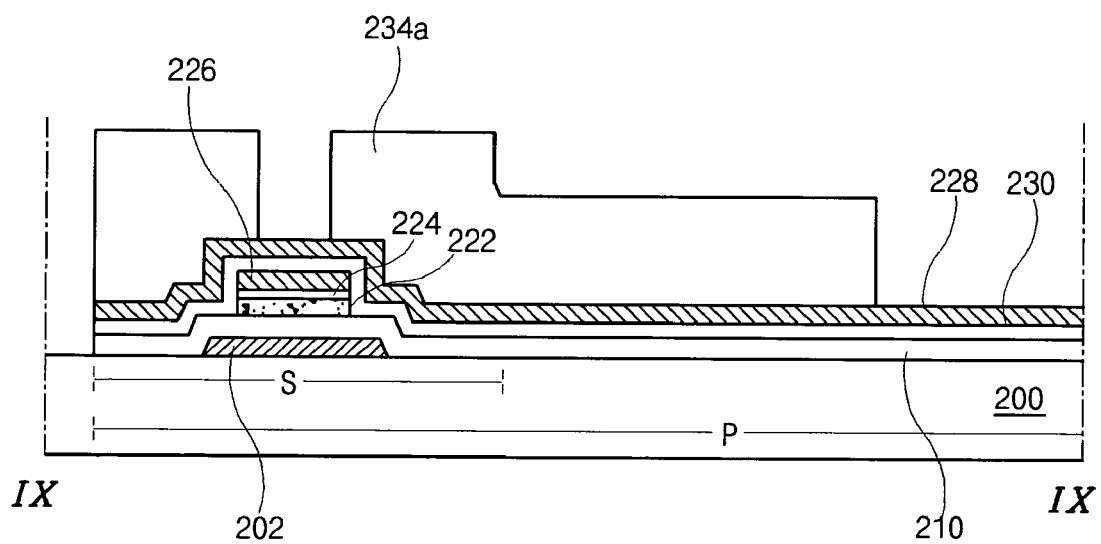
Figure 14I:
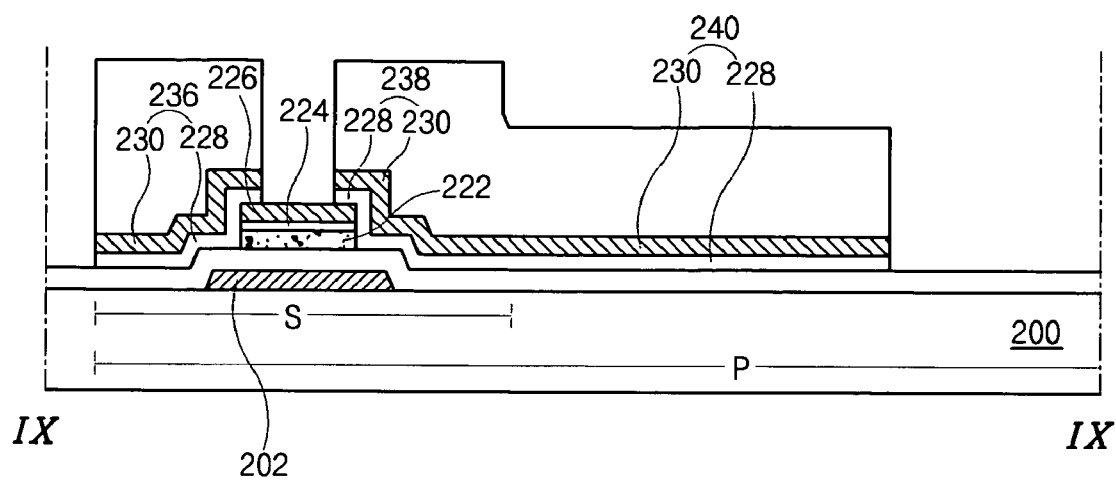
Figure 14J:
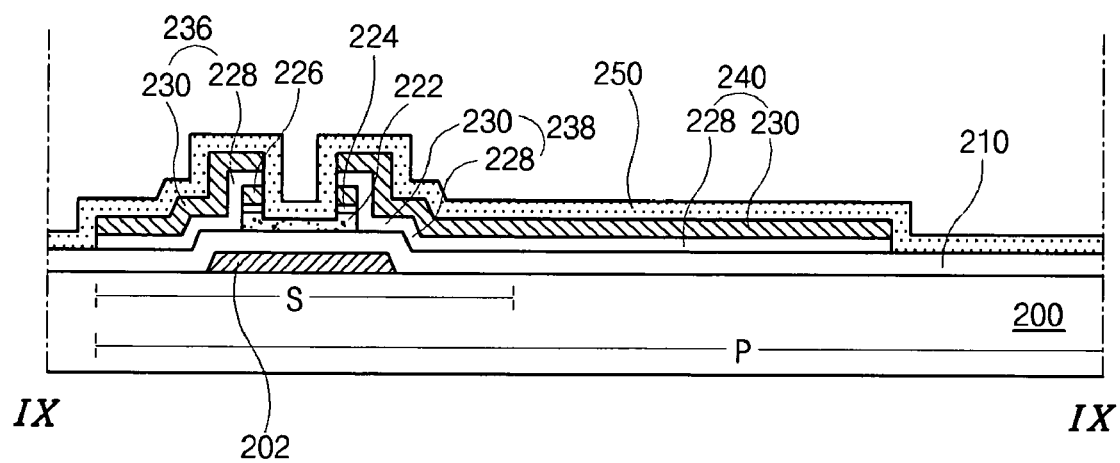
Figure 14K:
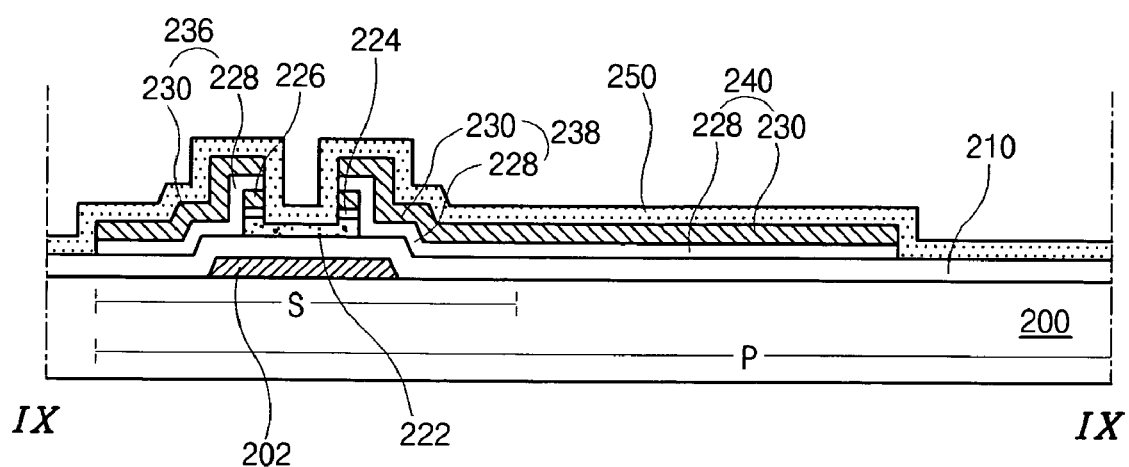
Figure 15A:
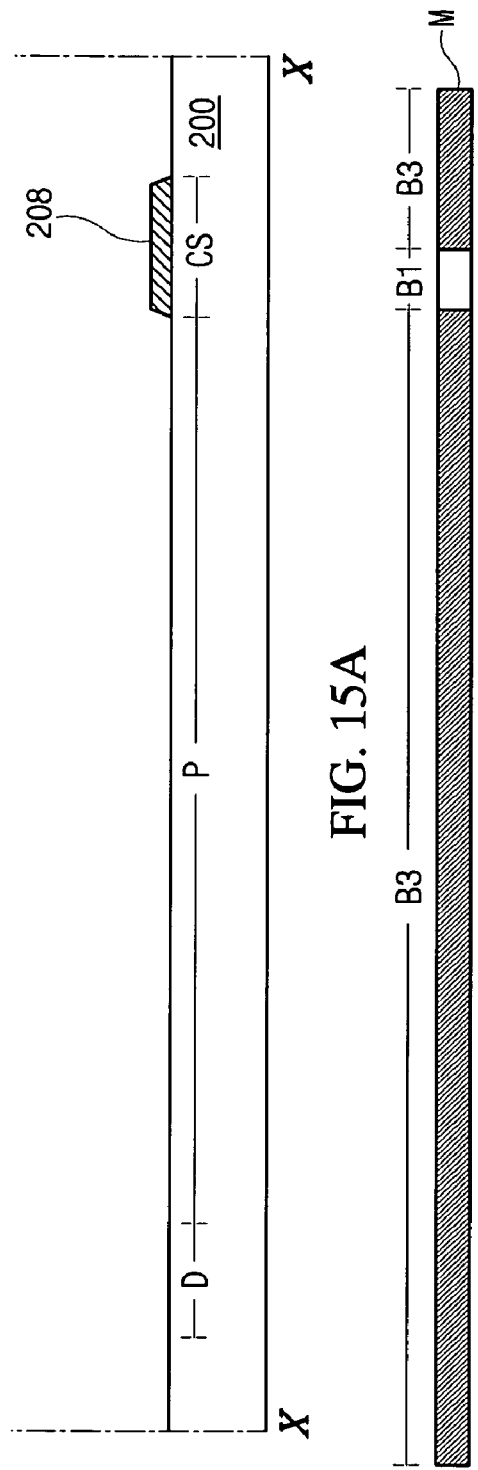
Figure 15B:
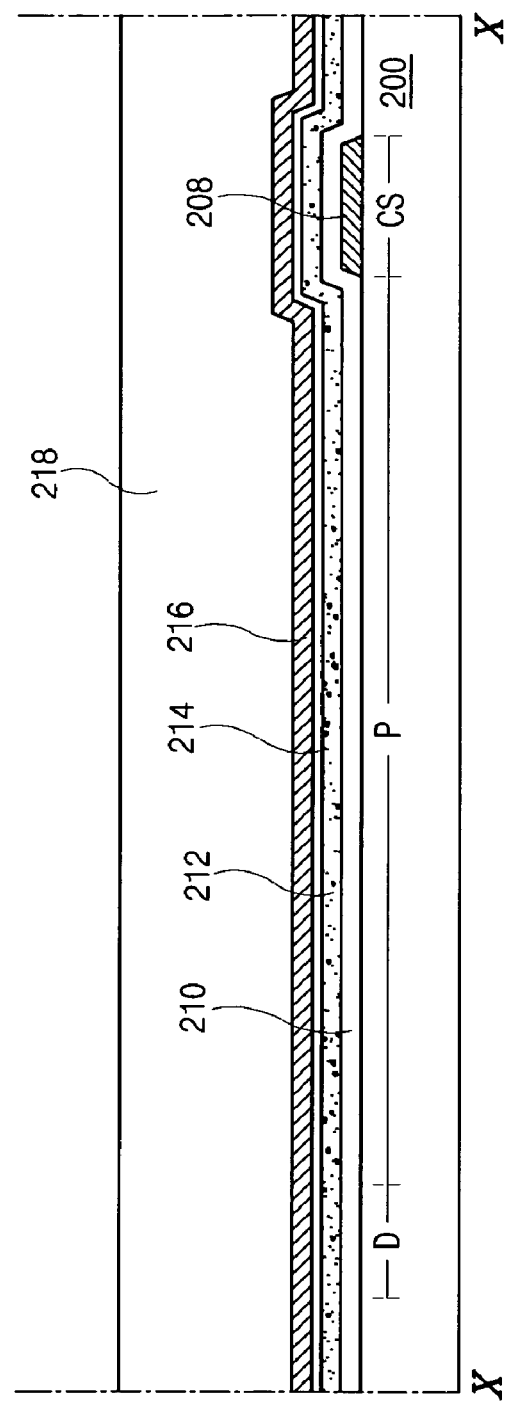
Figure 15C:
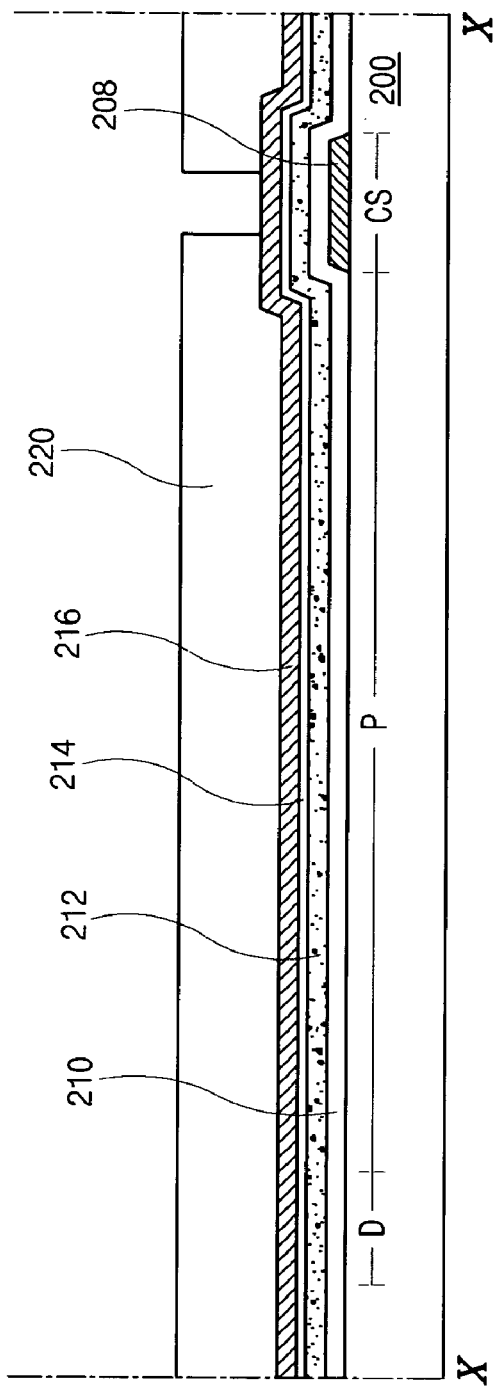
Figure 15D:
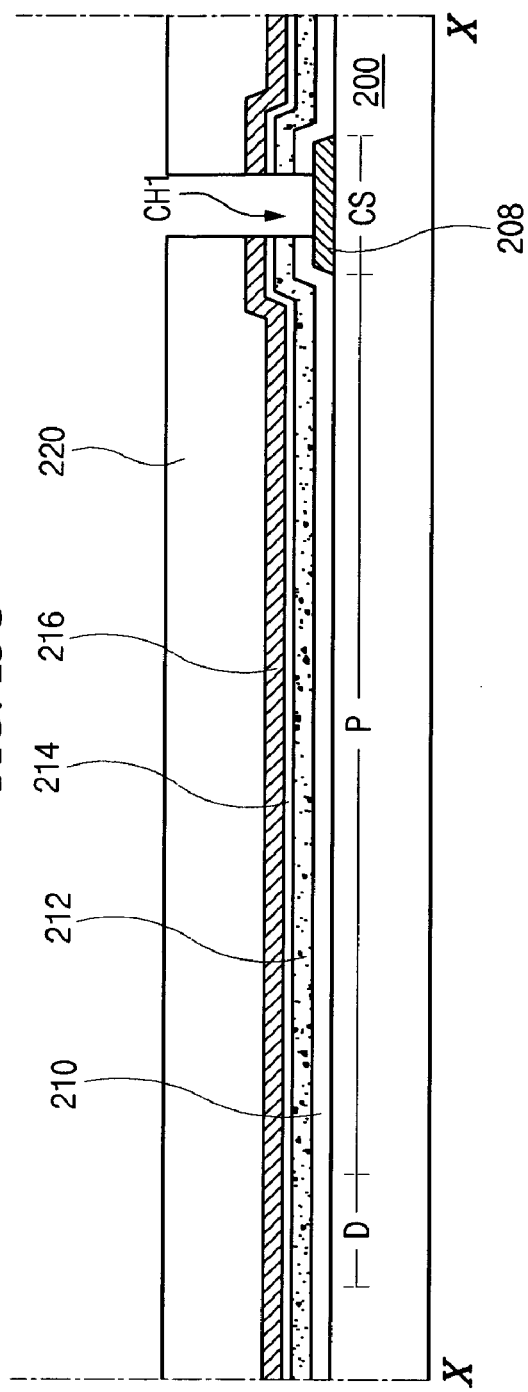
Figure 15E:
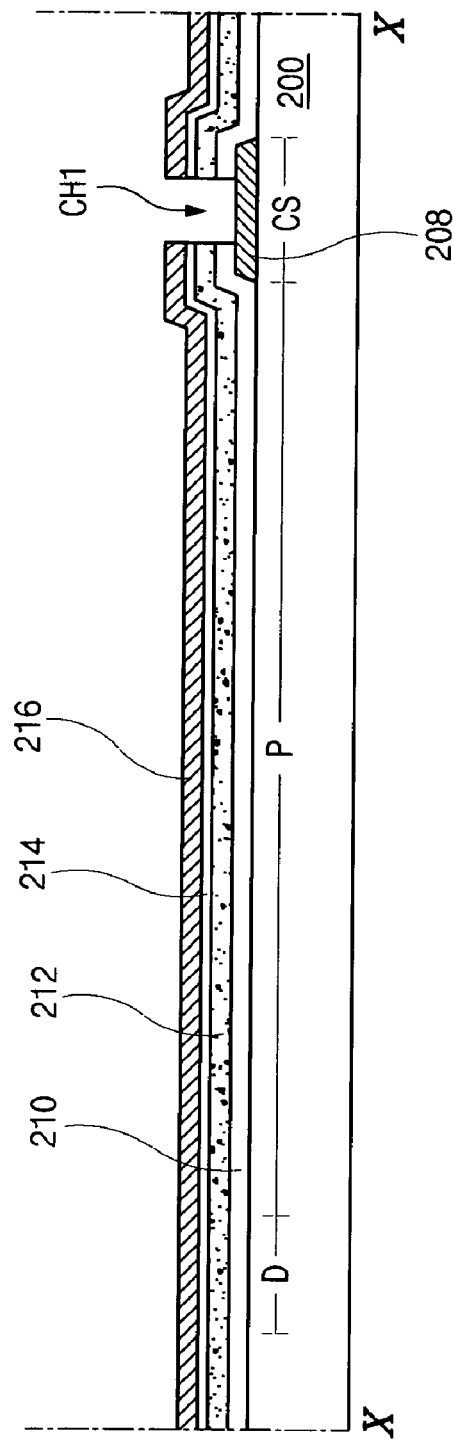
Figure 15F:
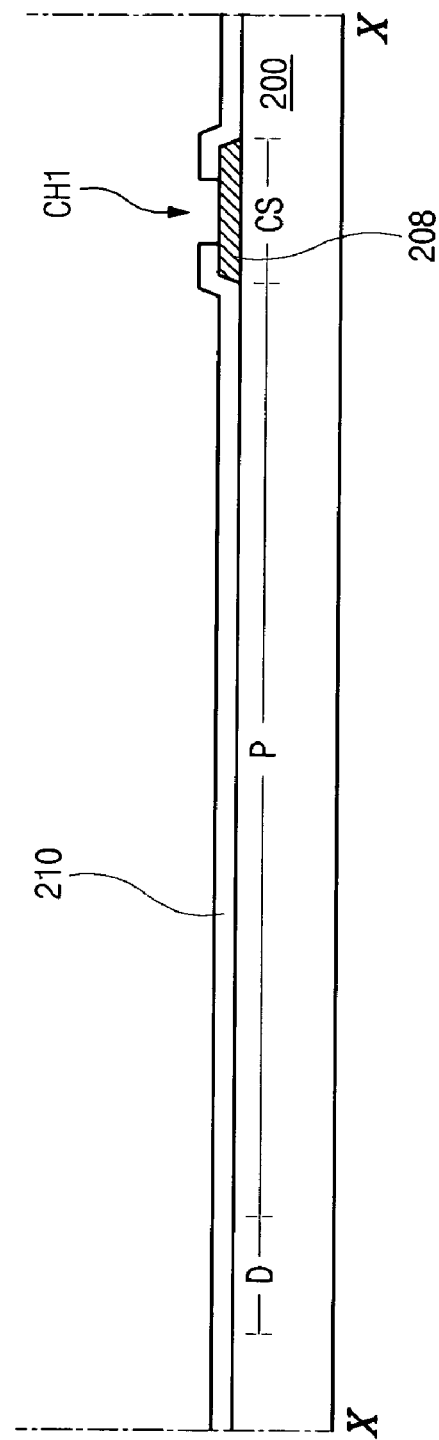
Figure 15G:
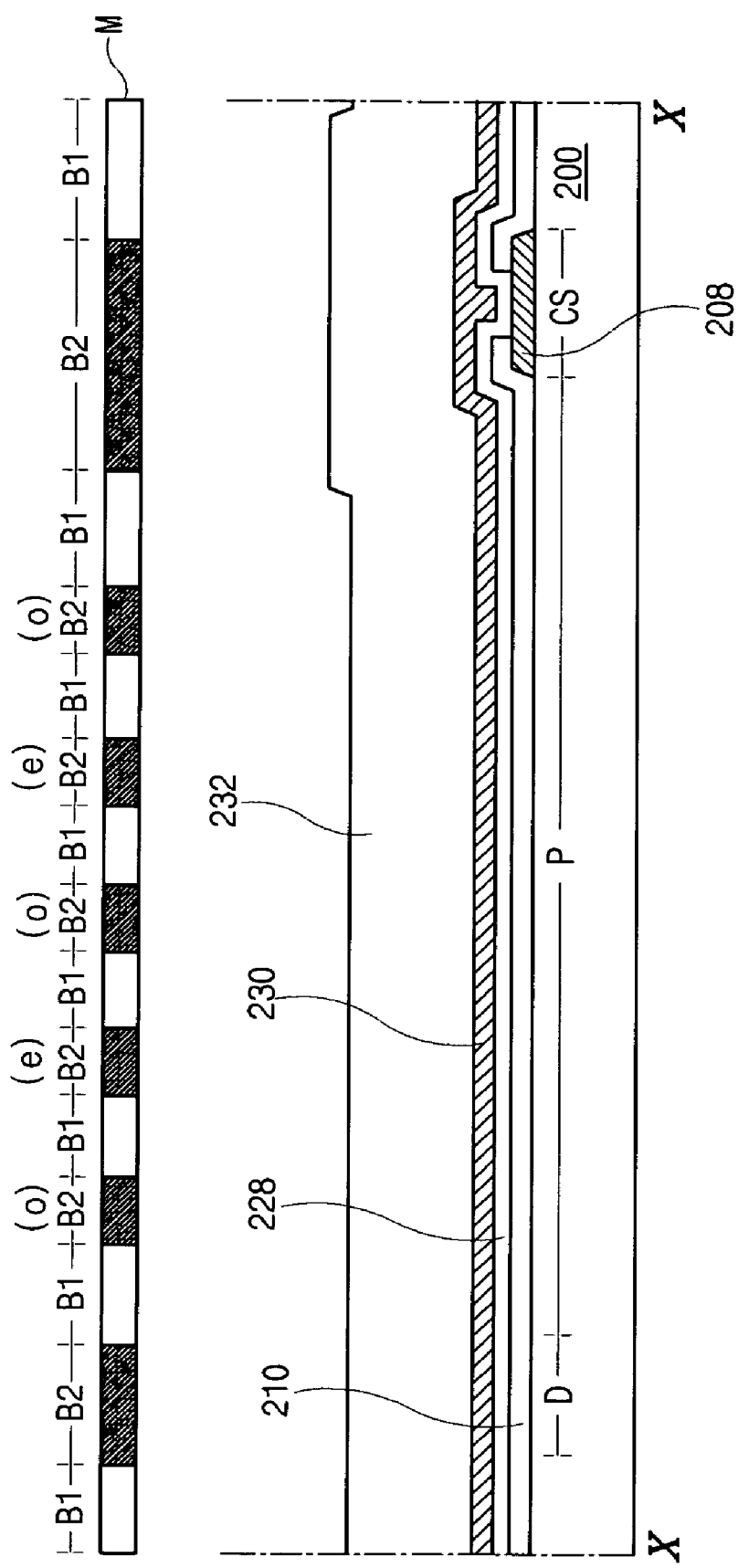
Figure 15H:
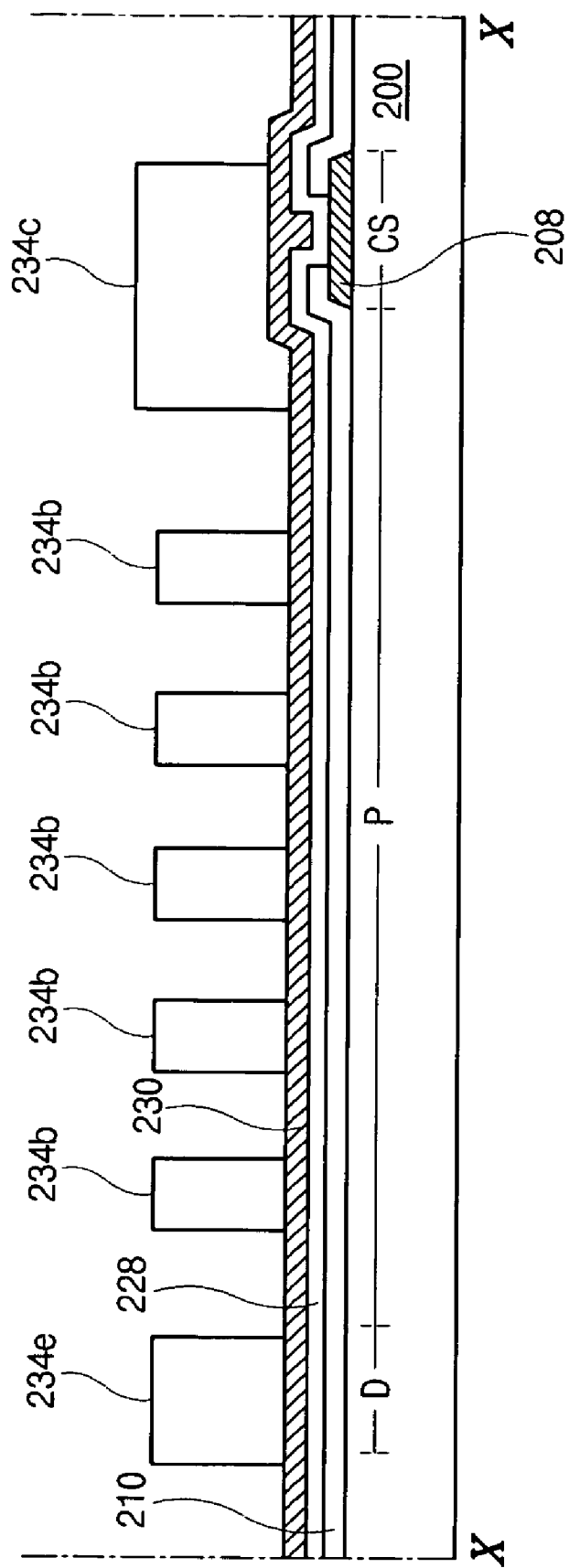
Figure 15K:
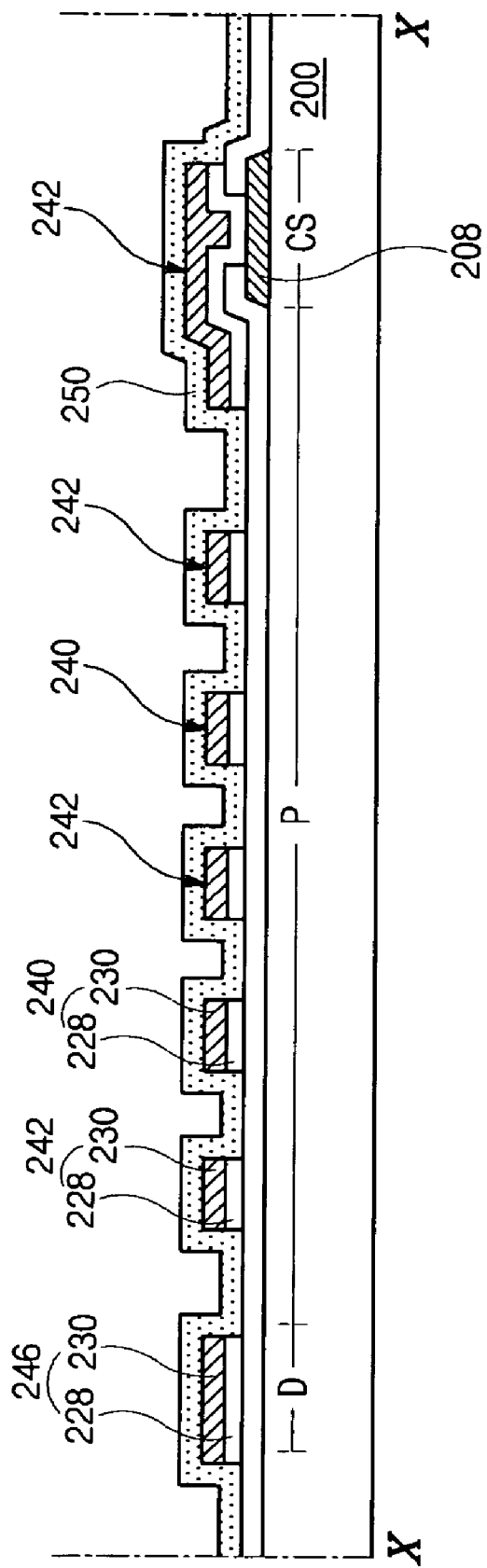
Figure 16A:
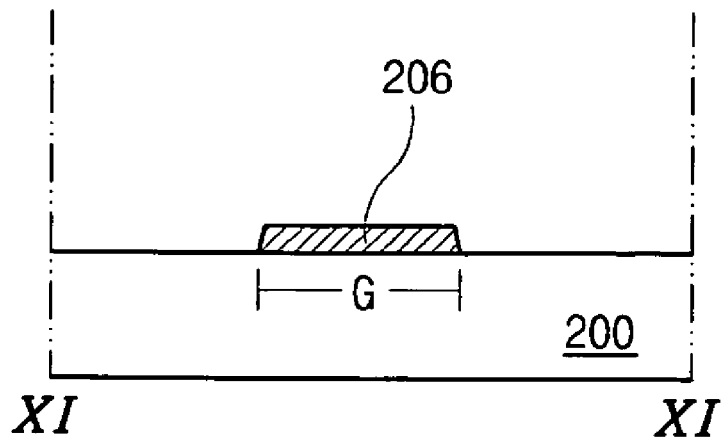
Figure 16B:
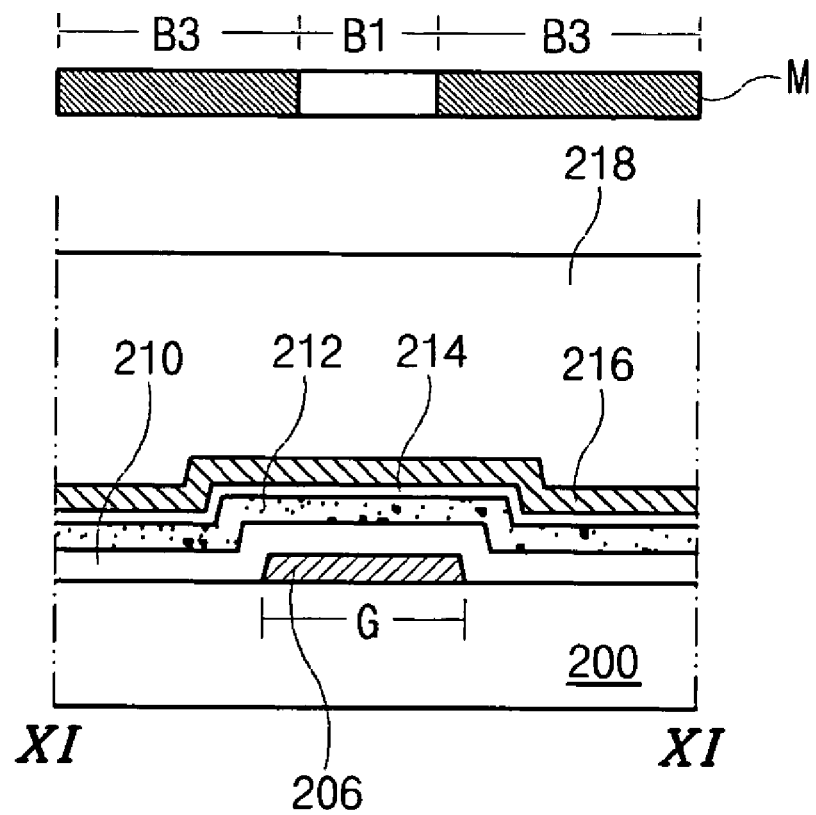
Figure 16C:
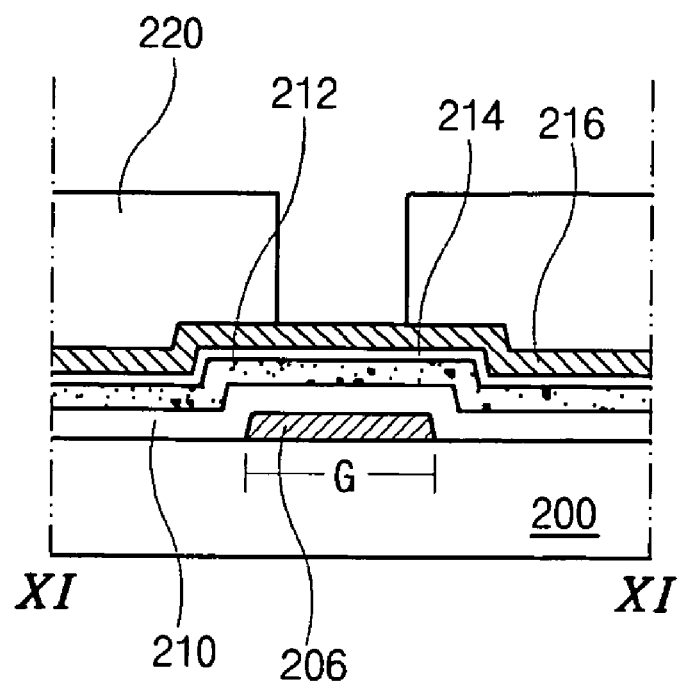
Figure 16D:
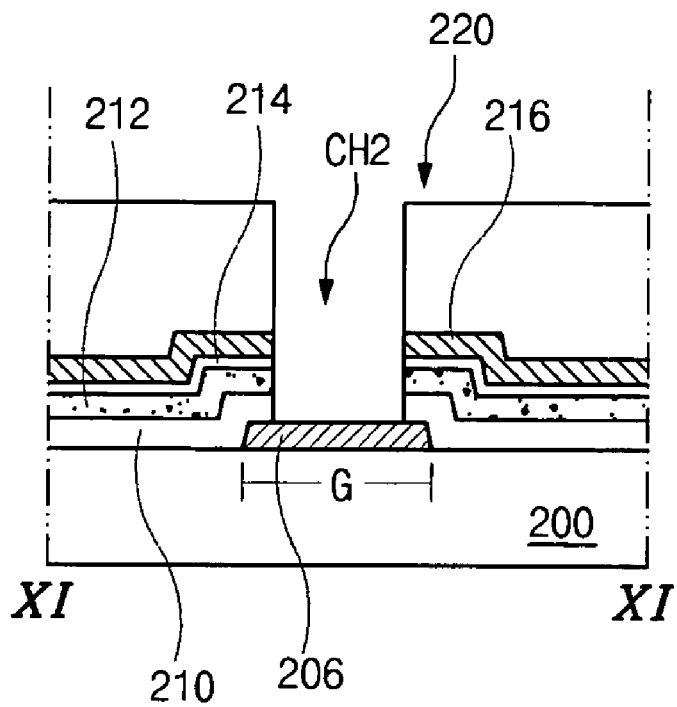
Figure 16E:
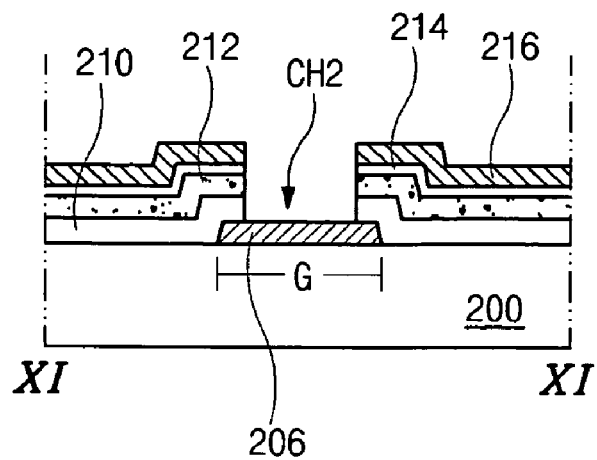
Figure 16F:
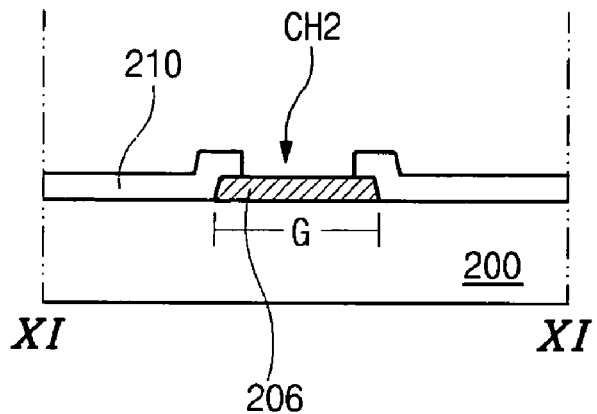
Figure 16G:
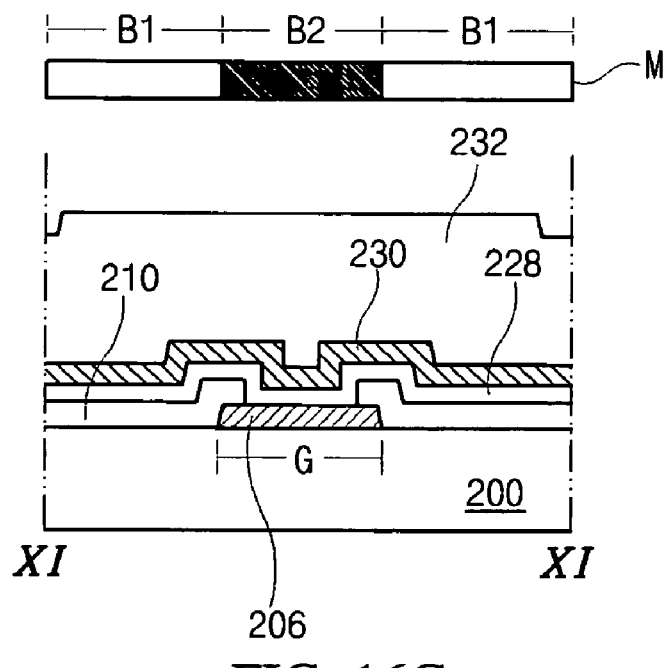
Figure 16H:
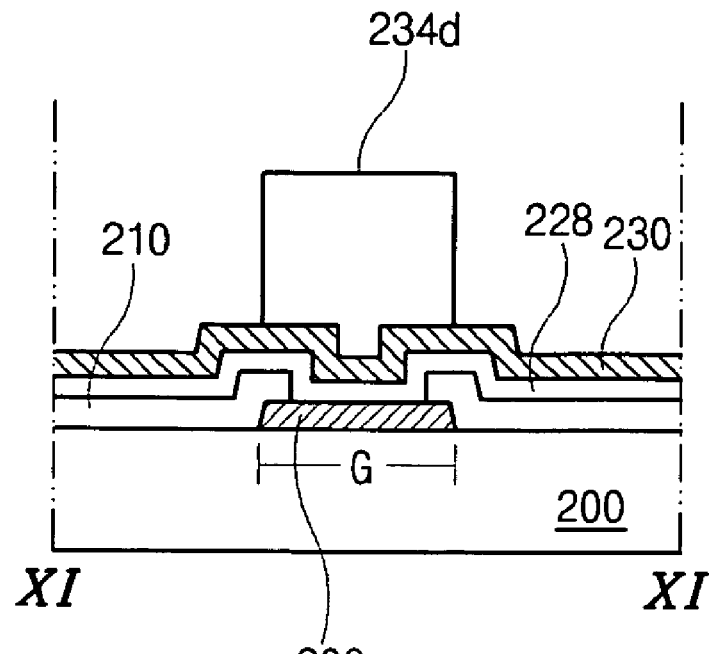
Figure 16I:
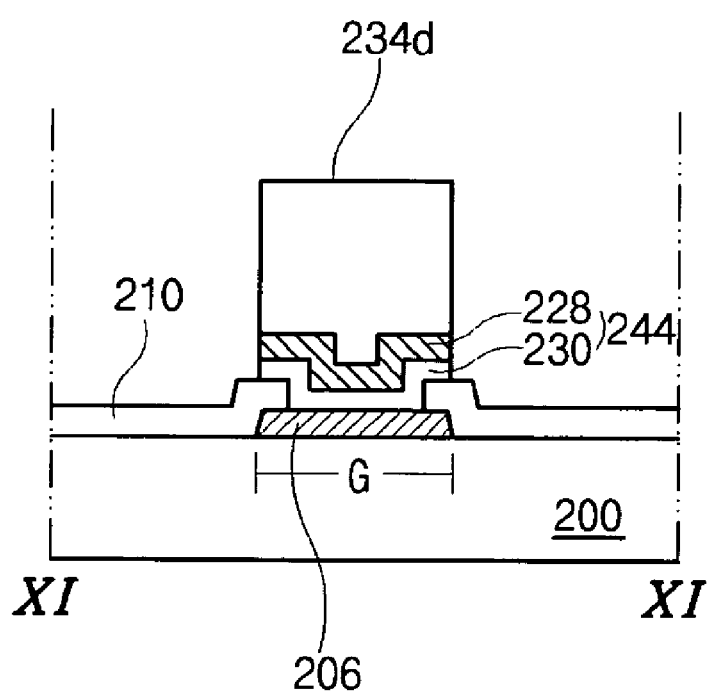
Figure 16J:
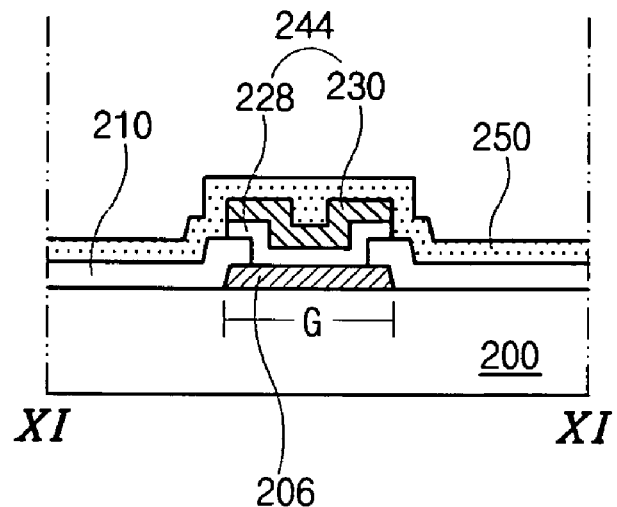
Figure 16K:
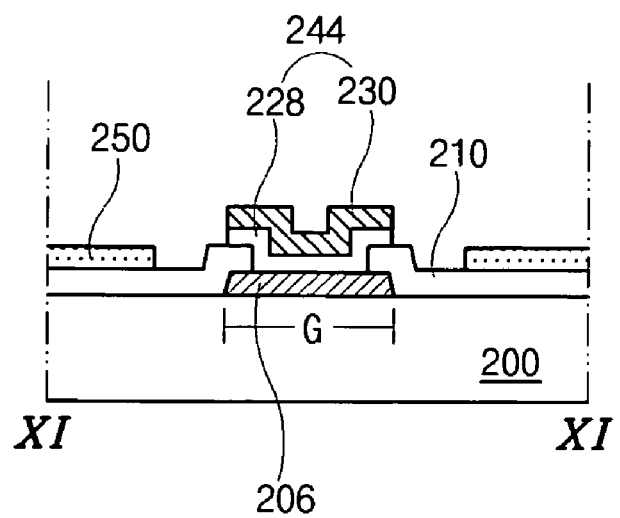
Figure 17A:
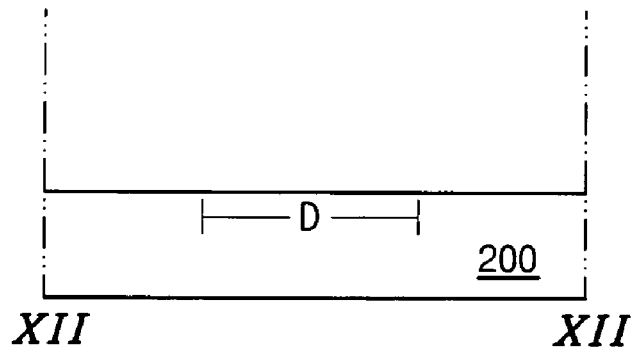
Figure 17B:
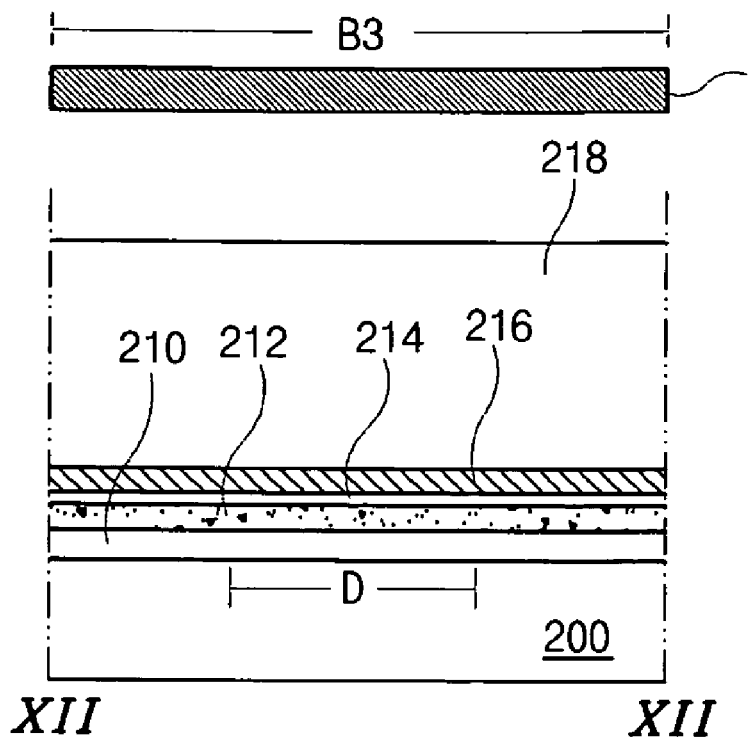
Figure 17C:
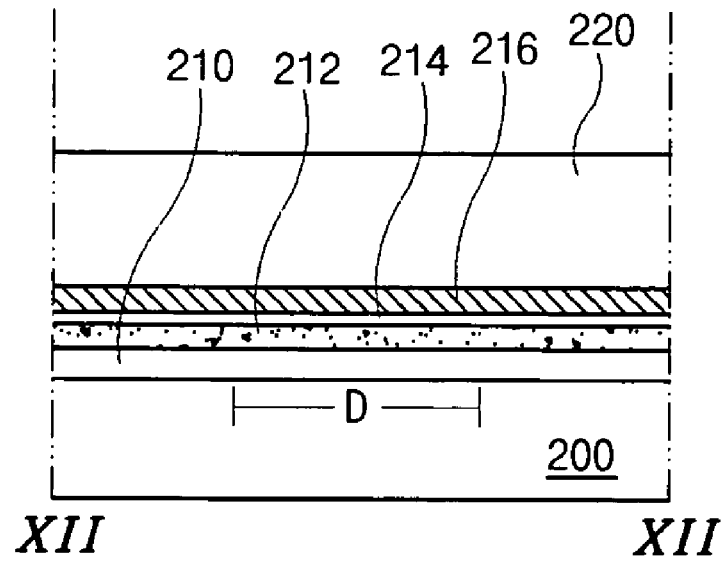
Figure 17D:
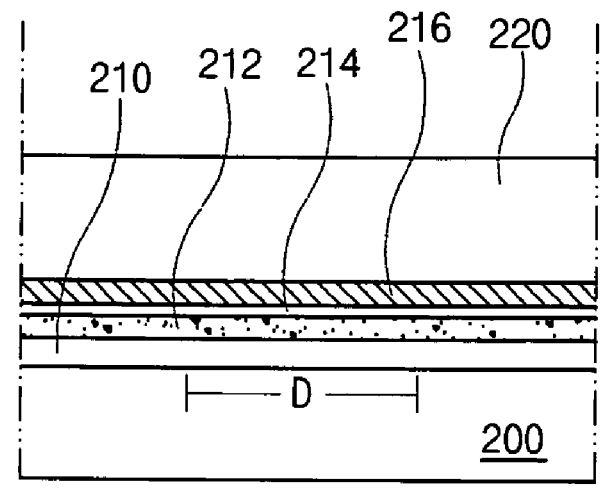
Figure 17E:
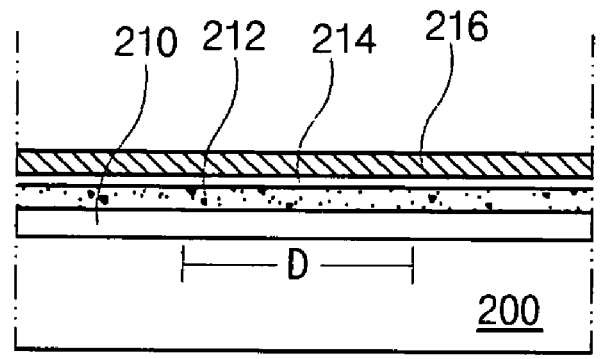
Figure 17F:
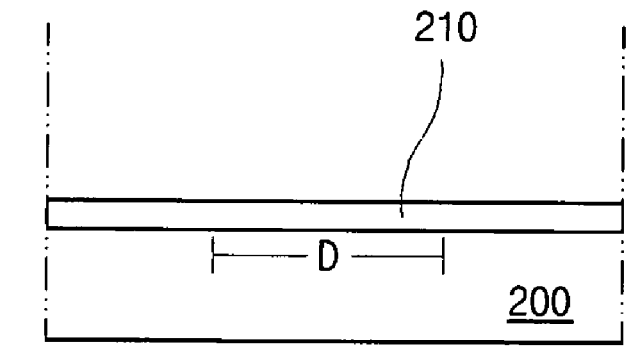
Figure 17G:
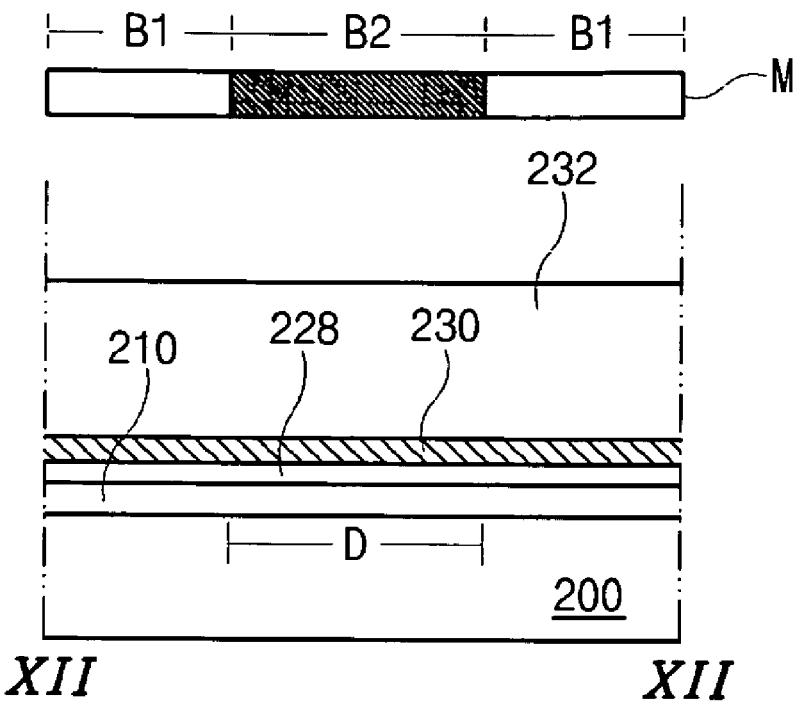
Figure 17H:
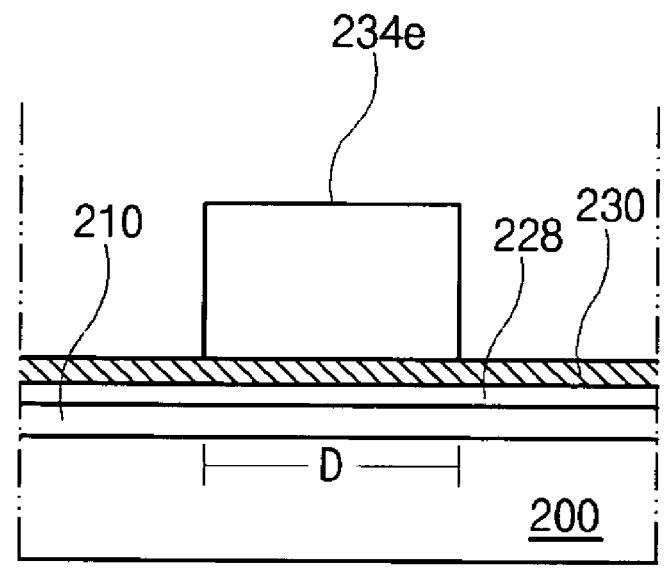
Figure 17I:
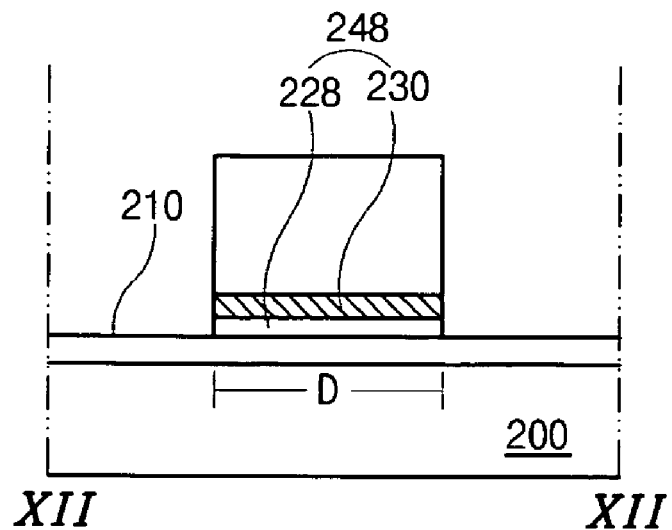
Figure 17J:
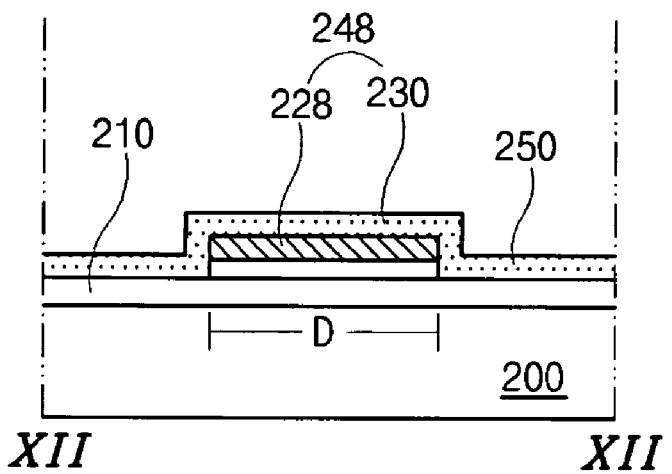
Figure 17K:
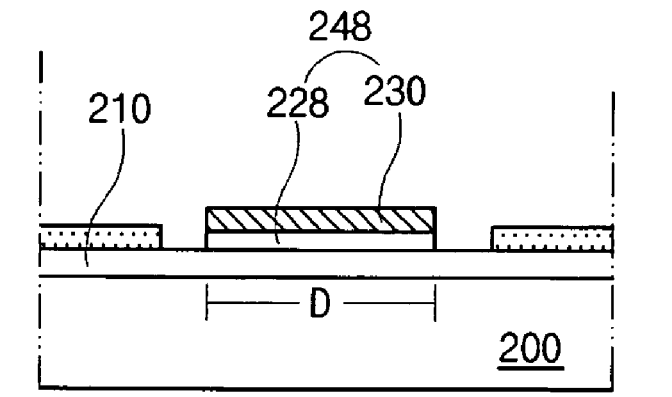
Figure 18A:
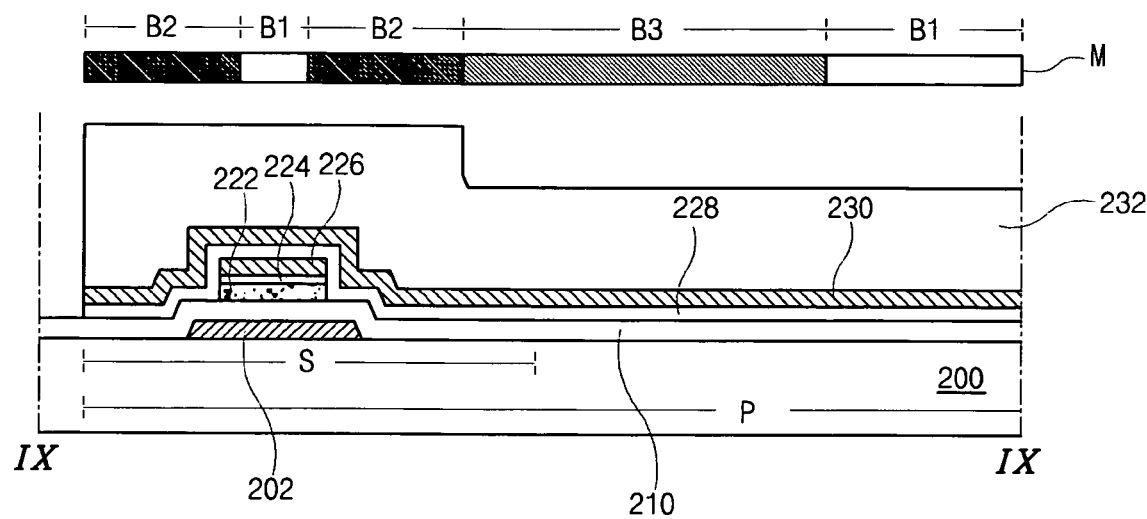
FIGS. 18A to 18E, FIGS. 19A to 19E, FIGS. 20A to 20E, and FIGS. 21A to 21E illustrate an array substrate in processes of manufacturing the same according to a third embodiment of the invention.
Figure 18B:
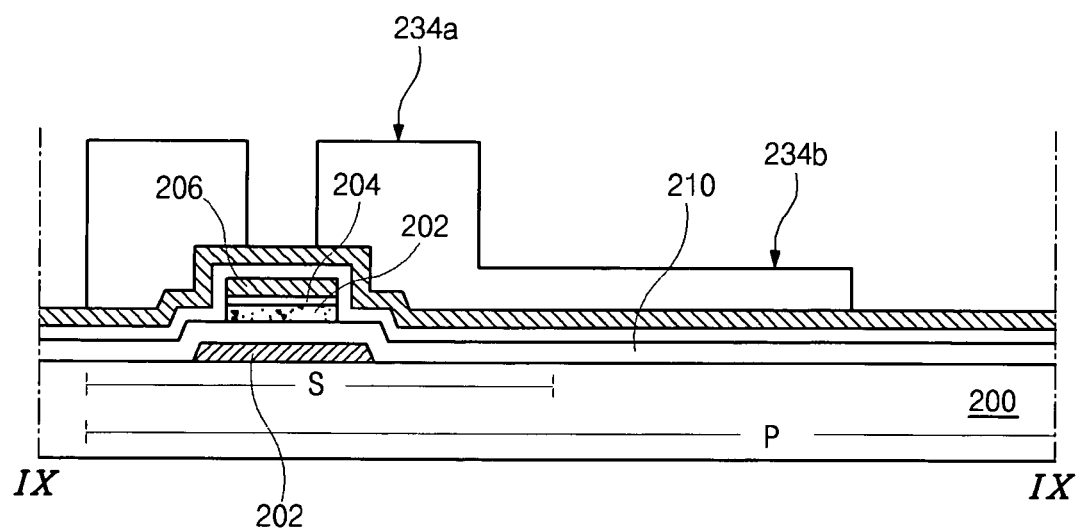
Figure 18C:
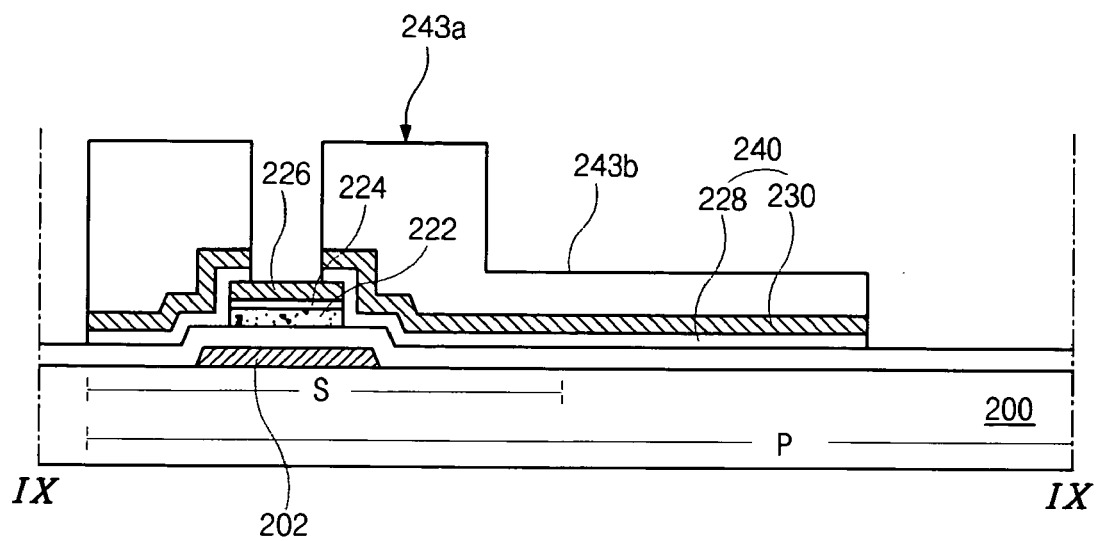
Figure 18D:
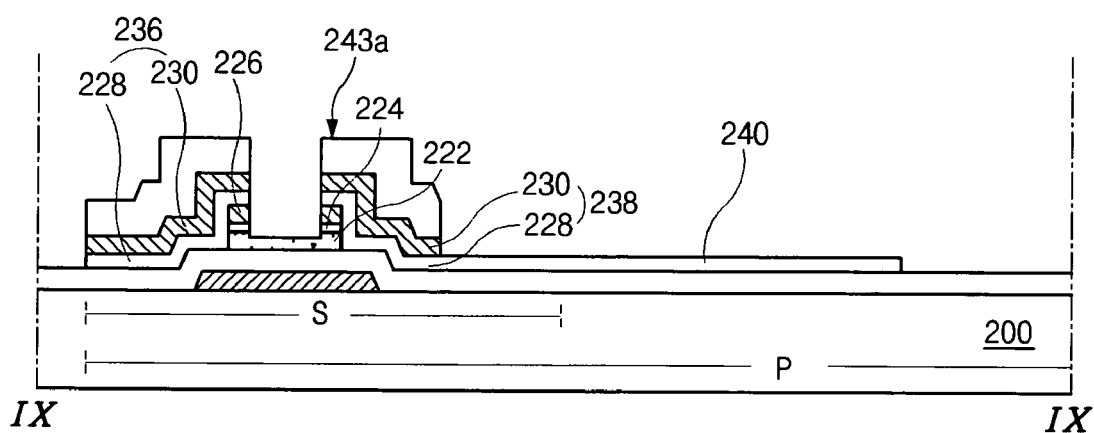
Figure 18E:
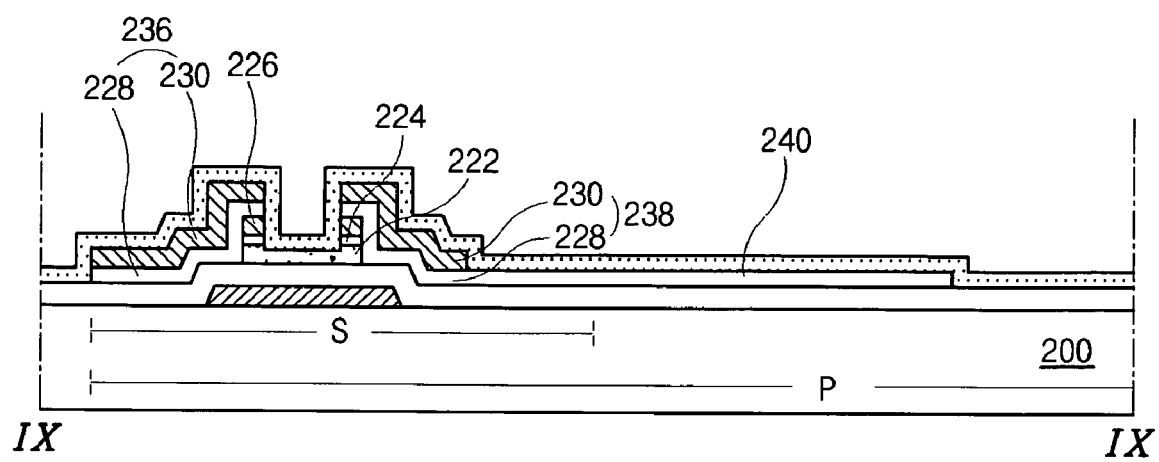
Figure 19A:
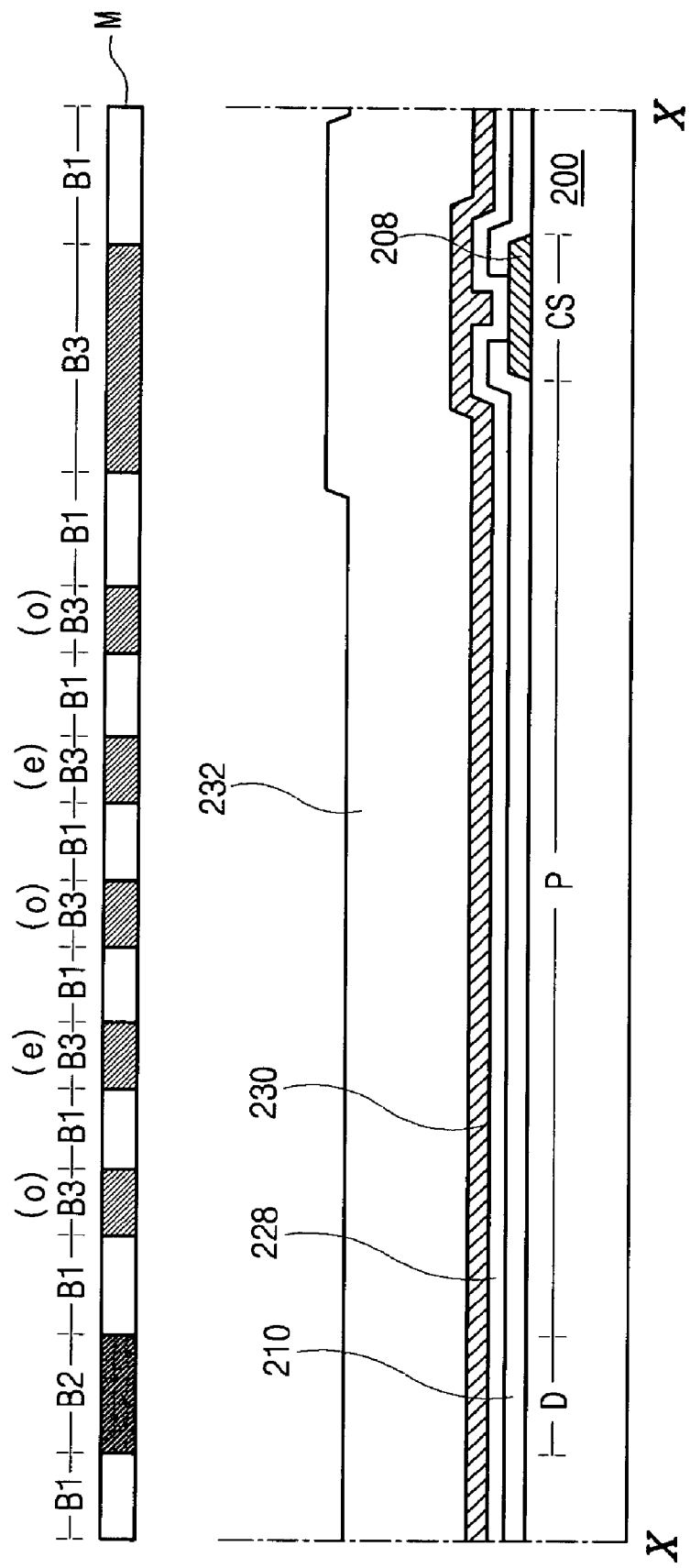
Figure 19B:
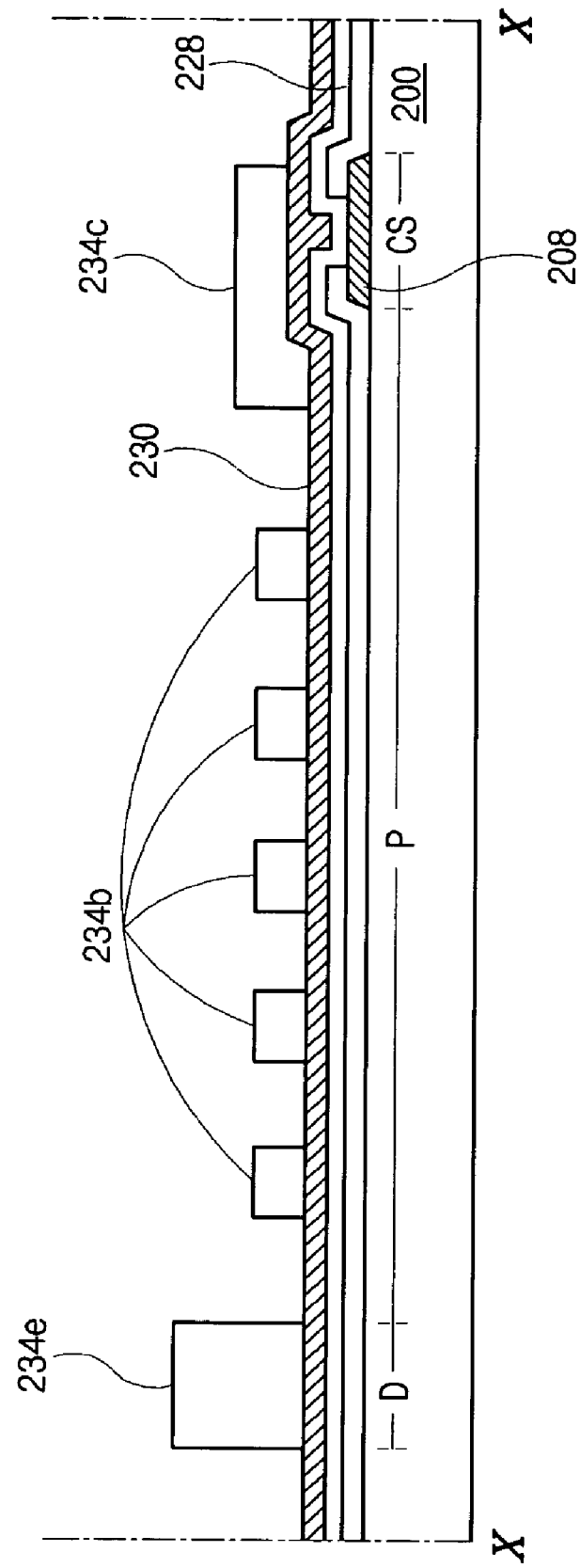
Figure 19C:
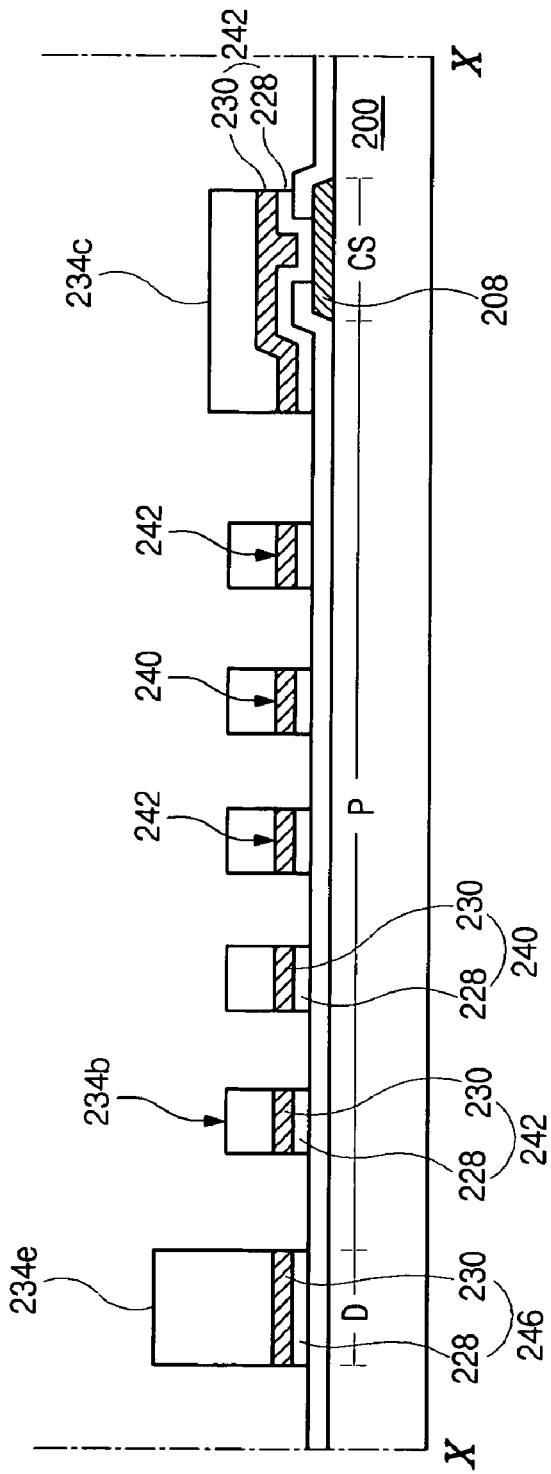
Figure 19D:
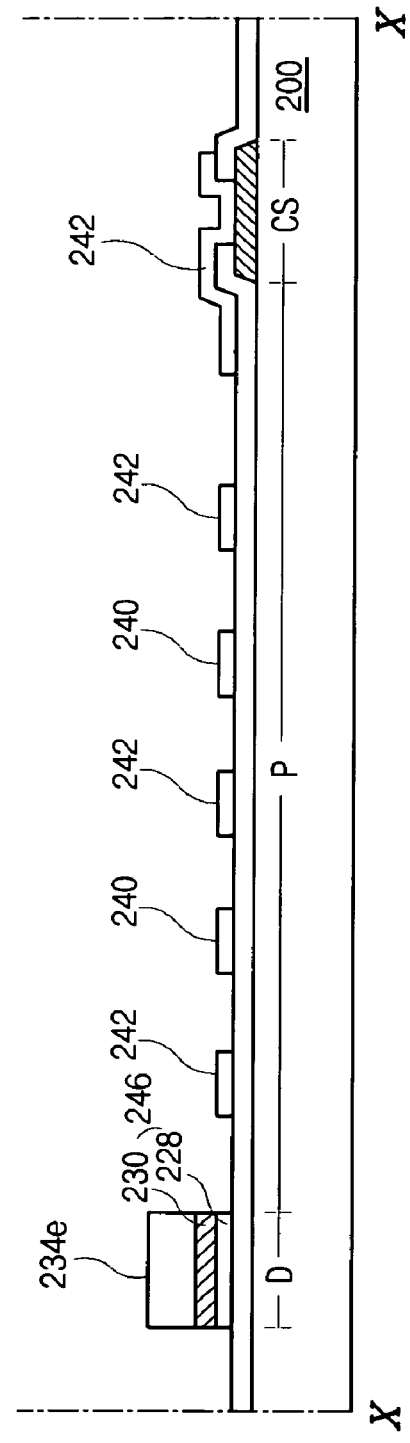
Figure 19E:
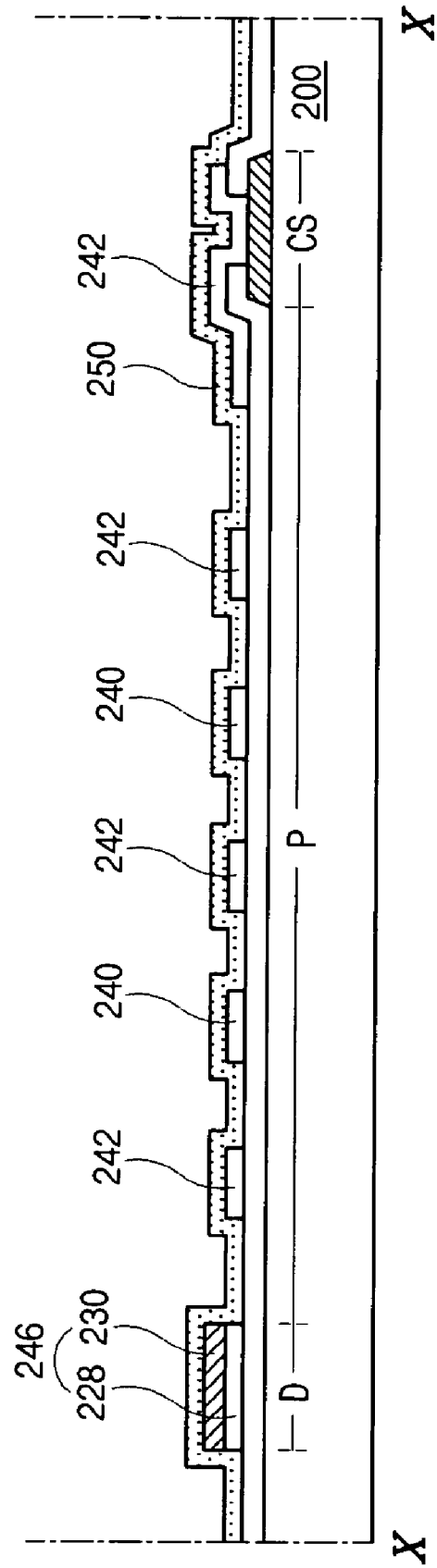
Figure 20A:
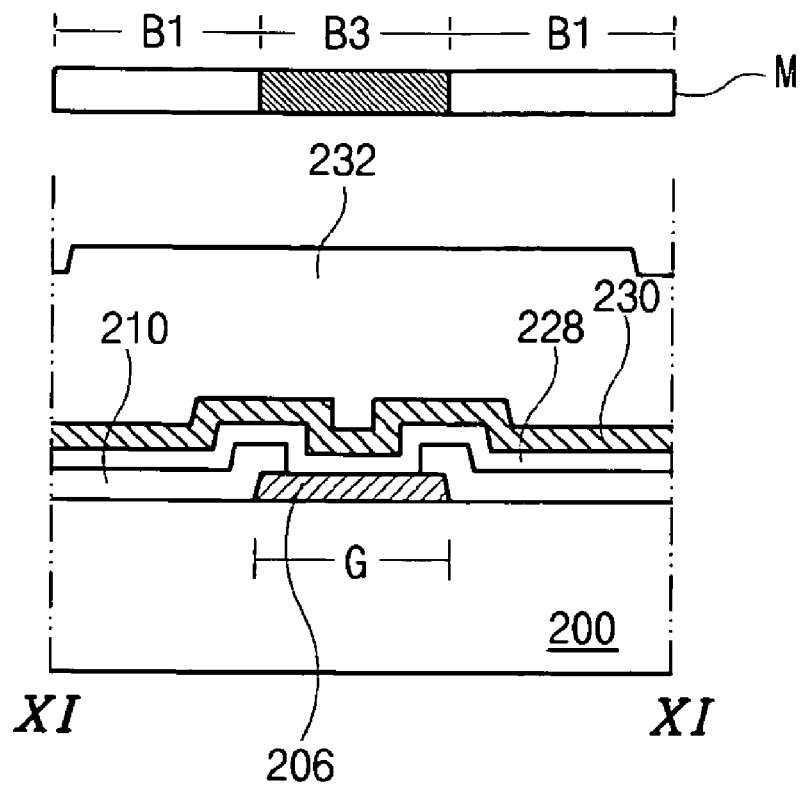
Figure 20B:
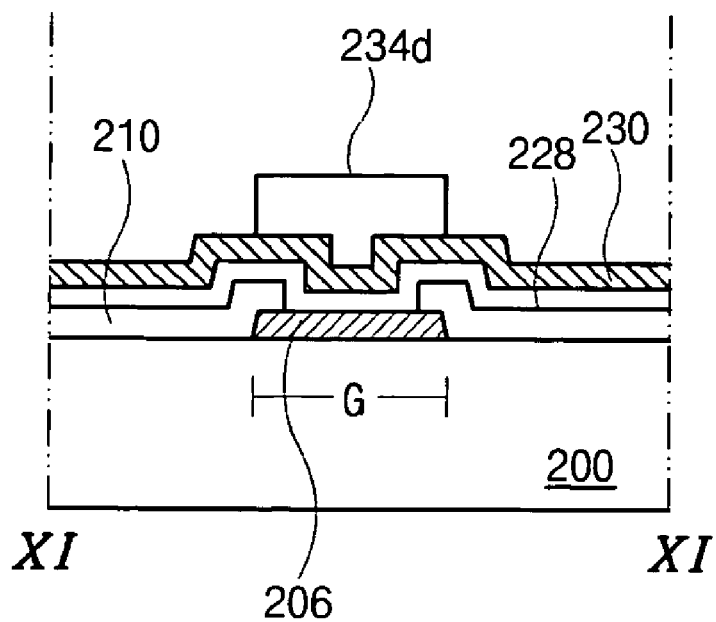
Figure 20C:
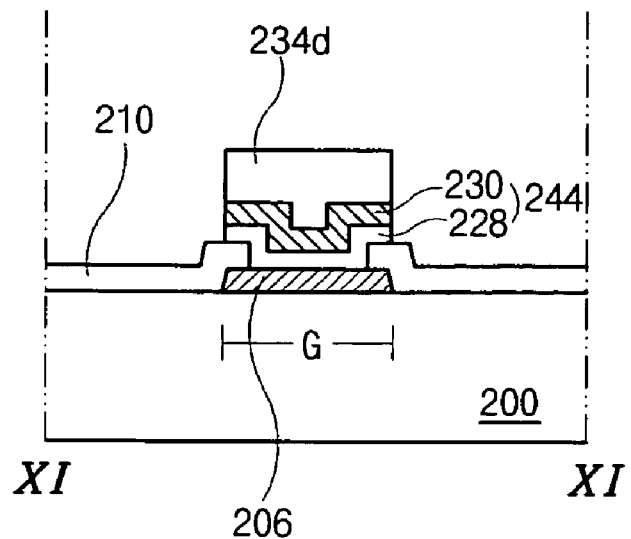
Figure 20D:
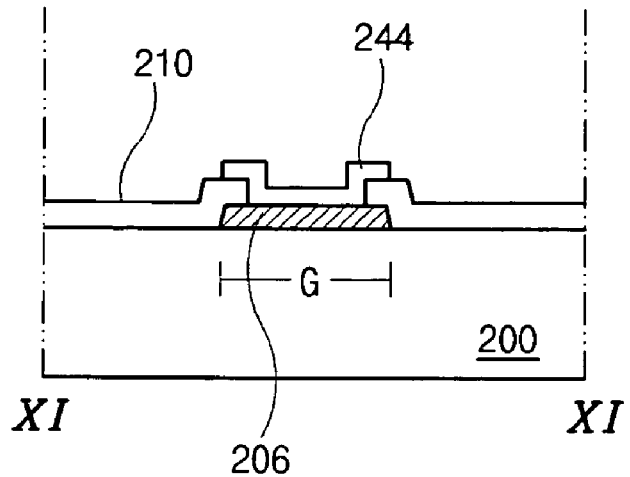
Figure 20E:
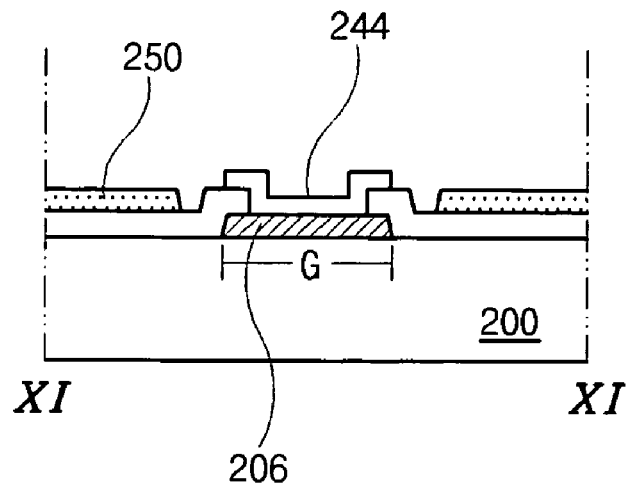
Figure 21A:
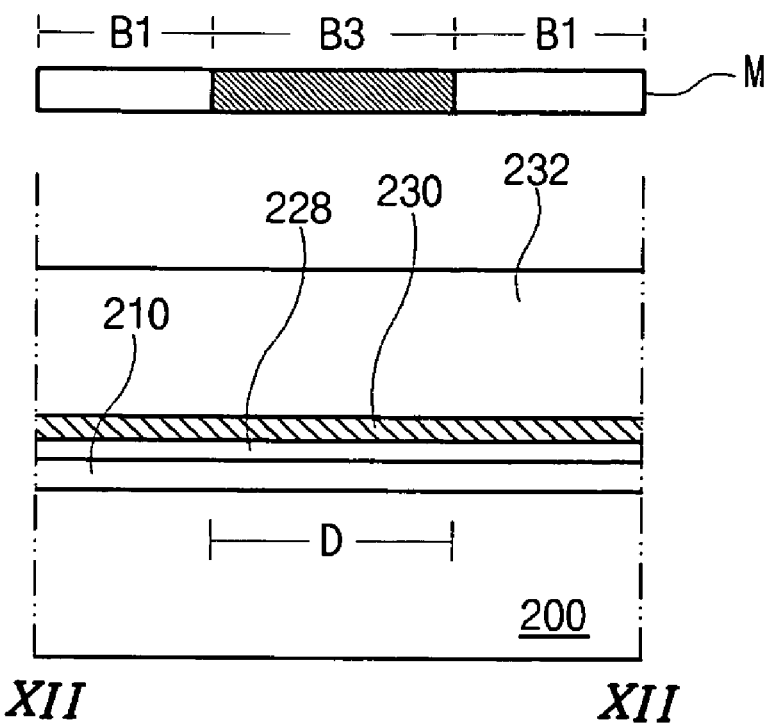
Figure 21B:
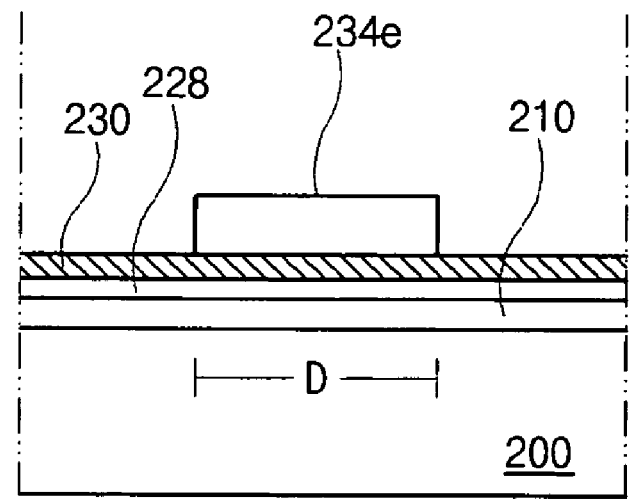
Figure 21C:
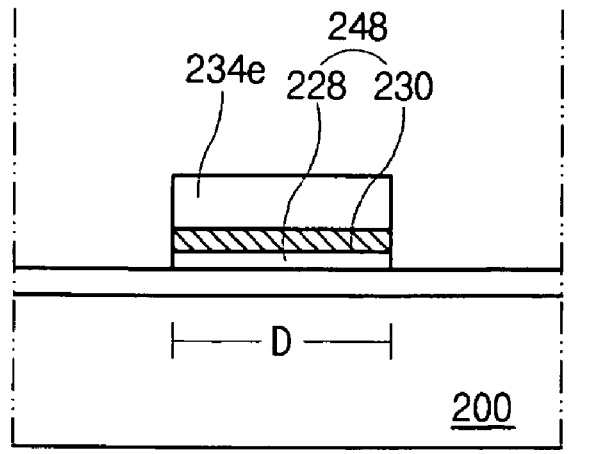
Figure 21D:
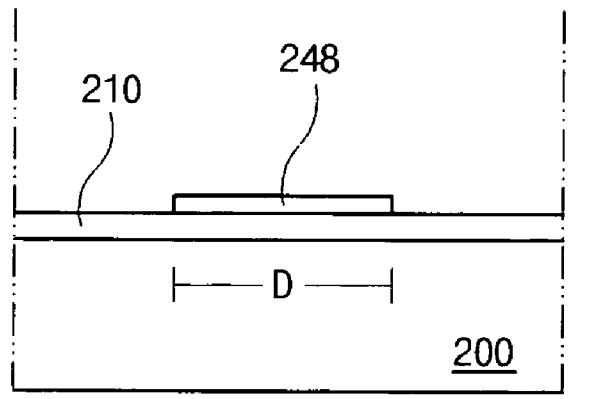
Figure 21E:
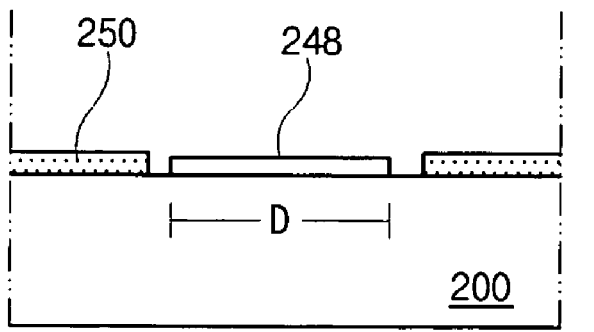

In FIG. 14E, FIG. 15E, FIG. 16E and FIG. 17E, ashing is performed to thereby remove the second part of the photoresist pattern 220. At this time, the first part of the photoresist pattern 220 of FIG. 14D is also partially removed in the switching region S and has a reduced thickness. The second conductive metallic layer 216 is exposed in the other regions except the switching region S, the gate region G for the gate pad 206, and the common signal region CS.

The exposed second conductive metallic layer 216, the impurity-doped amorphous silicon layer 214, and the intrinsic amorphous silicon layer 212 are removed by using the photoresist pattern 220 as an etching mask.

In FIG. 14F, FIG. 15F, FIG. 16F and FIG. 17F, an active layer 222, an ohmic contact layer 224, and a buffer metallic layer 226 are formed in the switching region S. The common line 208 and the gate pad 206 are exposed through the common line contact hole CH1 and the gate pad contact hole CH2 of the first insulating layer 210.

FIGS. 14G to 14J, FIGS. 15G to 15J, FIGS. 16G to 16J and FIGS. 17G to 17J show the array substrate during a third mask process.

In FIG. 14G, FIG. 15G, FIG. 16G and FIG. 17G, a transparent conductive layer 228 and an opaque conductive layer 230 are sequentially formed substantially or entirely over an entire surface of the substrate 200. A photoresist layer 232 is formed over the opaque conductive layer 230 by coating the substrate 200 with positive or negative photoresist. The transparent conductive layer 228 is formed from a transparent conductive material such as indium tin oxide (ITO), indium zinc oxide (IZO) or indium tin zinc oxide (ITZO). The opaque conductive layer 230 is formed of one selected from the above-mentioned conductive metallic materials.

A mask M is disposed over the photoresist layer 232. The mask M includes a light-transmitting portion B1 and a light-blocking portion B2. The light-transmitting portion B1 corresponds to a central part of the gate electrode 202 in the switching region S. The light-blocking portion B2 corresponds to other parts of the switching region S, the gate region G the gate pad 206, the data region D, and a part of the common signal region CS. In the pixel region P, the light-transmitting portion B1 and the light-blocking portion B2 alternate with each other.

Although not shown in the figures, the light-blocking portions B2(o), B2(e) corresponding to the pixel region P include bar-type parts. Odd parts of the light-blocking portion B2(o) of the pixel region P are united with the light-blocking portion B2 of the common signal region CS, and parts of the light-blocking portion B2(e) of the pixel region P are united with the light-blocking portion B2 of the switching region S.

The photoresist layer 232 is exposed to light through the mask M and then is developed.

In FIG. 14H, FIG. 15H, FIG. 16H and FIG. 17H, first, second, third, fourth and fifth photoresist patterns 234a, 234b, 234c, 234d and 234e are formed. The first photoresist pattern 234a is disposed in the switching region S. The first photoresist pattern 234a includes two parts spaced apart from each other. The second photoresist pattern 234b includes multiple parts spaced apart from each other in the pixel region P. The third photoresist pattern 234c is disposed in the common signal region CS and is united with the odd parts of the second photoresist pattern 234b. The even parts of the second photoresist pattern 234b are united with one part of the first photoresist pattern 234a. The fourth photoresist pattern 234d is disposed in the gate region G for the gate pad 206. The fifth photoresist pattern 234e is disposed in the data region D.

The opaque conductive layer 230 and the transparent conductive layer 228 are removed by using the first, second, third, fourth and fifth photoresist patterns 234a, 234b, 234c, 234d and 234e as an etching mask.

In FIG. 14I, FIG. 15I, FIG. 16I and FIG. 17I, a source electrode 236, a drain electrode 238, pixel electrodes 240, common electrodes 242, a gate pad electrode 244, a data pad 248, and a data line 246 are formed. The source electrode 236 and the drain electrode 238 are formed under the first photoresist pattern 234a in the switching region S. The pixel electrodes 240 are formed under one or more portions of the second photoresist pattern 234b in the pixel region P. The pixel electrodes 240 are connected to the drain electrode 238. The common electrodes 242 are formed under one or more of the other portions of the second photoresist pattern 234b in the pixel region P and the third photoresist pattern 234c in the common signal region CS. The common electrodes 242 are connected to the common line 208. The common electrodes 242 alternate with the pixel electrodes 240. The gate pad electrode 244 is formed under the fourth photoresist pattern 234d and contacts the gate pad 206. The data pad 248 and the data line 246 are formed under the fifth photoresist pattern 234e. The data pad 248 is disposed at one end of the data line 246.

Each of the source and drain electrodes 236 and 238, the pixel electrodes 240, the common electrodes 242, the gate pad electrode 244, the data pad 248 and the data line 246 includes the sequentially deposited transparent conductive layer 228 and opaque conductive layer 230.

The buffer metallic layer 226 is exposed between the source and drain electrodes 236 and 238. The exposed buffer metallic layer 226 and the ohmic contact layer 224 are removed between the source and drain electrodes 236 and 238. In the switching region S, the active layer 222 is exposed between the source and drain electrodes 236 and 238.

Next, the first, second, third, fourth and fifth photoresist patterns 234a, 234b, 234c, 234d and 234e are removed.

In FIG. 14J, FIG. 15J, FIG. 16J and FIG. 17J, a second insulating layer 250 is formed substantially or entirely over an entire surface of the substrate 200 by depositing one or more above-mentioned inorganic insulating materials such as $SiN_x$ or $SiO_2$.

In FIG. 14K, FIG. 15K, FIG. 16K and FIG. 17K, the second insulating layer 250 is patterned using a fourth mask process, and the gate pad electrode 244 and the data pad 248 are exposed.

In this way, the array substrate for an IPS mode LCD device may be manufactured using 4 mask processes according to the second preferred embodiment of the invention. That is, the gate electrode, the gate line, the gate pad and the common line are formed using the first mask process. The first insulating layer, the active layer, the ohmic contact layer, and the buffer metallic layer are formed over the gate electrode using the second mask process, and the gate pad is exposed via the first insulating layer at this time. The source and drain electrodes, the pixel electrodes, the common electrodes, the gate pad electrode, the data line, and the data pad are formed using the third mask process. The second insulating layer is formed, and the gate pad electrode and the data pad are exposed via the second insulating layer using the fourth mask process.

Here, the amorphous silicon layer does not exist under the data line and is disposed over and within the gate electrode. Thus, light from a backlight is prevented from going into the amorphous silicon layer.

An array substrate of a third preferred embodiment of the invention has a similar structure to that of the second embodiment. In the third embodiment, the gate pad electrode, the data pad, the common electrodes and the pixel electrodes include a single layer of a transparent conductive material. The method of manufacturing the array substrate according to the third preferred embodiment will be described hereinafter with reference to accompanying drawings. Here, first and second mask processes of the third embodiment are the same as those of the second embodiment, and explanation of the first and second mask processes will be omitted.

FIGS. 18A to 18E, FIGS. 19A to 19E, FIGS. 20A to 20E, and FIGS. 21A to 21E illustrate an array substrate in processes of manufacturing the same according to the third embodiment of the invention. FIGS. 18A to 18E are cross-sectional views along the line IX-IX of FIG. 12, FIGS. 19A to 19E are cross-sectional views along the line X-X of FIG. 12, FIGS. 20A to 20E are cross-sectional views along the line XI-XI of FIG. 12, and FIGS. 21A to 21E are cross-sectional views along the line XII-XII of FIG. 12. The parts in the third embodiment that correspond to those in the second embodiment have the same references.

A gate electrode 202, a gate line (not shown), a gate pad 206 and a common line 208 are formed over a substrate 200 using a first mask process. The gate electrode 202 is disposed in a switching region S. The gate line and the gate pad 206 are disposed in a gate region C and the gate pad 206 is located at one end of the gate line. The common line 208 is disposed in a common signal region CS. A first insulating layer 210, an active layer 222, an ohmic contact layer 224 and a buffer metallic layer 226 are formed over the substrate 200 using a second mask process. The active layer 222, the ohmic contact layer 224 and the buffer metallic layer 226 are disposed over the gate electrode 202 in the switching region S. The gate pad 206 and the common line 208 are exposed via the first insulating layer 210.

In FIG. 18A, FIG. 19A, FIG. 20A, and FIG. 21A, a transparent conductive layer 228 and an opaque conductive layer 230 are sequentially formed substantially or entirely over an entire surface of the substrate 200. A photoresist layer 232 is formed over the opaque conductive layer 230 by coating the substrate 200 with photoresist. The transparent conductive layer 228 is formed of a transparent conductive material such as indium tin oxide (ITO), indium zinc oxide (IZO) or indium tin zinc oxide (ITZO). The opaque conductive layer 230 is formed of one of the above-mentioned conductive materials.

A mask M is disposed over the photoresist layer 232. The mask M includes a light-transmitting portion B1, a light-blocking portion B2 and a light semi-transmitting portion B3. The light-blocking portion B2 corresponds to other parts of the switching region S except a central part of the gate electrode 202 and the data region D. The light semi-transmitting portion B3 corresponds to the gate region G for the gate pad 206, one end of the data region D, and a part of the common signal region CS. Alternately, the light semi-transmitting portion B3 may not correspond to the gate electrode 202. In the pixel region P, the light-transmitting portion B1 and the light semi-transmitting portion B3 alternate with each other. The light-transmitting portion B1 corresponds to other regions.

Although not shown in the figures, the light semi-transmitting portions B3(*o*), B3(*e*) corresponding to the pixel region P include bar-type parts. Odd parts of the light semi-transmitting portion B3(*o*) of the pixel region P are united with the light semi-transmitting portion B3 of the common signal region CS, and parts of the light semi-transmitting portion B3(*e*) of the pixel region P are connected to the light-blocking portion B2 of the switching region S.

The photoresist layer 232 is exposed to light through the mask M and then is developed.

In FIG. 18B, FIG. 19B, FIG. 20B and FIG. 21B, first, second, third, fourth and fifth photoresist patterns 234*a*, 234*b*, 234*c*, 234*d* and 234*e* are formed. The first photoresist pattern 234*a* is disposed in the switching region S. The first photoresist pattern 234*a* has a first thickness, which is substantially the same as the original thickness of the photoresist layer 232 of FIG. 18A, FIG. 19A, FIG. 20A and FIG. 21A, and includes two parts spaced apart from each other. The second photoresist pattern 234*b* includes multiple parts spaced apart from each other in the pixel region P and has a second thickness that is thinner than the first thickness. The third photoresist pattern 234*c* is disposed in the common signal region CS and is united with the odd parts of the second photoresist pattern 234*b*. The third photoresist pattern 234*c* has the second thickness. The even parts of the second photoresist pattern 234*b* are connected to one part of the first photoresist pattern 234*a*. The fourth photoresist pattern 234*d* is disposed in the gate region G for the gate pad 206. The fourth photoresist pattern 234*d* has the second thickness. The fifth photoresist pattern 234*e* is disposed in the data region D. The fifth photoresist pattern 234*e* has the first thickness. The fifth photoresist pattern 234*e* further includes a part of the second thickness corresponding to the one end of the data region D.

The opaque conductive layer 230 and the transparent conductive layer 228 are removed by using the first, second, third, fourth and fifth photoresist patterns 234*a*, 234*b*, 234*c*, 234*d* and 234*e* as an etching mask.

In FIG. 18C, FIG. 19C, FIG. 20C and FIG. 21C, a source electrode 236, a drain electrode 238, pixel electrodes 240, common electrodes 242, a gate pad electrode 244, a data pad 248, and a data line 246 are formed. The source electrode 236 and the drain electrode 238 are spaced apart from each other and are formed under the first photoresist pattern 234*a* in the switching region S. The pixel electrodes 240 are formed under portions of the second photoresist pattern 234*b* in the pixel region P. The pixel electrodes 240 are connected to the drain electrode 238. The common electrodes 242 are formed under the other portions of the second photoresist pattern 234*b* in the pixel region P and the third photoresist pattern 234*c* in the common signal region CS. The common electrodes 242 are connected to the common line 208. The common electrodes 242 alternate with the pixel electrodes 240. The gate pad electrode 244 is formed under the fourth photoresist pattern 234*d* and contacts the gate pad 206. The data pad 248 and the data line 246 are formed under the fifth photoresist pattern 234*e*. The data pad 248 is disposed at one end of the data line 246.

Each of the source and drain electrodes 236 and 238, the pixel electrodes 240, the common electrodes 242, the gate pad electrode 244, the data pad 248 and the data line 246 includes the transparent conductive layer 228 and the opaque conductive layer 230 sequentially deposited.

The buffer metallic layer 226 is exposed between the two parts of the first photoresist pattern 234*a*, that is, between the source and drain electrodes 236 and 238. The exposed buffer metallic layer 226 and the ohmic contact layer 224 are removed between the source and drain electrodes 236 and 238.

In FIG. 18D, FIG. 19D, FIG. 20D and FIG. 21D, the active layer 222 is exposed between the source and drain electrodes 236 and 238 in the switching region S. Next, the second, third and fourth patterns 234*b*, 234*c* and 234*d* and the part of fifth photoresist pattern 234*e* having the second thickness are removed by ashing to thereby expose the opaque conductive layer 230. At this time, the first photoresist pattern 234*a* is also partially removed, and the thickness of the first photoresist pattern 234*a* decreases. The exposed opaque conductive layer 230 is removed. The pixel electrodes 240 and the common electrodes 242, the gate pad electrode 244 and the data pad 248 include only the transparent conductive layer.

The first photoresist pattern 234*a* is then removed.

In FIG. 18E, FIG. 19E, FIG. 20E and FIG. 21E, a second insulating layer 250 is formed substantially over an entire surface of the substrate 200 by depositing one or more selected from the above-mentioned inorganic insulating material group. The second insulating layer 250 is patterned using a fourth mask process, and the gate pad electrode 244 and the data pad 248 are exposed.

In this way, the array substrate for an IPS mode LCD device may be manufactured using 4 mask processes according to the third preferred embodiment of the invention. That is, the gate electrode, the gate line, the gate pad and the common line are formed using the first mask process. The first insulating layer, the active layer, the ohmic contact layer, and the buffer metallic layer are formed over the gate electrode using the second mask process, and the gate pad is exposed via the first insulating layer at this time. The source and drain electrodes, the pixel electrodes, the common electrodes, the gate pad electrode, the data line, and the data pad are formed using the third mask process. Each of the source and drain electrodes and the data line includes a transparent conductive layer and an opaque conductive layer. Each of the pixel electrodes, the common electrodes, the gate pad electrode and the data pad includes a transparent conductive layer. The second insulating layer is formed, and the gate pad electrode and the data pad are exposed via the second insulating layer using the fourth mask process.

In the invention, the amorphous silicon layer does not exist under the data line and is disposed over and within the gate electrode. Accordingly, light from a backlight is prevented from going into the amorphous silicon layer, and the wavy noise does not occur. In addition, the aperture ratio increases, and the brightness of the device improves.

It will be apparent to those skilled in the art that various modifications and variations can be made in the liquid crystal display device of the invention without departing from the spirit or scope of the invention. Thus, it is intended that the invention cover the modifications and variations of this invention provided they come within the scope of the appended claims and their equivalents.

What is claimed is:

1. An array substrate for a liquid crystal display device, comprising:
    a substrate;
    a gate line over the substrate;
    a data line crossing the gate line to define a pixel region, the data line including a transparent conductive layer and a conductive metallic layer;
    a data pad at one end of the data line and including a transparent conductive layer;
    a thin film transistor connected to the gate line and the data line and including a gate electrode, an active layer, an ohmic contact layer, a source electrode and a drain electrode, wherein each of the source electrode and the drain electrode includes a transparent conductive layer and a conductive metallic layer; and
    a pixel electrode in the pixel region and connected to the thin film transistor,
    wherein the pixel electrode and the transparent conductive layer of the drain electrode are formed of the same layer and the same material, and
    wherein the active layer has an island shape and is disposed over and within the gate electrode.

2. The array substrate according to claim 1, wherein the thin film transistor includes a buffer metallic layer.

3. The array substrate according to claim 2, wherein the buffer metallic layer is disposed between the ohmic contact layer and the transparent conductive layer of each of the source and drain electrodes.

4. The array substrate according to claim 1, further comprising a gate pad and a gate pad electrode, wherein the gate pad is disposed at one end of the gate line and the gate pad electrode contacts the gate pad, the gate pad electrode including a transparent conductive layer.

5. The array substrate according to claim 4, further comprising an insulating layer covering the gate line, the thin film transistor and the data line and exposing the pixel electrode, the gate pad electrode and the data pad.

6. The array substrate according to claim 1, wherein the pixel electrode overlaps the gate line to form a storage capacitor, wherein the gate line acts as a first electrode and the pixel electrode functions as a second electrode.

7. An array substrate for a liquid crystal display device, comprising:
    a substrate;
    a gate line over the substrate;
    a data line crossing the gate line to define a pixel region, the data line including a transparent conductive layer and a conductive metallic layer;
    a data pad at one end of the data line and including a transparent conductive layer;
    a thin film transistor connected to the gate line and the data line and including a gate electrode, an active layer, an ohmic contact layer, a source electrode and a drain electrode, wherein each of the source electrode and the drain electrode includes a transparent conductive layer and a conductive metallic layer; and
    a pixel electrode in the pixel region and connected to the thin film transistor,
    wherein the pixel electrode and the transparent conductive layer of the drain electrode are formed of the same layer and the same material, and
    wherein the transparent conductive layer of each of the source electrode and the drain electrode is disposed between the active layer and the conductive metallic layer of each of the source electrode and the drain electrode.

8. The array substrate according to claim 7, wherein the thin film transistor includes a buffer metallic layer.

9. The array substrate according to claim 8, wherein the buffer metallic layer is disposed between the ohmic contact layer and the transparent conductive layer of each of the source and drain electrodes.

10. The array substrate according to claim 7, further comprising a gate pad and a gate pad electrode, wherein the gate pad is disposed at one end of the gate line and the gate pad electrode contacts the gate pad, the gate pad electrode including a transparent conductive layer.

11. The array substrate according to claim 10, further comprising an insulating layer covering the gate line, the thin film transistor and the data line and exposing the pixel electrode, the gate pad electrode and the data pad.

12. The array substrate according to claim 7, wherein the active layer has an island shape and is disposed over and within the gate electrode.

13. The array substrate according to claim 7, wherein the pixel electrode overlaps the gate line to form a storage capacitor, wherein the gate line acts as a first electrode and the pixel electrode functions as a second electrode.

* * * * *